(12) United States Patent
Ozaki

(10) Patent No.: US 7,091,537 B2
(45) Date of Patent: Aug. 15, 2006

(54) FERROELECTRIC MEMORY DEVICE AND METHOD OF MANUFACTURING THE SAME

(75) Inventor: Tohru Ozaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 4 days.

(21) Appl. No.: 10/933,382

(22) Filed: Sep. 3, 2004

(65) Prior Publication Data

US 2005/0121709 A1    Jun. 9, 2005

(30) Foreign Application Priority Data

Dec. 8, 2003    (JP) .............................. 2003-408646

(51) Int. Cl.
*H01L 29/76* (2006.01)
(52) U.S. Cl. ...................... 257/295; 438/239; 438/242; 438/243; 438/244; 438/386
(58) Field of Classification Search ................ 438/243, 438/386, 239, 242, 244
See application file for complete search history.

(56) References Cited

U.S. PATENT DOCUMENTS 6,258,658 B1 * 7/2001 Bohm et al. ................ 438/243

FOREIGN PATENT DOCUMENTS

| JP | 06-268174 | 9/1994 |
|---|---|---|
| JP | 8-125144 | 5/1996 |
| JP | 10-270652 | 10/1998 |
| JP | 2002-094022 | 3/2002 |

* cited by examiner

*Primary Examiner*—Mai-Huong Tran
(74) *Attorney, Agent, or Firm*—Oblon, Spivak, McClelland, Maier & Neustadt, P.C.

(57) ABSTRACT

A ferroelectric memory device includes a first trench formed in a semiconductor substrate and having a first depth, a second trench formed in the substrate and having a second depth, a first element isolation insulating film buried in the first trench, a first gate electrode formed in a lower region of the second trench, a first insulating film formed in an upper region of the second trench, first and second diffusion layers formed in the substrate on both side surface in the second trench, a first ferroelectric capacitor disposed on the first diffusion layer, a first contact disposed on the first ferroelectric capacitor, a first wiring layer disposed on the first contact, a second contact disposed on the second diffusion layer, and a second wiring layer disposed on the second contact and disposed in the same level as that of the first wiring layer.

13 Claims, 55 Drawing Sheets

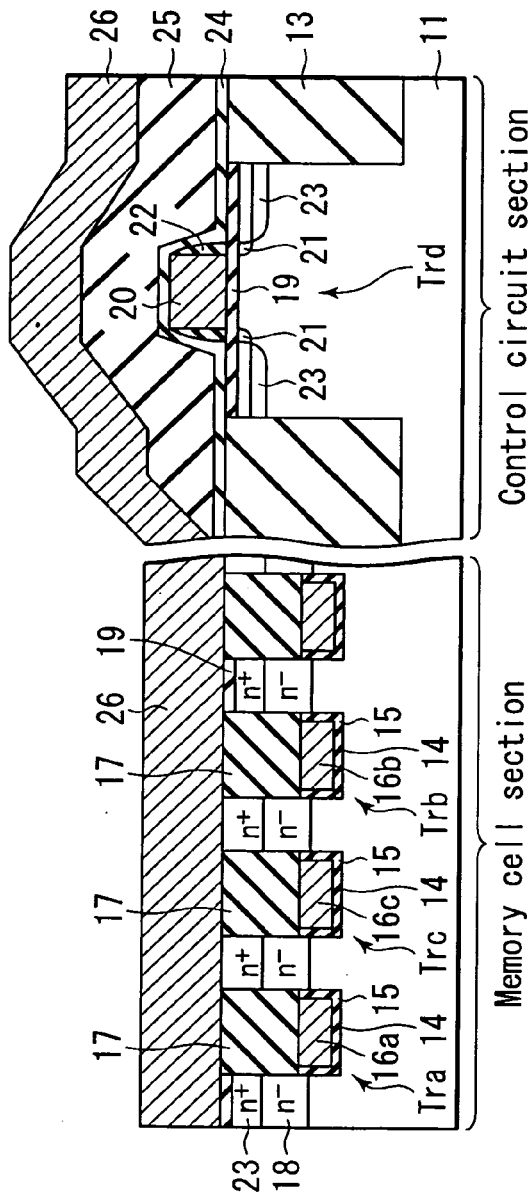
F I G. 40
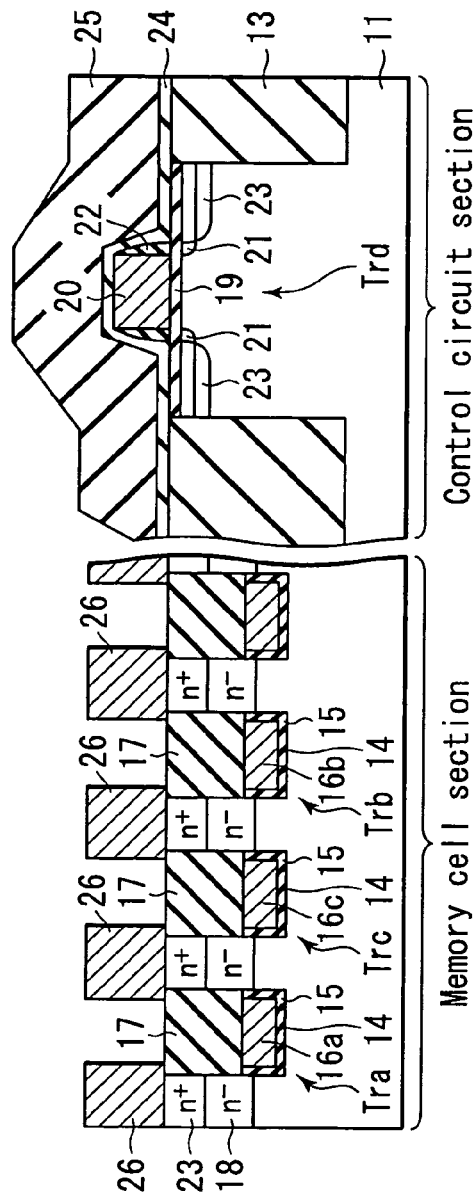
F I G. 41

FERROELECTRIC MEMORY DEVICE AND METHOD OF MANUFACTURING THE SAME

CROSS-REFERENCE TO RELATED APPLICATIONS

This application is based upon and claims the benefit of priority from prior Japanese Patent Application No. 2003-408646, filed Dec. 8, 2003, the entire contents of which are incorporated herein by reference.

BACKGROUND OF THE INVENTION

1. Field of the Invention

The present invention relates to a ferroelectric memory device including a ferroelectric capacitor and a method of manufacturing the device.

2. Description of the Related Art

In recent years, a ferroelectric random access memory (FeRAM) using a ferroelectric capacitor has attracted attention a nonvolatile semiconductor memory. For the FeRAM, a 1Tr+1C type has heretofore been proposed in which one cell is constituted of one transistor (Tr) and one ferroelectric capacitor (C).

FIGS. 69 to 72 show a schematic cell structure of the FeRAM of 1Tr+1C type according to related art. As shown in FIGS. 69 to 72, a gate electrode 112 is formed on a semiconductor substrate 111, and a pair of source/drain diffusion layers 113a, 113b are formed on opposite sides of this gate electrode 112 to form a transistor 114. An interlayer insulating film 115 is formed on the transistor 114, and contacts 116a, 116b connected to the source/drain diffusion layers 113a, 113b are formed in the interlayer insulating film 115. Moreover, a ferroelectric capacitor 120 constituted of a lower electrode 117, ferroelectric film 118, and upper electrode 119 is connected to one contact 116b, and a plate line 122 is formed on the upper electrode 119 via a contact 121. A bit line 125 is connected to the other contact 116a via a wiring 123 and contact 124.

Here, the cell of FIG. 70 includes a two-dimensional capacitor in which the lower electrode 117, ferroelectric film 118, and upper electrode 119 constituting the ferroelectric capacitor 120 extend only in XY-directions in a planar manner, and only a plane which is horizontal with respect to a semiconductor substrate plane is used as a capacitor plane. The cells of FIGS. 71 and 72 include a three-dimensional capacitor in which at least one of the lower electrode 117, ferroelectric film 118, and upper electrode 119 constituting the ferroelectric capacitor 120 extend in XYZ-directions in a solid manner. Not only the plane which is horizontal with respect to the semiconductor substrate plane but also a side-surface part of the lower electrode 117 which is not horizontal with respect to the semiconductor substrate plane is used as the capacitor planes.

In the above-described conventional cell structure, the ferroelectric capacitor 120, the plate line 122, the contact 116b connecting the ferroelectric capacitor 120 to the transistor 114, the contact 121 connecting the ferroelectric capacitor 120 to the plate line 122, the wiring 123 and contacts 116a, 124 connecting the bit line 125 to the transistor 114, and the like exist between the bit line 125 and the semiconductor substrate 111. Therefore, since the film thickness of the interlayer insulating film 115 between the bit line 125 and the semiconductor substrate 111 increases, the contact connecting the bit line 125 to the semiconductor substrate 111 becomes very deep. In particular, since the diameter of the contact is increasingly reduced to about 0.15 to 0.18 µm, and the aspect ratio of the contact increases by miniaturization of the memory, it is predicted that it becomes further difficult to form a satisfactory contact with a held size.

BRIEF SUMMARY OF THE INVENTION

According to a first aspect of the present invention, there is provided a ferroelectric memory device comprising: a semiconductor substrate; a first trench formed in the semiconductor substrate to extend in a first direction and having a first depth; a second trench formed in the semiconductor substrate to extend in a second direction and having a second depth and including an upper region and a lower region, the second direction extending across the first trench, the second depth being smaller than the first depth; a first element isolation insulating film buried in the first trench; a first gate electrode formed in the lower region of the second trench via a first gate insulating film; a first insulating film formed in the upper region of the second trench; a first diffusion layer formed in the semiconductor substrate on one side-surface side in the second trench; a second diffusion layer formed in the semiconductor substrate on the other side-surface side in the second trench; a first ferroelectric capacitor disposed on the first diffusion layer and including a first lower electrode, a first ferroelectric film, and a first upper electrode; a first contact disposed on the first ferroelectric capacitor; a first wiring layer disposed on the first contact; a second contact disposed on the second diffusion layer; and a second wiring layer disposed on the second contact and disposed on the same level as that of the first wiring layer.

According to a second aspect of the present invention, there is provided a method of manufacturing a ferroelectric memory device, comprising: forming a first trench which extends in a first direction in a semiconductor substrate and which has a first depth; forming a element isolation insulating film in the first trench; forming a second trench which extends in a second direction in the semiconductor substrate and which has a second depth and which includes an upper region and a lower region, the second direction extending across the first trench, the second depth being smaller than the first depth; forming a gate electrode via a gate insulating film in the lower region of the second trench; forming a first insulating film in the upper region of the second trench; forming first and second diffusion layers in the semiconductor substrate on both side surfaces in the second trench; forming a first ferroelectric capacitor including a first lower electrode, a first ferroelectric film, and a first upper electrode on the first diffusion layer; forming a first contact on the first ferroelectric capacitor; forming a second contact on the second diffusion layer; and forming first and second wiring layers on the first and second contacts, respectively.

BRIEF DESCRIPTION OF THE SEVERAL VIEWS OF THE DRAWING

FIGS. 40 to 46 are sectional views showing the respective manufacturing steps of the ferroelectric memory device according to an eighth embodiment of the present invention;

DETAILED DESCRIPTION OF THE INVENTION

In embodiments of the present invention, a structure in which a transistor is buried in a substrate and a capacitor is formed on the substrate is proposed in order to reduce an aspect ratio of a contact connecting a bit line to the transistor.

In order to describe this structure, a ferroelectric random access memory (FeRAM) using a two-dimensional or three-dimensional capacitor will be described as an example in the respective embodiments of the present invention.

It is to be noted that the two-dimensional capacitor refers to a capacitor in which an upper electrode, lower electrode, and ferroelectric film constituting a ferroelectric capacitor extend only in XY-directions in a planar manner and do not extend in a solid Z-direction, and only a plane horizontal with respect to a semiconductor substrate plane is used as a capacitor plane. Moreover, the three-dimensional capacitor refers to a capacitor in which at least a part of the upper electrode, lower electrode, and ferroelectric film constituting the ferroelectric capacitor extend not only in the XY-directions in the planar manner but also in the Z-direction in a solid manner, and not only the plane horizontal with respect to the semiconductor substrate plane but also a side-surface part of the lower electrode that is not horizontal with respect to the semiconductor substrate plane are used as the capacitor planes.

[First Embodiment]

A first embodiment relates to an example in which a transistor is buried in a substrate and a capacitor is formed on the substrate in the FeRAM using the two-dimensional capacitor.

Figure 1:
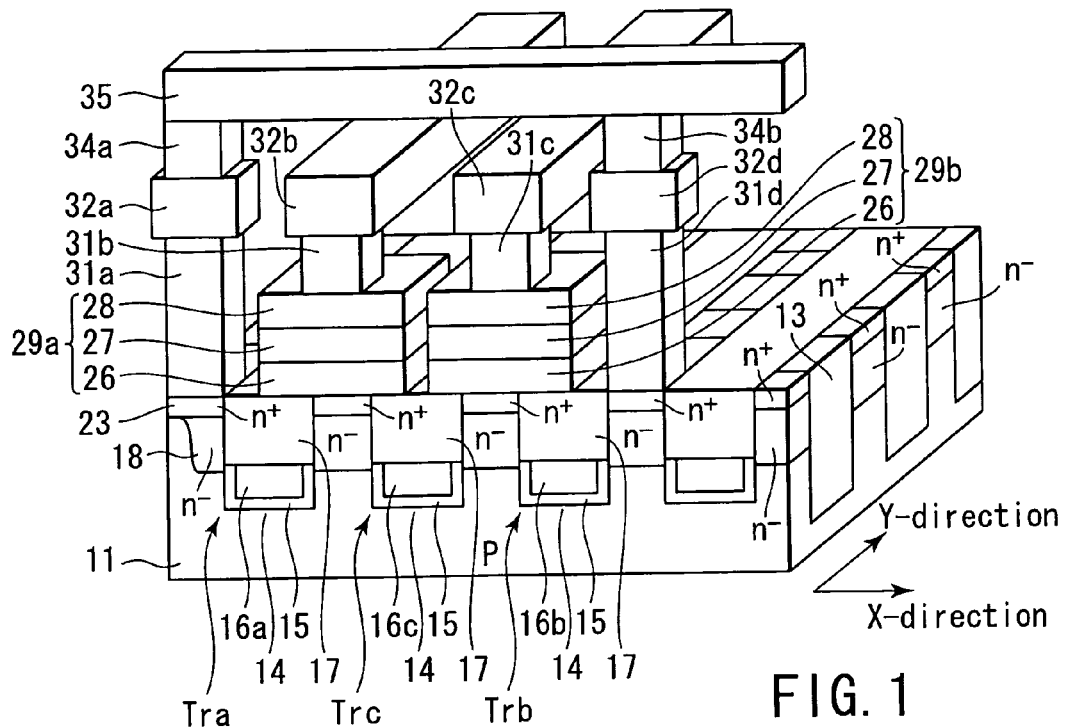
FIG. 1 is a perspective view showing a ferroelectric memory device according to a first embodiment of the present invention.

FIG. 1 shows a perspective view of a ferroelectric memory device according to the first embodiment of the present invention. Here, a schematic structure for two cells is shown, but it is assumed that a structure for two cells is repeated in a cell array.

As shown in FIG. 1, a plurality of trenches (element isolating trenches) for isolating elements are formed of a element isolation insulating film 13, and a plurality of gate trenches 14 are formed, for example, in a P-type semiconductor substrate (e.g., a silicon substrate) 11. Here, the element isolating trenches extend in an X-direction, and the gate trenches 14 extend in a Y-direction so as to cross the element isolating trenches. It is to be noted that the gate trenches 14 are preferably formed to be shallower than the element isolating trenches so that adjacent cells are not electrically connected.

Gate electrodes 16a, 16b, 16c are formed in lower regions of the gate trenches 14 via gate insulating films 15, and buried insulating films 17 are formed in upper regions of the gate trenches 14. Transistors Tra, Trb, Trc are buried in the semiconductor substrate 11. It is to be noted that the gate insulating films 15 may exist not only between the gate electrodes 16a, 16b, 16c and the gate trenches 14 but also between the buried insulating films 17 and the gate trenches 14.

For example, an n⁻ type low-concentration diffusion layer 18 is formed on the surface of the semiconductor substrate 11 except the gate trenches 14 and the element isolating trenches, and, for example, an n⁺ type high-concentration diffusion layer 23 is formed on the surface of the low-concentration diffusion layer 18. Here, the low-concentration diffusion layer 18 is preferably formed to be deeper from the upper surfaces of the gate electrodes 16a, 16b, 16c. It is to be noted that the low- and high-concentration diffusion layers 18, 23 are formed in element regions isolated by the gate trenches 14 and the element isolating trenches, and therefore have an island-shaped pillar structure.

A two-dimensional ferroelectric capacitor 29a is formed on the element region between the gate electrodes 16a, 16c, and a two-dimensional ferroelectric capacitor 29b is formed on the element region between the gate electrodes 16b, 16c. Each of these capacitors 29a, 29b is constituted of a lower electrode 26, ferroelectric film 27, and upper electrode 28. These lower electrode 26, ferroelectric film 27, and upper electrode 28 are isolated for each cell. It is to be noted that a barrier film (not shown) formed of TiAlN or the like may also be disposed under the lower electrode 26. Moreover, plate lines 32b, 32c extending in a Y-direction are formed on the capacitors 29a, 29b via contacts 31b, 31c.

A contact 31a is formed on the element region on a side opposite to the capacitor 29a via the gate electrode 16a, and a contact 31d is formed on the element region on the side opposite to the capacitor 29b via the gate electrode 16b. Wiring layers 32a, 32d disposed in the same level as that of the plate lines 32b, 32c are formed on the contacts 31a, 31d. Contacts 34a, 34b are formed on the wiring layers 32a, 32d, and a bit line 35 extending in an X-direction is formed on the contacts 34a, 34d.

In the first embodiment, in order to allow the transistor Trc between two cells to function as a field shield region, when a voltage between a source/drain of the transistor Trc is about 0.5 to 4V, a voltage is applied to the gate electrode 16c so as to obtain a sub-threshold current of about $10^{-10}$ A or less. Moreover, two cells are disposed in a symmetric structure via the field shield region which is a boundary. Here, one cell is constituted of the transistor Tra and capacitor 29a, a side-surface and bottom-surface region of the gate trench 14 in the transistor Tra functions as a channel, and this cell is connected to the bit line 35 via the contacts 31a, 34a and wiring layer 32a. The other cell is constituted of the transistor Trb and capacitor 29b, the side-surface and bottom-surface region of the gate trench 14 in the transistor Trb functions as the channel, and this cell is connected to the bit line 35 via the contacts 31d, 34b and wiring layer 32d.

According to the first embodiment, the transistors Tra, Trb of a memory cell part are buried in the substrate 11, and the island-shaped pillar regions defined by the gate trenches 14 and element isolating trenches are used as connecting parts of the capacitors 29a, 29b to the source/drain. Accordingly, contact plugs connecting the capacitors 29a, 29b to the source/drain, and interlayer insulating films between the capacitors 29a, 29b and the semiconductor substrate 11 can be eliminated. Therefore, the depth to the substrate 11 from the first structure wiring layers 32a, 32b, 32c, 32d can be about half of the conventional depth, and the aspect ratio of the contact connected to the bit line 35 can be reduced.

Moreover, a region in which the gate 16c functioning as the field shield region is buried can be formed simultaneously with a region in which the transfer gates 16a, 16b are buried. Moreover, since there is not any fluctuation of the pillar region by alignment deviation, the field shield region can easily be formed.

[Second Embodiment]

A second embodiment is a modified example of the first embodiment, and an element isolation region having a usual shallow trench isolation (STI) structure is used as the field shield region.

Figure 2:
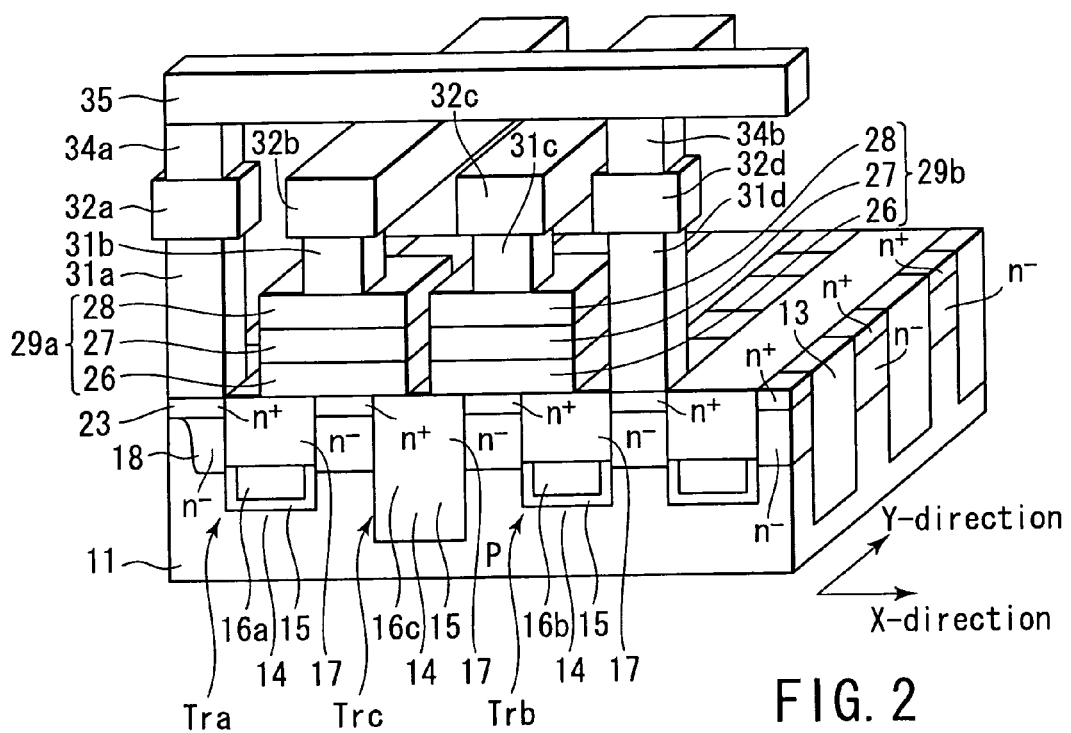
FIG. 2 is a perspective view showing the ferroelectric memory device according to a second embodiment of the present invention.

FIG. 2 shows a perspective view showing the ferroelectric memory device according to the second embodiment of the present invention. As shown in FIG. 2, the second embodiment is different from the first embodiment in that the element isolating trench is formed in the Y-direction between two cells, the element isolating trenches are filled with the element isolation insulating film 13, and this is allowed to function as the field shield region. The element isolating trenches extending in the Y-direction may simultaneously be formed in a depth of the same degree as that of the element isolating trench extending in the X-direction.

According to the second embodiment, the same effect as that of the first embodiment can be obtained. Furthermore, when the usual element isolation region is used as the field shield region, the transistor Trc does not have to be controlled so as to function as the field shield region as in the first embodiment, and a stable field shield region can be realized.

[Third Embodiment]

A third embodiment is a modified example of the first embodiment, and a series connected TC unit type cell structure is used. Here, the series connected TC unit type cell structure includes series connected unit cells each having a source terminal and a drain terminal of a memory cell transistor (T) and a capacitor (C) connected to the two terminals.

Figure 3:
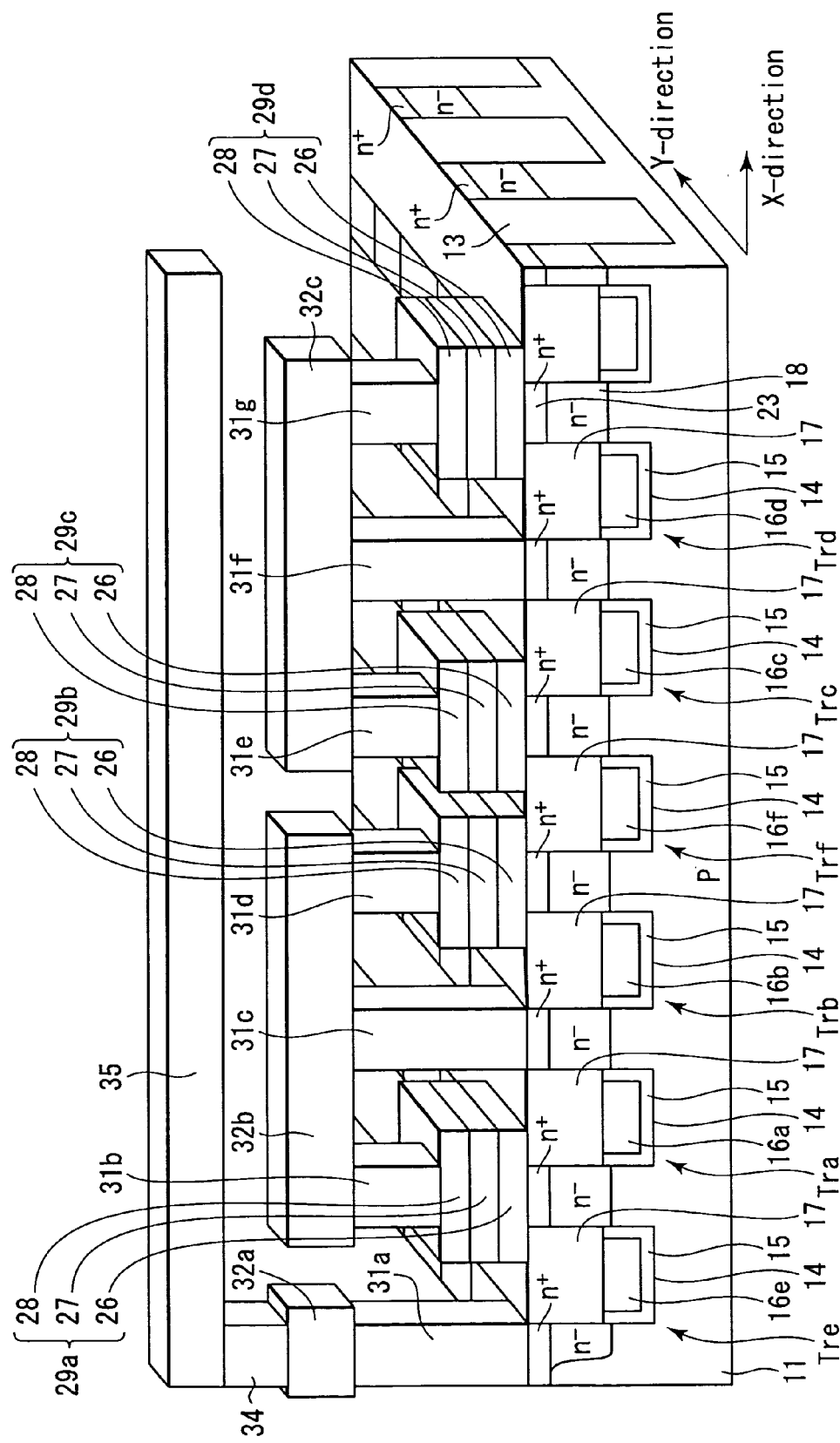
FIG. 3 is a perspective view showing the ferroelectric memory device according to a third embodiment of the present invention.

FIG. 3 shows a perspective view of the ferroelectric memory device according to a third embodiment of the present invention. It is to be noted that the cell structure is shown by a four-bit unit, but can variously be changed into the cell structure by eight to 16-bit unit.

As shown in FIG. 3, the third embodiment is different from the first embodiment in the cell structure of the series connected TC unit type. Concretely, the structure will be described hereinafter.

A first cell is constituted of the transistor Tra and capacitor 29a. In this first cell, one of the source/drain of the transistor Tra is electrically connected to the lower electrode 26 of the capacitor 29a. The other of the source/drain is electrically connected to the upper electrode 28 of the capacitor 29a via the contacts 31c, 31b and wiring 32b. Accordingly, the source/drain of the transistor Tra, and the upper electrode 28 and lower electrode 26 of the capacitor 29a are connected in parallel.

A second cell is constituted of the transistor Trb and capacitor 29b. In this second cell, one of the source/drain of the transistor Trb is electrically connected to the lower electrode 26 of the capacitor 29b. The other of the source/drain is electrically connected to the upper electrode 28 of the capacitor 29b via the contacts 31c, 31d and wiring 32b. Accordingly, the source/drain of the transistor Trb, and the upper electrode 28 and lower electrode 26 of the capacitor 29b are connected in parallel.

A third cell is constituted of the transistor Trc and capacitor 29c. In this third cell, one of the source/drain of the transistor Trc is electrically connected to the lower electrode 26 of the capacitor 29c. The other of the source/drain is electrically connected to the upper electrode 28 of the capacitor 29c via the contacts 31f, 31e and wiring 32c. Accordingly, the source/drain of the transistor Trc, and the upper electrode 28 and lower electrode 26 of the capacitor 29c are connected in parallel.

A fourth cell is constituted of the transistor Trd and capacitor 29d. In this fourth cell, one of the source/drain of the transistor Trd is electrically connected to the lower electrode 26 of the capacitor 29d. The other of the source/drain is electrically connected to the upper electrode 28 of the capacitor 29d via the contacts 31f, 31g and wiring 32c. Accordingly, the source/drain of the transistor Trd, and the upper electrode 28 and lower electrode 26 of the capacitor 29d are connected in parallel.

Moreover, in the first and second cells, since connecting portions of the transistors Tra, Trb to the upper electrode 28 are shared, the first and second cells are connected in series. In the third and fourth cells, since the connecting portions of the transistors Trc, Trd to the upper electrode 28 are shared, the third and fourth cells are connected in series. In the second and third cells, when the voltage between the source/drain of a transistor Trf disposed between the transistors Trb, Trc is about 0.01 to 0.05V, a voltage (voltage at which a current of about 10 nA or more flows) is applied to a gate electrode 16f of the transistor Trf so that the transistor is constantly ON. Accordingly, the second cell is electrically connected to the third cell, and the second and third cells are connected in series.

Moreover, a block selection transistor Tre for selecting a block constituted of the first to fourth cells is disposed on the left of the transistor Tra. One of the source/drain of the transistor Tre is connected to a block constituted of the first to fourth cells, and the other of the source/drain is connected to the bit line 35 via the contacts 31a, 34 and wiring layer 32a.

According to the third embodiment, the same effect as that of the first embodiment can be obtained. Furthermore, the cell area can be reduced by the series connected TC unit type structure.

Moreover, the buried transistor Trf which is constantly on is disposed in order to electrically connect the second cell to the third cell. Therefore, when the capacitors 29a, 29b, 29c, 29d are processed, the buried insulating films 17 exists under the opposite ends of the capacitors 29a, 29b, 29c, 29d, and this can prevent the substrate 11 from being hollowed out.

[Fourth Embodiment]

A fourth embodiment is a modified example of the third embodiment, and instead of disposing the buried transistor Tra which is constantly on, the diffusion layers under the second and third cell capacitors are continued in series in order to electrically connect the second cell to the third cell.

Figure 4:
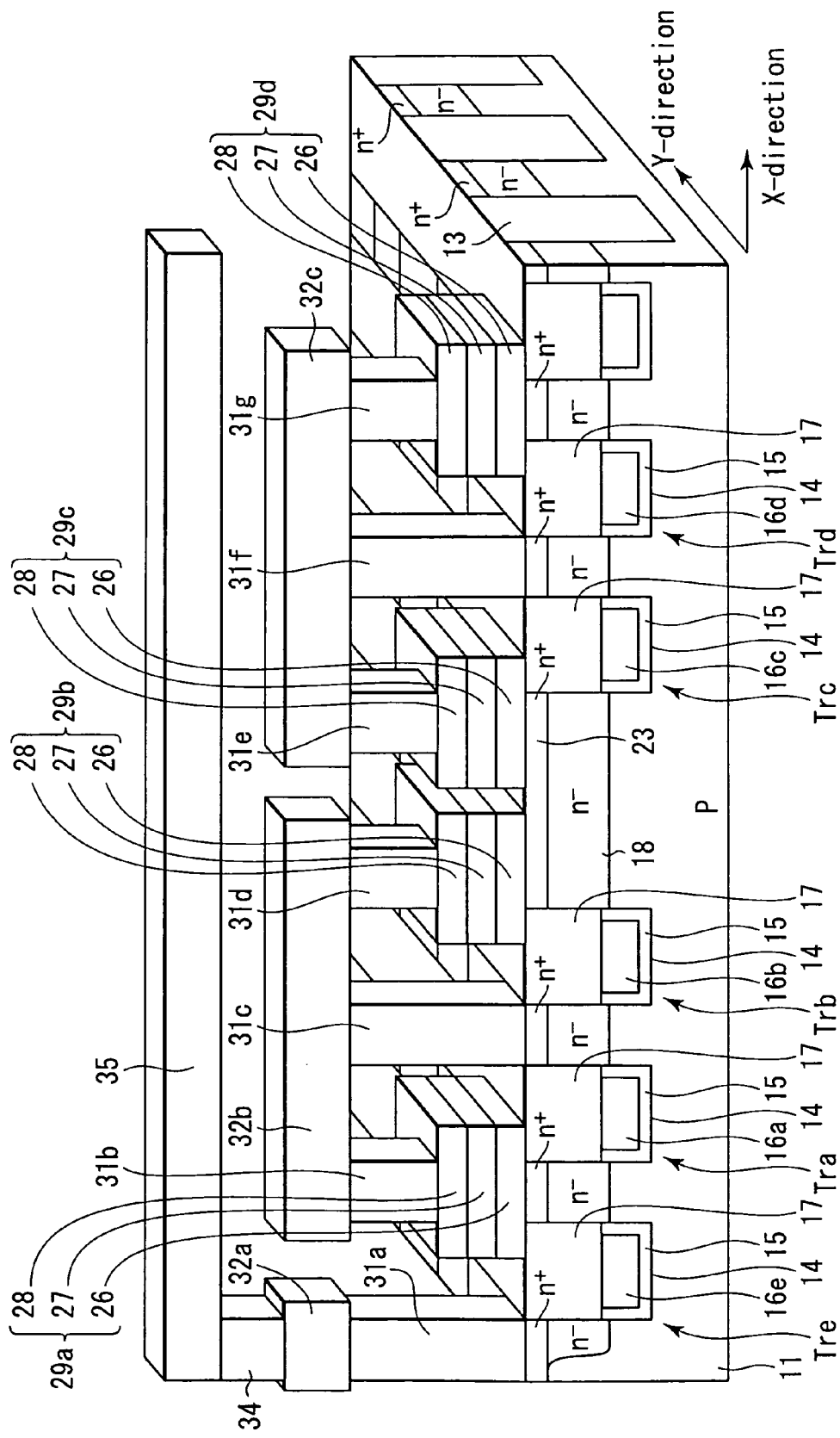
FIG. 4 is a perspective view showing the ferroelectric memory device according to a fourth embodiment of the present invention.

FIG. 4 shows a perspective view of the ferroelectric memory device according to the fourth embodiment of the present invention. As shown in FIG. 4, the fourth embodiment is different from the third embodiment in that the diffusion layers 18, 23 under the capacitors 29b, 29c are continued in series to electrically connect the second cell to the third cell, and accordingly the second and third cells are connected in series.

According to the fourth embodiment, an effect similar to that of the third embodiment can be obtained. Furthermore, since a usual diffusion region is used as a conductive region, the transistor Trc does not have to be controlled so as to function as the conductive region as in the third embodiment, and a stable conductive region can be realized.

[Fifth Embodiment]

A fifth embodiment shows a memory cell section and a control circuit section. The structure of the first embodiment is applied to the memory cell section, and a usual plane transistor Tra is applied to the control circuit section.

Figure 5:
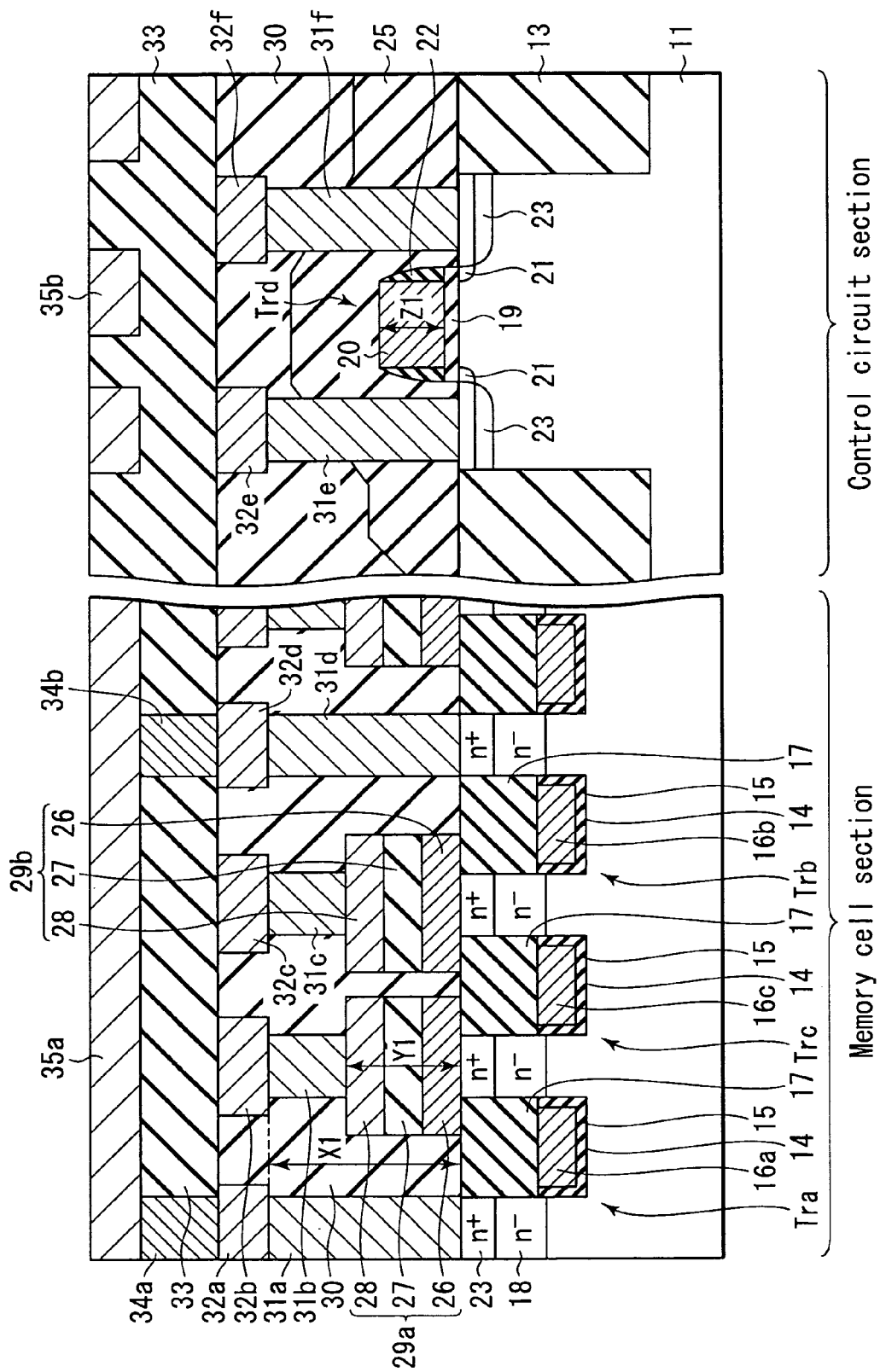
FIG. 5 is a sectional view showing the ferroelectric memory device according to a fifth embodiment of the present invention.

FIG. 5 shows a sectional view of the ferroelectric memory device according to the fifth embodiment of the present invention. As shown in FIG. 5, for the control circuit section, a gate electrode 20 is formed on the semiconductor substrate 11 via a gate insulating film 19. A spacer 22 is formed on the side surface of the gate electrode 20, and diffusion layers 21, 23 are formed on the opposite sides of the gate electrode 20. The diffusion layers 21, 23 are connected to the contacts 31e, 31f, and the contacts 31e, 31f are connected to the wiring layers 32e, 32f disposed in the same level as that of the wiring layers 32a, 32b, 32c, 32d of the memory cell section.

A wiring layer 35b is disposed in the same level as a bit line 35a of the memory cell section. It is to be noted that since the memory cell section has a structure similar to that of the first embodiment, description thereof is omitted.

In this structure, the depth between the first wiring layers 32a, 32b, 32c, 32d and the substrate 11 in the memory cell section can be reduced. Therefore, assuming that a height (film thickness of the interlayer insulating film under the first wiring layer) of the contact 31a or 31d connecting the substrate 11 to the first wiring layer 32a or 32d is X1, the film thickness of the two-dimensional capacitor 29a or 29b is Y1, and the height of the gate electrode 20 in a control circuit is Z1, relationships of the following equations (1), (2) are established. It is to be noted that the film thickness Y1 of the capacitor 29a or 29b is a film thickness between a lower interface of the lower electrode 26 and an upper interface of the film of the first layer of the upper electrode 28 in contact with the ferroelectric film 27.

$$X1 \leq 2.5 Y1 \quad (1)$$

$$X1 \leq 6 Z1 \quad (2)$$

FIGS. 6 to 15 show sectional views of manufacturing steps of the ferroelectric memory device according to the fifth embodiment of the present invention. A method of manufacturing the ferroelectric memory device according to the fifth embodiment will hereinafter be described.

Figure 6:
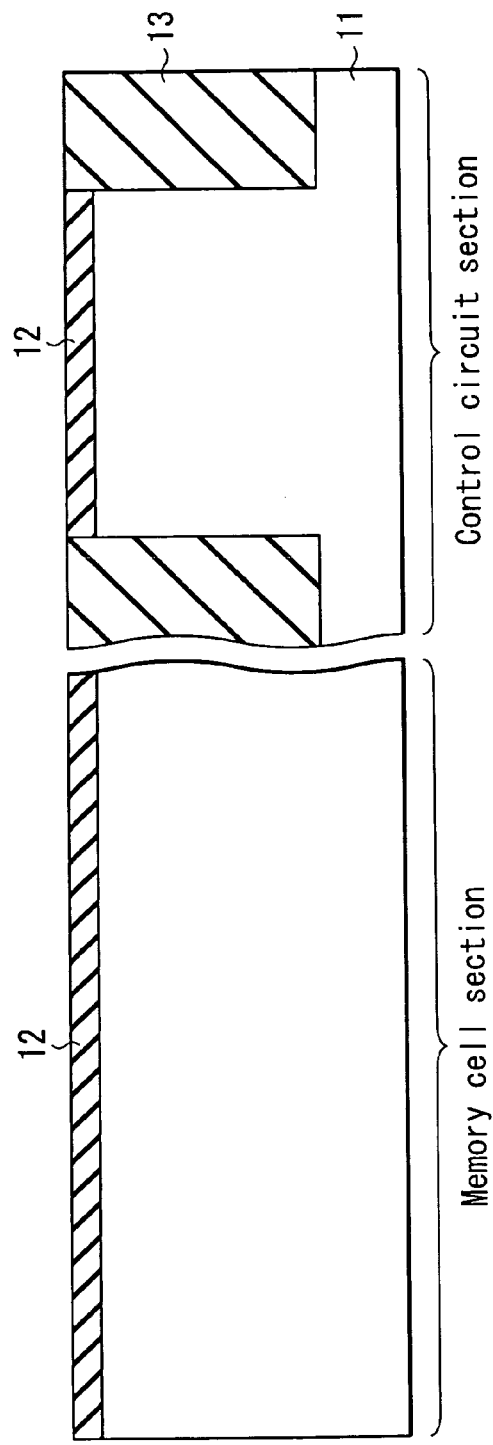
FIGS. 6 to 15 are sectional views showing manufacturing steps of the ferroelectric memory device according to the fifth embodiment of the present invention.

First, as shown in FIG. 6, a stopper insulating film 12 formed, for example, of SiN is deposited on the semiconductor substrate (e.g., a silicon substrate) 11, for example, of a P type. Next, element isolating trenches are formed in the semiconductor substrate 11, and the element isolation insulating films 13 of tetra ethyl ortho silicate (TEOS) are buried in the element isolating trenches. Thereafter, the element isolation insulating film 13 is flattened by chemical mechanical polish (CMP) until the upper surface of the stopper insulating film 12 is exposed. Accordingly, the element isolation region having the STI structure is formed in the semiconductor substrate 11. It is to be noted that the element isolation region is formed even in the memory cell section although not shown in the sectional view of FIG. 6.

Figure 7:
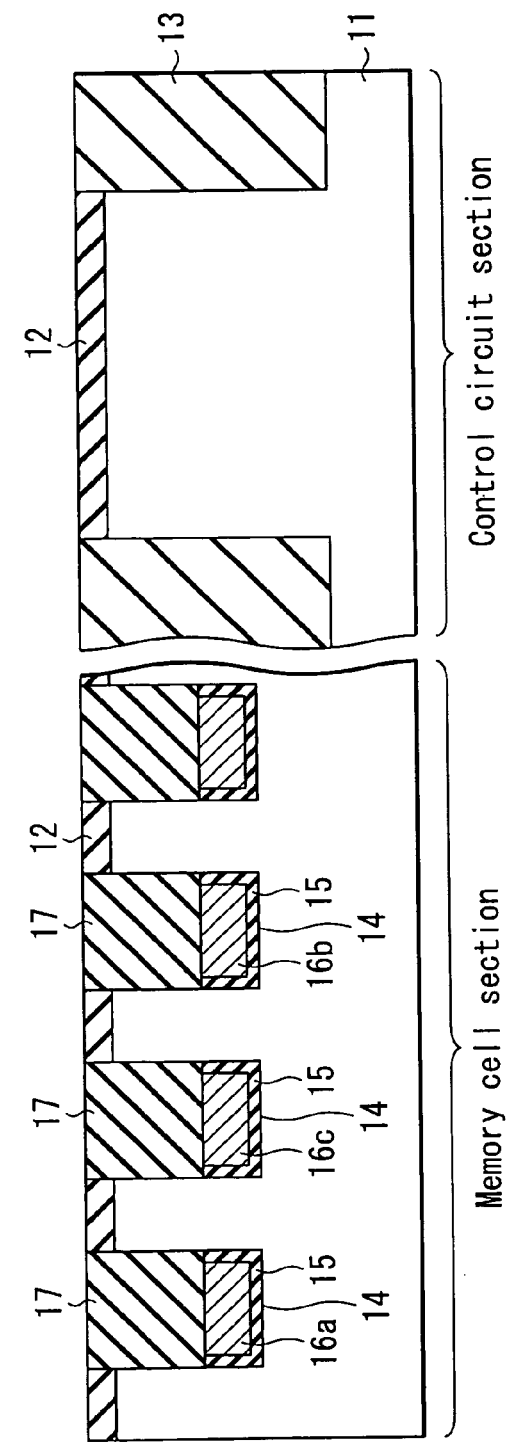

Next, as shown in FIG. 7, the gate trenches 14 for the buried transistors are formed in the semiconductor substrate 11 in the memory cell section. Next, the gate oxide films 15 are formed on the bottom and side surfaces in the gate trenches 14, and thereafter conductive gate electrode materials such as polycrystal silicon are deposited in the gate trenches 14. Next, the gate electrode material is flattened by CMP until the upper surface of the stopper insulating film 12 is exposed. Next, the gate electrode material and gate oxide film 15 are recessed in the gate trenches 14 by anisotropic etching such as reactive ion etching (RIE) and isotropic etching such as chemical dry etching (CDE). Accordingly, the gate electrodes 16a, 16b, 16c are formed whose upper surfaces are positioned lower than the upper surface of the semiconductor substrate 11. Next, the buried insulating films 17 formed, for example, of TEOS films are deposited in the gate trenches 14, and the buried insulating films 17 are flattened by CMP to expose the upper surface of the stopper insulating film 12. Thereafter, the stopper insulating film 12 is removed by phosphoric acid treatment or the CDE method.

Figure 8:
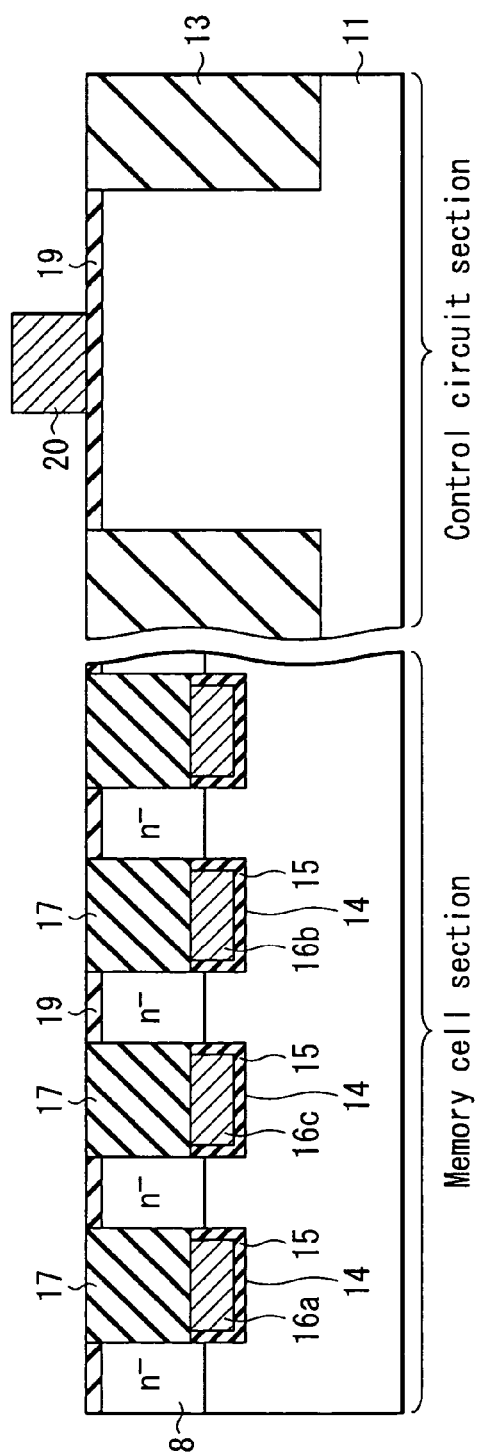

Next, after a dummy gate insulating film (not shown) is formed on the surface of the semiconductor substrate 11 as shown in FIG. 8, the low-concentration diffusion layer 18 of the n⁻ type is formed on the element region in the memory cell section. Next, after removing the dummy gate insulating film, the gate oxide film 19 is formed on the surface of the semiconductor substrate 11. Next, the gate electrode material formed, for example, of polycrystal silicon is deposited, and the gate electrode material is patterned by a lithography method to form the gate electrode 20 in the control circuit section.

Figure 9:
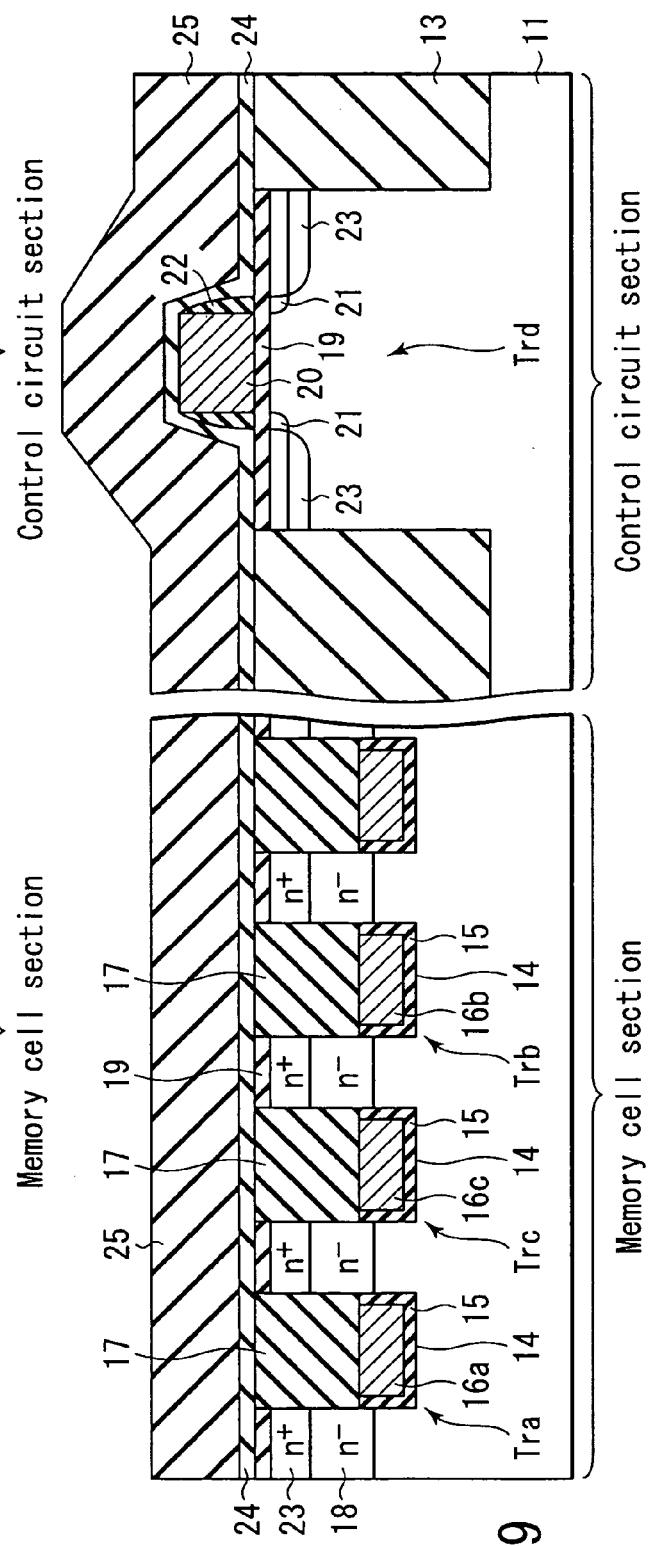

Next, after a low-concentration diffusion layer 21 of the n⁻ type is formed on the surface of the semiconductor substrate 11 in the control circuit section as shown in FIG. 9, spacers 22 are formed on the side surfaces of the gate electrode 20. Next, a high-concentration diffusion layer 23 of the n⁺ type is formed on the surface of the semiconductor substrate 11 both in the control circuit section and the memory cell section. Accordingly, the transistors Tra, Trb, Trc, Trd are formed. Thereafter, an interlayer film 24 formed, for example, of an SiN film, alumina, titania, or the like is deposited in the memory cell section and control circuit section, and an interlayer film 25 formed, for example, of TEOS, boron phosphorous silicate glass (BPSG), and spin on glass (SOG) is deposited on the interlayer film 24.

It is to be noted that a metal silicide film formed, for example, of Ni, Ti, Co may also be formed on the diffusion layer 23 of the memory cell section and control circuit section or the gate electrode 20 of the control circuit section in a self-aligned manner before the interlayer film 24 is deposited. In this case, the metal silicide film on the diffusion layer 23 of the memory cell section is formed of the same material as that of the metal silicide film on the diffusion layer 23 of the control circuit section in an equal film thickness. This silicide film is capable of realizing resistance reduction. Also in the memory cell section, effects are also obtained that silicon is inhibited from being diffused in the lower electrode material of the capacitor and the contact is constituted to be satisfactory.

Figure 10:
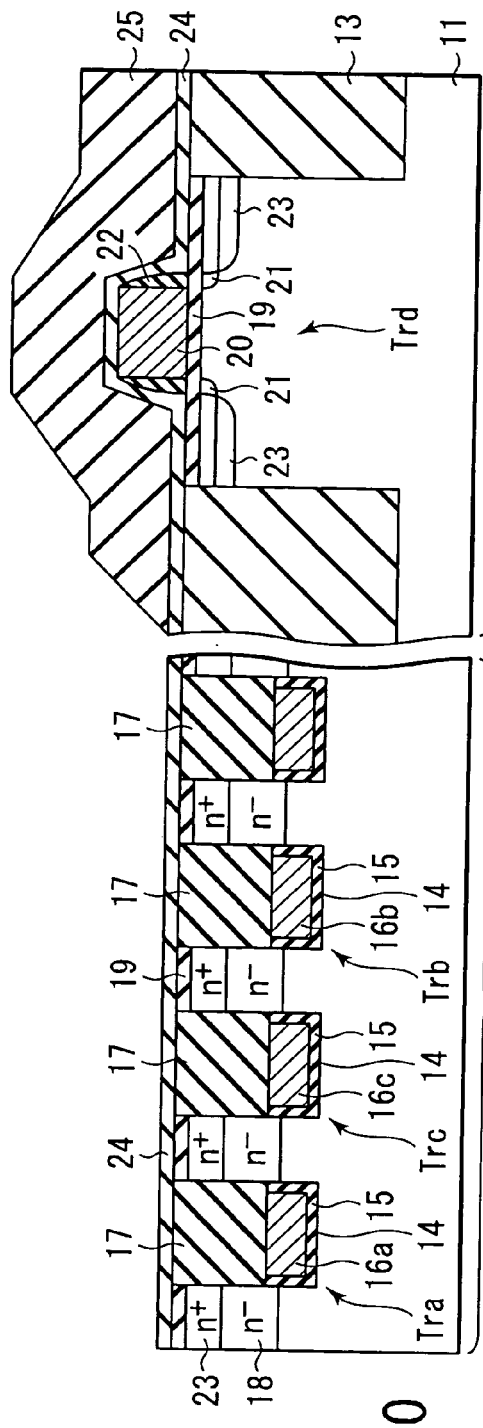

Next, the interlayer film 25 is removed only from the memory cell section as shown in FIG. 10. Here, the end of the interlayer film 25 left in the control circuit section preferably has a tapered shape which is as moderate as possible. Therefore, it is more preferable to remove the interlayer film 25 by use of wet etching by HF, NH₄F, or the like or the isotropic etching such as CDE than to remove the film by use of the anisotropic etching such as RIE.

Figure 11:
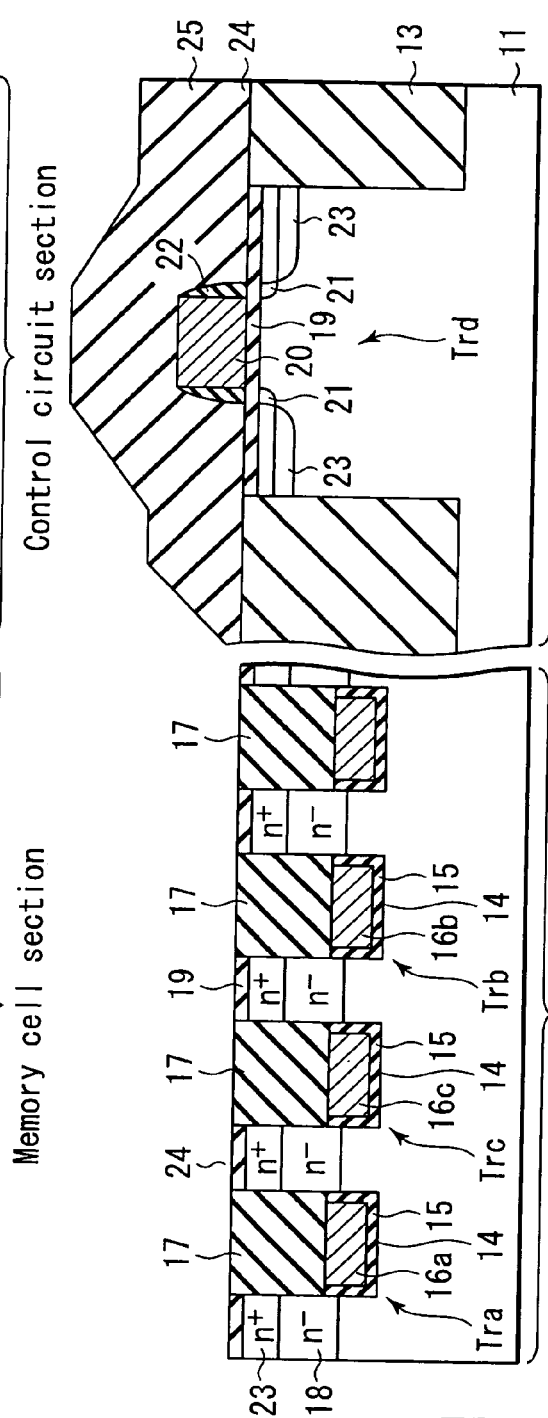

Next, as shown in FIG. 11, the interlayer film 24 is removed only from the memory cell section to expose the upper surfaces of the gate oxide film 19 and insulating film 17 of the memory cell section. Here, the interlayer film 24 may also be removed by the use of the anisotropic etching such as RIE, but is more preferably removed by the use of the phosphoric acid or the CDE process.

Figure 12:
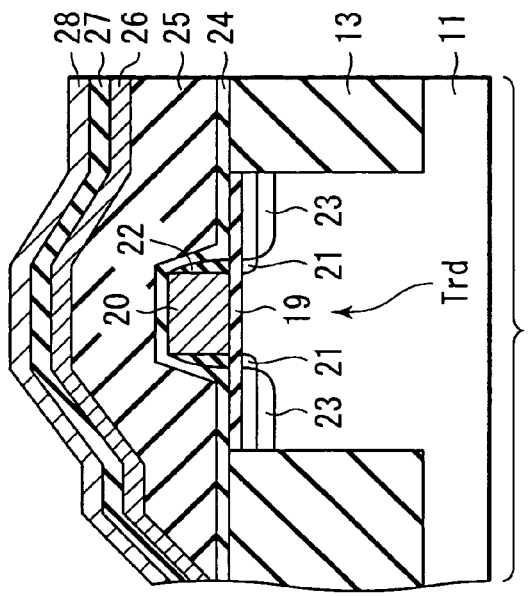
Figure 12:
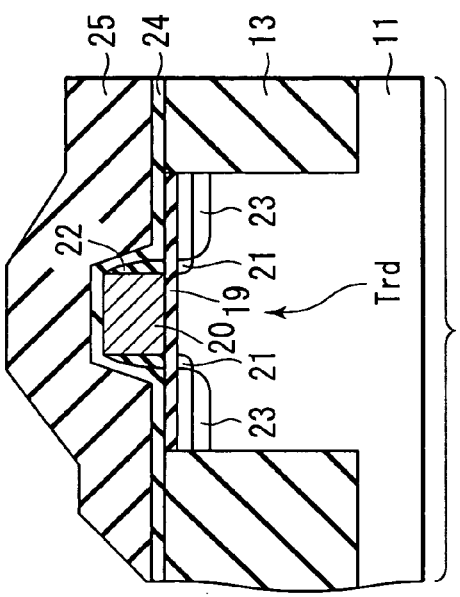
Figure 12:
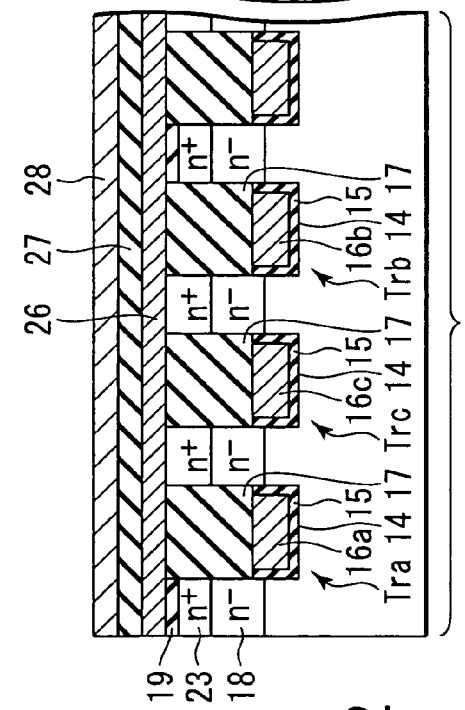

Next, as shown in FIG. 12, an oxide film based thin insulating film (not shown) is deposited, and the insulating film is patterned by lithography so as to expose the gate oxide film 19 in a position where the capacitor is mounted. Moreover, the patterned insulating film is used as a mask to remove the gate oxide film 19 in the position where the capacitor is mounted. It is to be noted that the gate oxide film 19 does not have to be necessarily partially removed, and the whole memory cell section may also be removed.

Next, the lower electrode 26, ferroelectric film 27, and upper electrode 28 are formed in order by a sputtering or coating process, or a metal organic chemical vapor deposition (MOCVD) process. Here, examples of the lower electrode 26 include Ir, $IrO_2$, a stacked film of Ir and Pt, a stacked film of $IrO_2$ and Pt, and the like. The examples of the ferroelectric film 27 include a PZT, SBT, or BLT film. The examples of the upper electrode 28 include Pt, $IrO_2$, SrRuO, or a stacked film of Pt, $IrO_2$, SrRuO. It is to be noted that when an Ir-containing material is used as the lower electrode 26, it is more preferable to dispose an oxygen barrier film formed, for example, of TiN or TiAlN under the lower electrode 26.

Figure 13:
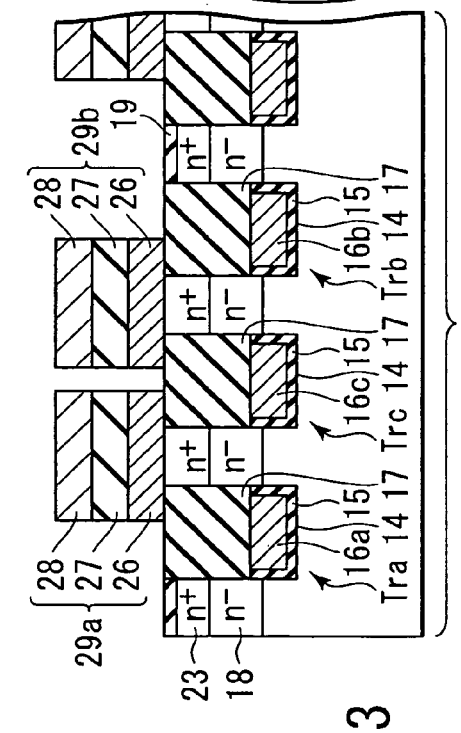

Next, as shown in FIG. 13, the lower electrode 26, ferroelectric film 27, and upper electrode 28 are patterned by lithography and RIE to form the ferroelectric capacitors 29a, 29b in the memory cell section. In this case, a resist may also be used as a mask material at the time of the patterning, but it is preferable to use an oxide film (alumina), TiN film, TiAlN film, and the like in consideration of a high-temperature treatment. It is to be noted that the upper surfaces of the capacitors 29a, 29b are preferably adjusted beforehand so as to have a height (about ±1500 Å) which is substantially equal to that of the upper surface of the interlayer film 25.

Figure 14:
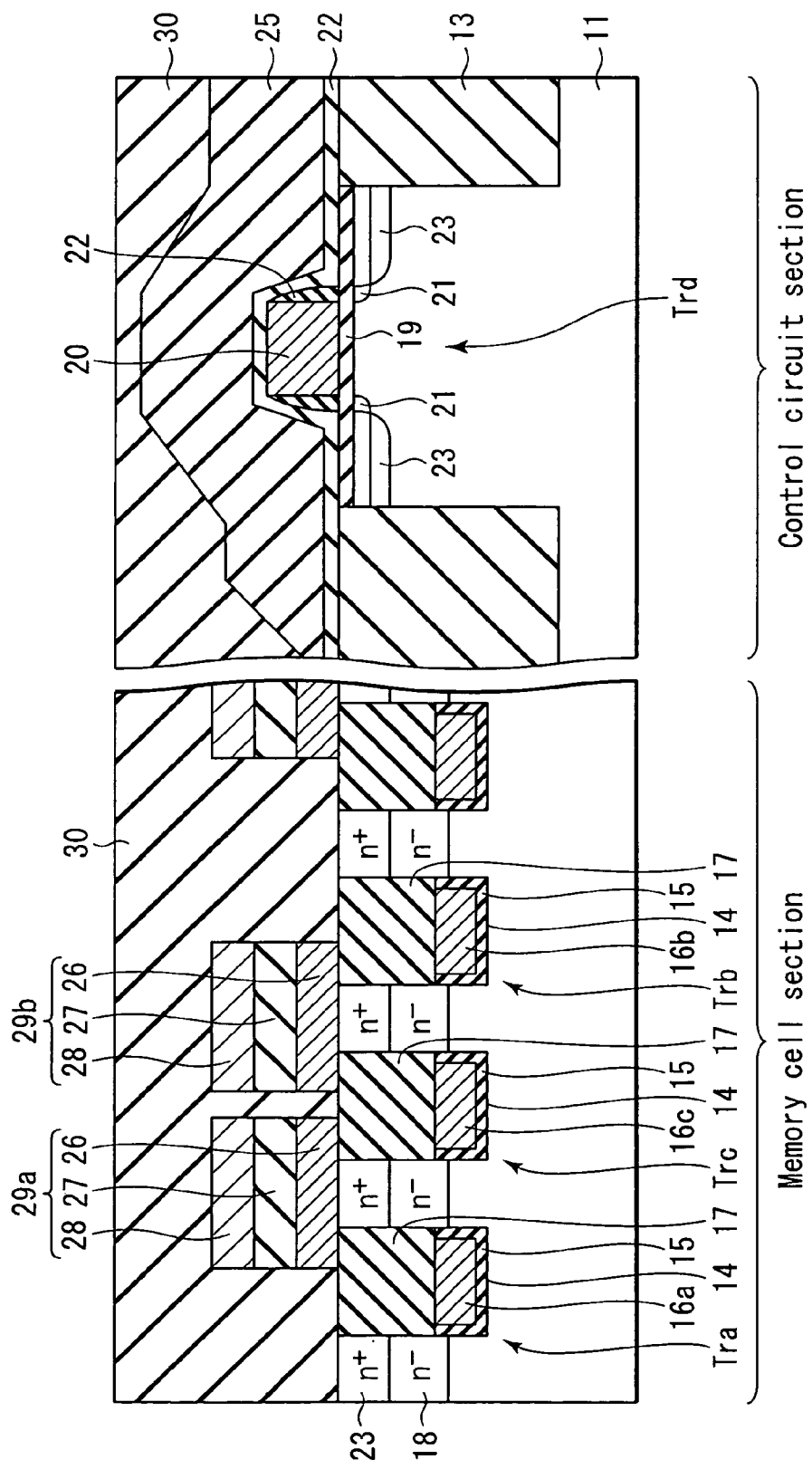

Next, as shown in FIG. 14, an interlayer insulating film 30, for example, of TEOS and SOG is deposited, and the interlayer insulating film 30 is flattened by CMP.

Figure 15:
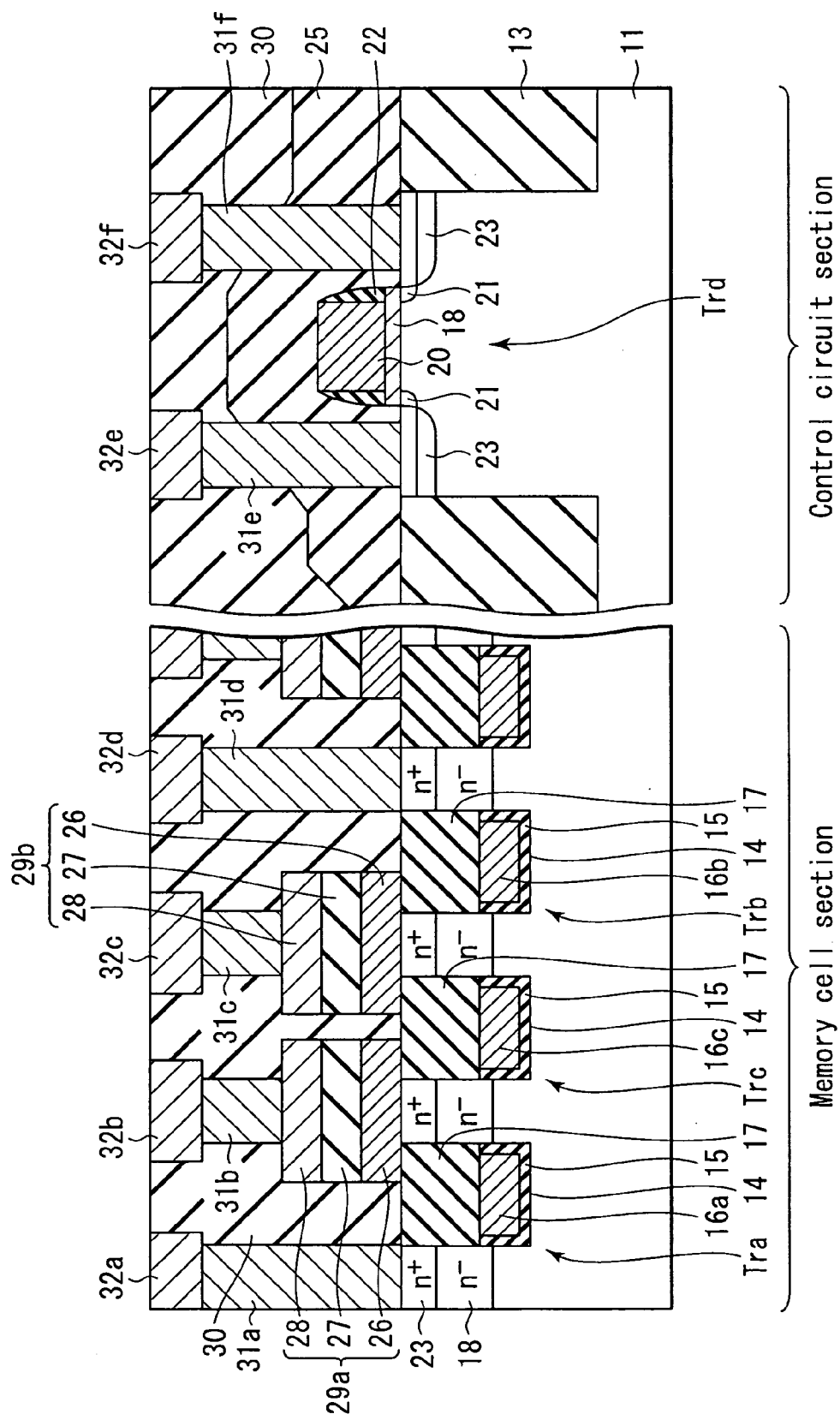

Next, as shown in FIG. 15, the contacts 31b, 31c connected to the upper electrode 28 are formed, the contacts 31a, 31d, 31e, 31f connected to the diffusion layer 23 are formed, and the first wiring layers 32a, 32b, 32c, 32d, 32e, 32f connected to the contacts 31a, 31b, 31c, 31d, 31e, 31f are formed. Here, the first wiring layers 32b, 32c connected to the capacitors 29a, 29b function as the plate lines.

Next, as shown in FIG. 5, an interlayer insulating film 33 is formed on the interlayer insulating film 30. Next, the contacts 34a, 34b and second wiring layers 35a, 35b are formed in the interlayer insulating film 33. Here, the second wiring layer 35a in the memory cell section functions as the bit line. It is to be noted that thereafter third and fourth wiring layers may also be formed, and various wirings may be either Al or Cu.

According to the fifth embodiment, not only the effect in the first embodiment but also the following effect can also be obtained.

In the fifth embodiment, the buried transistors Tra, Trb are formed in the memory cell section, and the usual plane transistor Trd is formed in the control circuit section. Accordingly, the control circuit section required to have high reliability or current driving capability can secure sufficient reliability without any change in the conventional section.

Moreover, the gate electrodes 16a, 16b of the memory cell section are buried in the substrate 11, and the interlayer films between the capacitors 29a, 29b and the substrate 11 are eliminated. Accordingly, a step by the capacitors 29a, 29b of the memory cell section can be constituted so as to be substantially identical to that by the gate electrode 20 of the control circuit section. Therefore, without performing dummy patterning in the control circuit section, a flatting step of the interlayer insulating film 30 on the capacitors 29a, 29b in the memory cell section can is easily be carried out simultaneously with the flatting step of the interlayer insulating film 30 on the gate electrode 20 in the control circuit section.

Moreover, in the step of FIG. 10, the interlayer film 25 of the memory cell section is removed by the isotropic etching, so that the end of the interlayer film 25 left in the control circuit section can be formed to have the moderate taper shape. When the end of the interlayer film 25 is formed to have the moderate taper shape in this manner, an over etching amount can be reduced, and the processing of the capacitor is facilitated at the time of the processing of the capacitor of FIG. 13.

Moreover, the upper surfaces of the capacitors 29a, 29b are constituted to have a height which is substantially equal to that of the upper surface of the interlayer film 25. Accordingly, thereafter, since protrusions having the equal height exist in a similar density both in the memory cell section and the control circuit section during the polishing of the interlayer insulating film 30, flatness after the polishing becomes satisfactory.

It is to be noted that the memory cell section is not limited to the structure of the first embodiment, and, needless to say, it is also possible to apply the structure of another embodiment.

[Sixth Embodiment]

A sixth embodiment is an example in which the two-dimensional capacitor of the fifth embodiment is modified into a three-dimensional capacitor.

Figure 16:
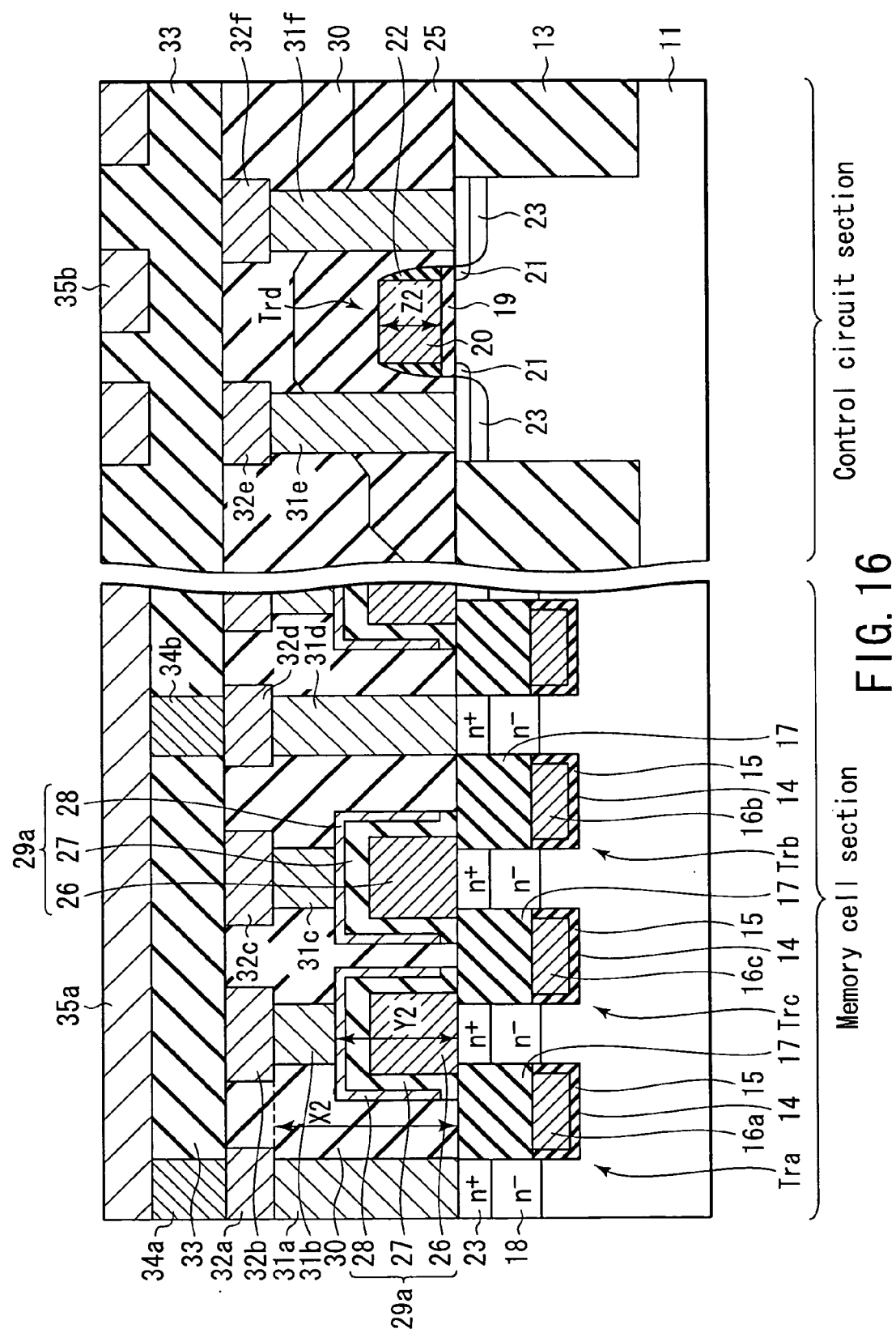
FIG. 16 is a sectional view showing the ferroelectric memory device according to a sixth embodiment of the present invention.

FIG. 16 shows a sectional view of the ferroelectric memory device according to the sixth embodiment of the present invention. The sixth embodiment is different from the fifth embodiment in that the ferroelectric capacitors 29a, 29b have a three-dimensional capacitor structure. That is, the ferroelectric film 27 is formed on the upper and side surfaces of the lower electrode 26, and the upper electrode 28 is formed on the upper and side surfaces of the ferroelectric film 27, so that the ferroelectric film 27 and upper electrode 28 extend in XYZ directions.

In this structure, the depth to the substrate 11 from the first wiring layers 32a, 32b, 32c, 32d in the memory cell section can be reduced. Therefore, assuming that the height (film thickness of the interlayer insulating film under the first wiring layer) of the contact 31a or 31d connecting the substrate 11 to the first wiring layer 32a or 32d is X2, the film thickness of the three-dimensional capacitor 29a or 29b is Y2, and the height of the gate electrode 20 in the control circuit is Z2, the relationships of the following equations (3), (4) are established.

$$X2 \leq 1.6 Y2 \quad (3)$$

$$X2 \leq 9 Z2 \quad (4)$$

FIGS. 17 to 22 show sectional views of the manufacturing steps of the ferroelectric memory device according to the sixth embodiment of the present invention. The method of manufacturing the ferroelectric memory device according to the sixth embodiment will hereinafter be described.

First, as shown in FIGS. 6 to 11, the interlayer films 24, 25 are removed only from the memory cell section in the same manner as in the fifth embodiment. Thereafter, the gate oxide film 19 in the position where the capacitor is mounted is removed. It is to be noted that the gate oxide film 19 does not have to be necessarily partially removed, and all of the memory cell section may also be removed.

Figure 17:
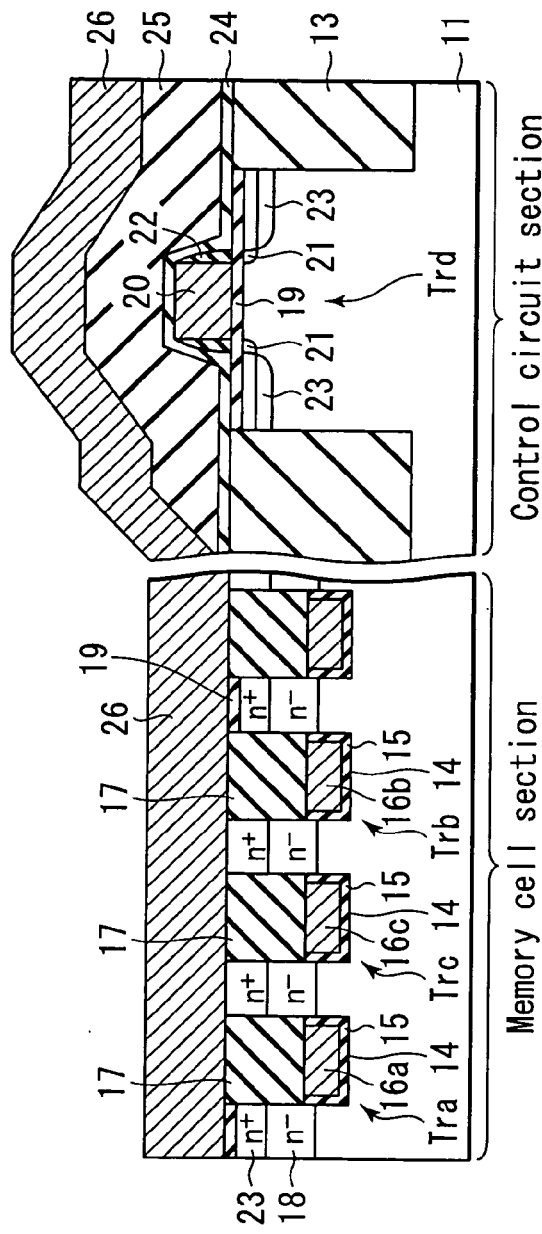
FIGS. 17 to 22 are sectional views showing the respective manufacturing steps of the ferroelectric memory device according to the sixth embodiment of the present invention.

Next, as shown in FIG. 17, the lower electrode 26 is formed in the memory cell section and control circuit section. Here, the examples of the material of the lower electrode 26 include Ir, $IrO_2$, the stacked film of Ir and Pt, and the stacked film of $IrO_2$ and Pt. It is to be noted that the oxygen barrier film formed of TiN or TiAlN may also be disposed under the lower electrode 26.

Figure 18:
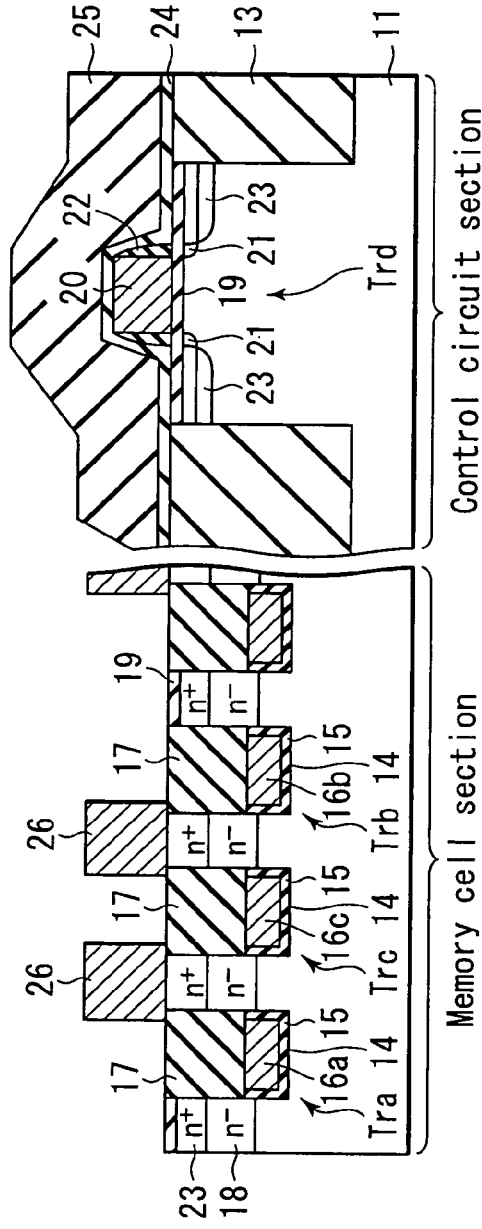

Next, as shown in FIG. 18, the mask material (not shown), for example, of the oxide film, TiN film, TiAlN film, or the like is formed and patterned on the lower electrode 26. The patterned mask material is used to process the lower electrode 26 by RIE. Accordingly, the lower electrode 26 thicker than usual is formed in the memory cell section. Thereafter, the mask material is removed. It is to be noted that when the oxygen barrier film is disposed under the lower electrode 26, the etching of the lower electrode 26 is once stopped on the upper surface of the barrier film, and thereafter the oxygen barrier film is preferably etched by RIE.

Figure 19:
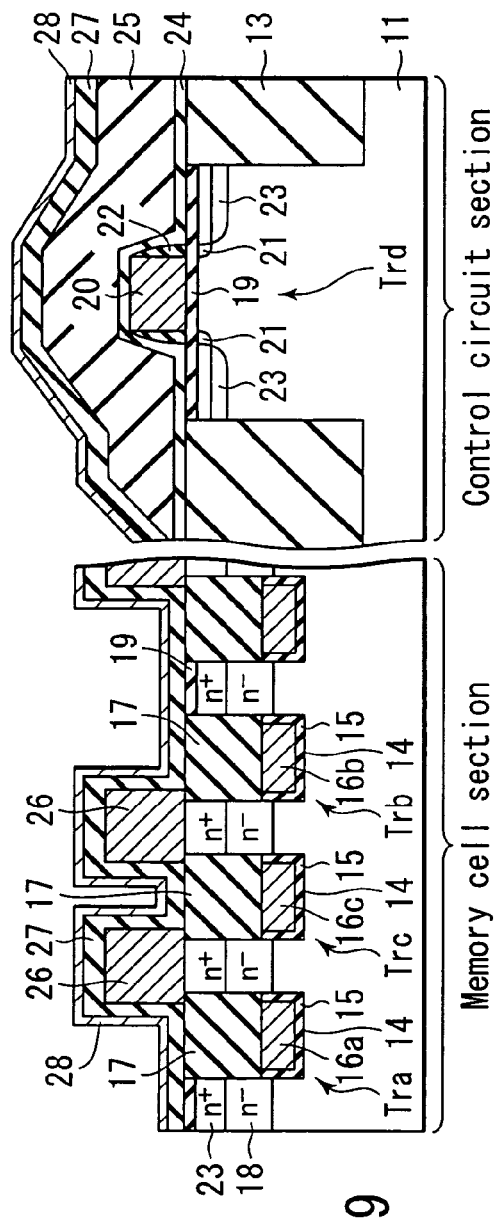

Next, as shown in FIG. 19, the diffusion barrier film, ferroelectric film 27, and upper electrode 28 are deposited in order. Here, examples of the diffusion barrier film include TiAlN, Ir, $IrO_2$, SrRuO, and the like. Examples of the ferroelectric film 27 include PZT, SBT, or BLT film. Examples of the upper electrode 28 include Pt, $IrO_2$, SrRuO, and a stacked film of Pt, $IrO_2$, and SrRuO. It is to be noted that the diffusion barrier film is not essential. However, especially when the ferroelectric film 27 is formed of PZT, the diffusion barrier film is preferably disposed in order to prevent Pb of the ferroelectric film 27 from being diffused in the lower electrode 26.

Figure 20:
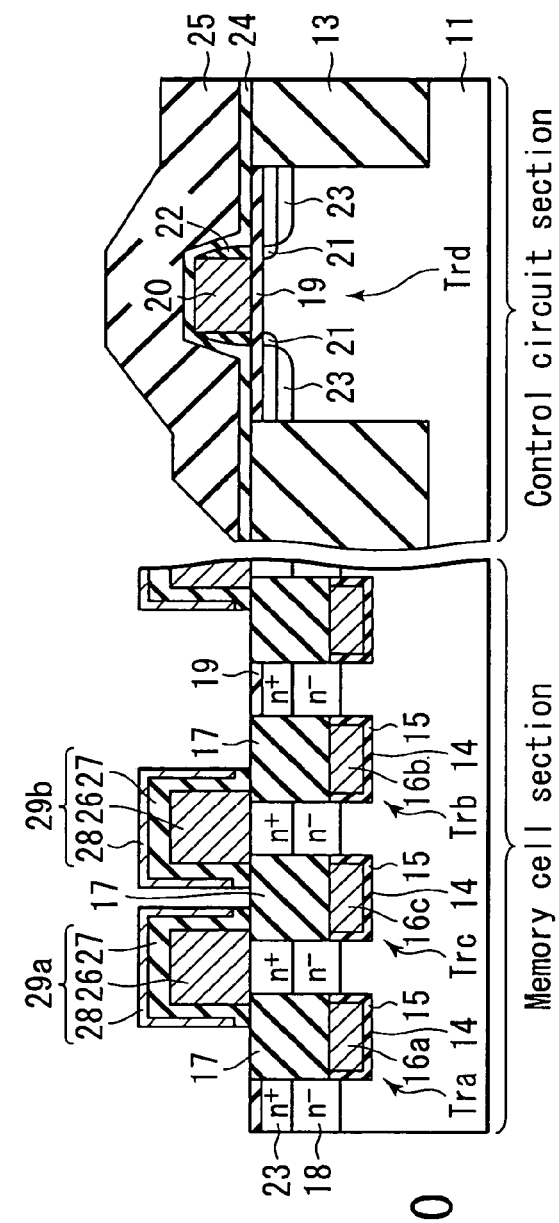

Next, as shown in FIG. 20, the mask material (not shown) formed, for example, of the oxide film, TiN film, TiAlN film, or the like is formed and patterned on the upper electrode 28. The patterned mask material is used to process the diffusion barrier film (not shown), ferroelectric film 27, and upper electrode 28 by RIE. Accordingly, the three-dimensional ferroelectric capacitors 29a, 29b are formed in the memory cell section. Thereafter, the mask material is removed.

Figure 21:
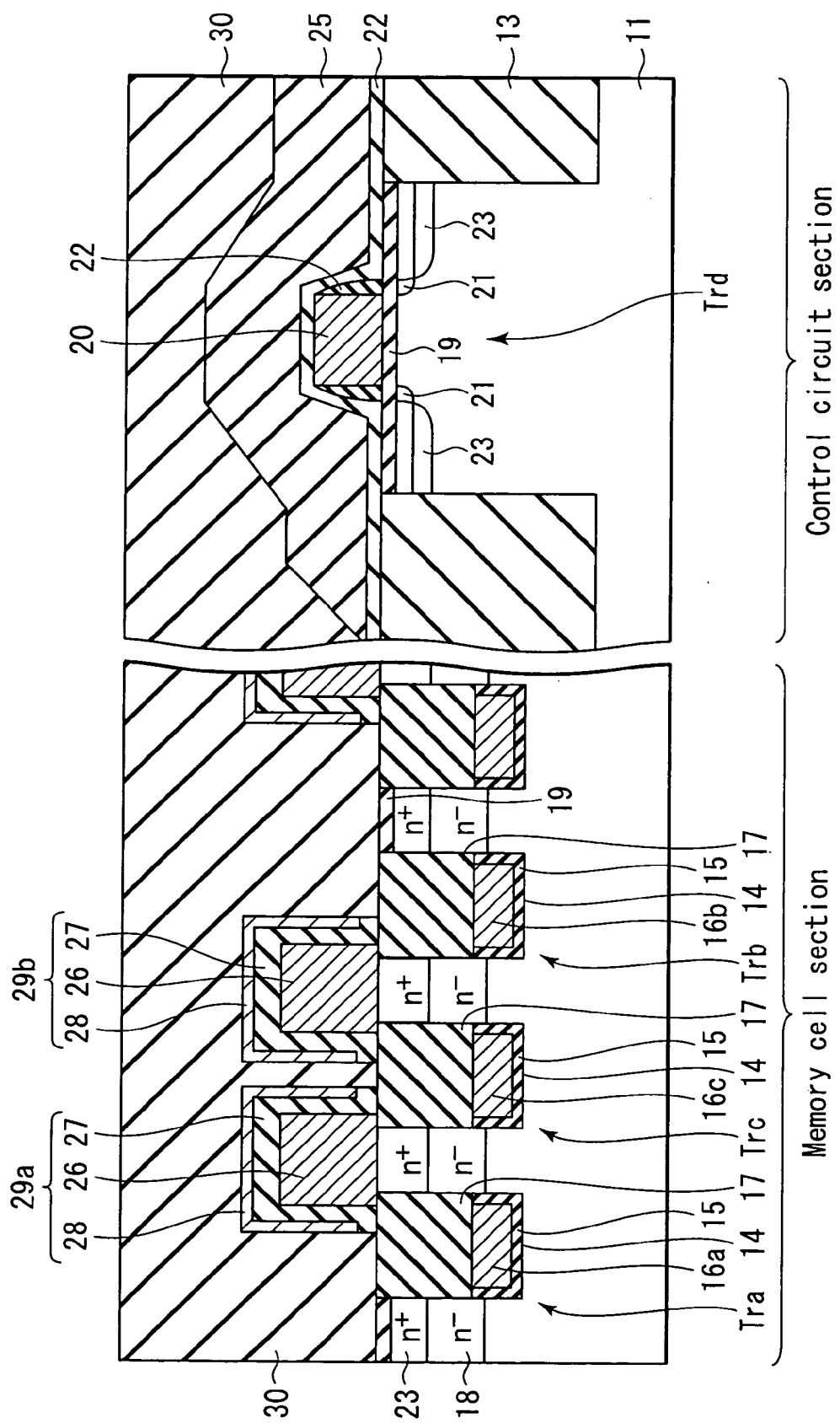

Next, as shown in FIG. 21, the interlayer insulating film 30, for example, of TEOS or SOG is deposited, and the interlayer insulating film 30 is flattened by CMP.

Figure 22:
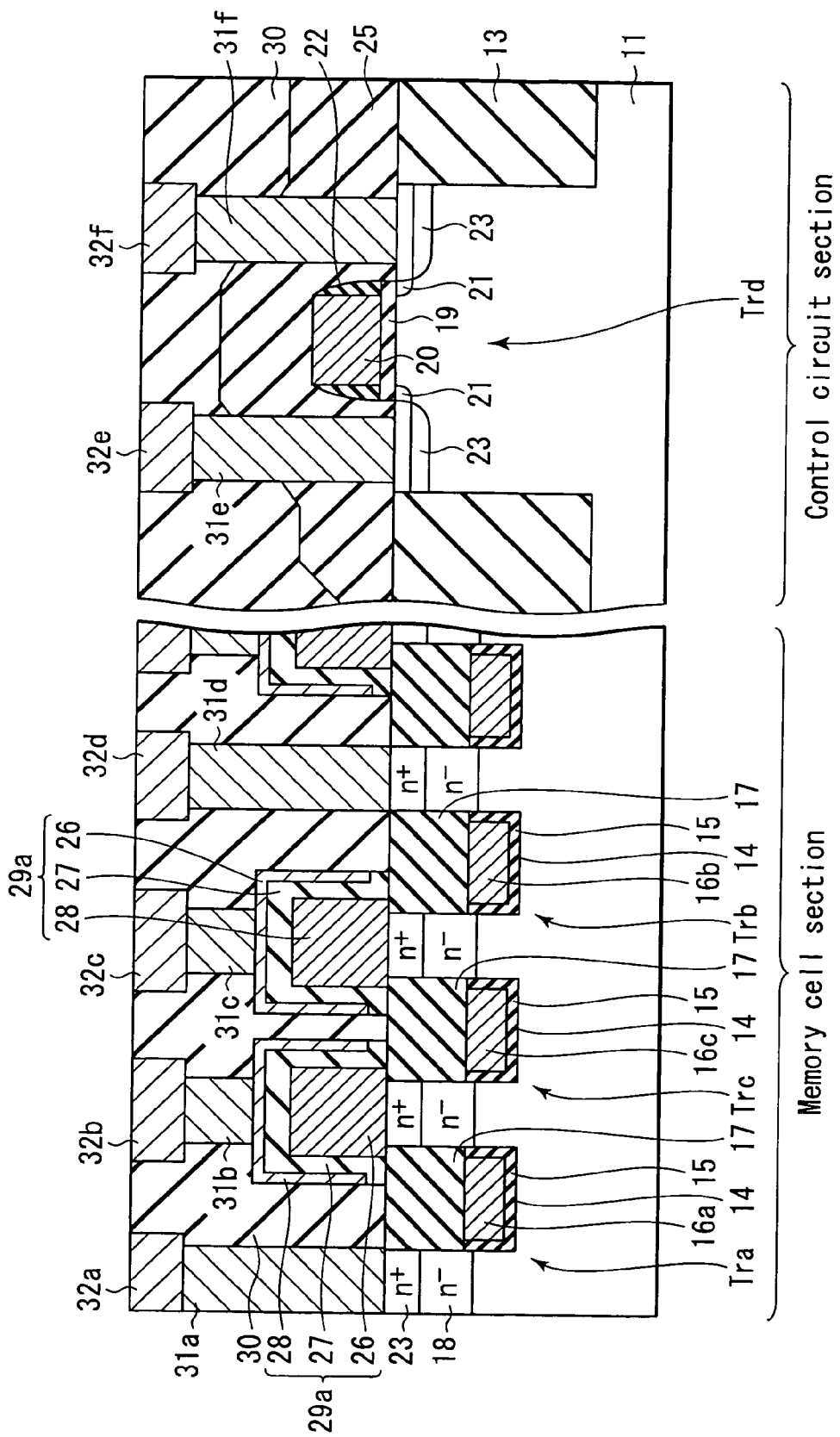

Next, as shown in FIG. 22, the contacts 31b, 31c connected to the upper electrode 28 are formed, the contacts 31a, 31d, 31e, 31f connected to the diffusion layer 23 are formed, and the first wiring layers 32a, 32b, 32c, 32d, 32e, 32f connected to the contacts 31a, 31b, 31c, 31d, 31e, 31f are formed.

Next, as shown in FIG. 16, the interlayer insulating film 33 is formed on the interlayer insulating film 30. Next, the contacts 34a, 34b and the second wiring layers 35a, 35b are formed in the interlayer insulating film 33.

According to the sixth embodiment, an effect similar to that of the fifth embodiment can be obtained. Furthermore, it is also possible to obtain the effect that the capacitor capacitance can be increased by the use of the three-dimensional capacitor.

[Seventh Embodiment]

A seventh embodiment is a modification of a configuration of the three-dimensional capacitor in the sixth embodiment.

Figure 23:
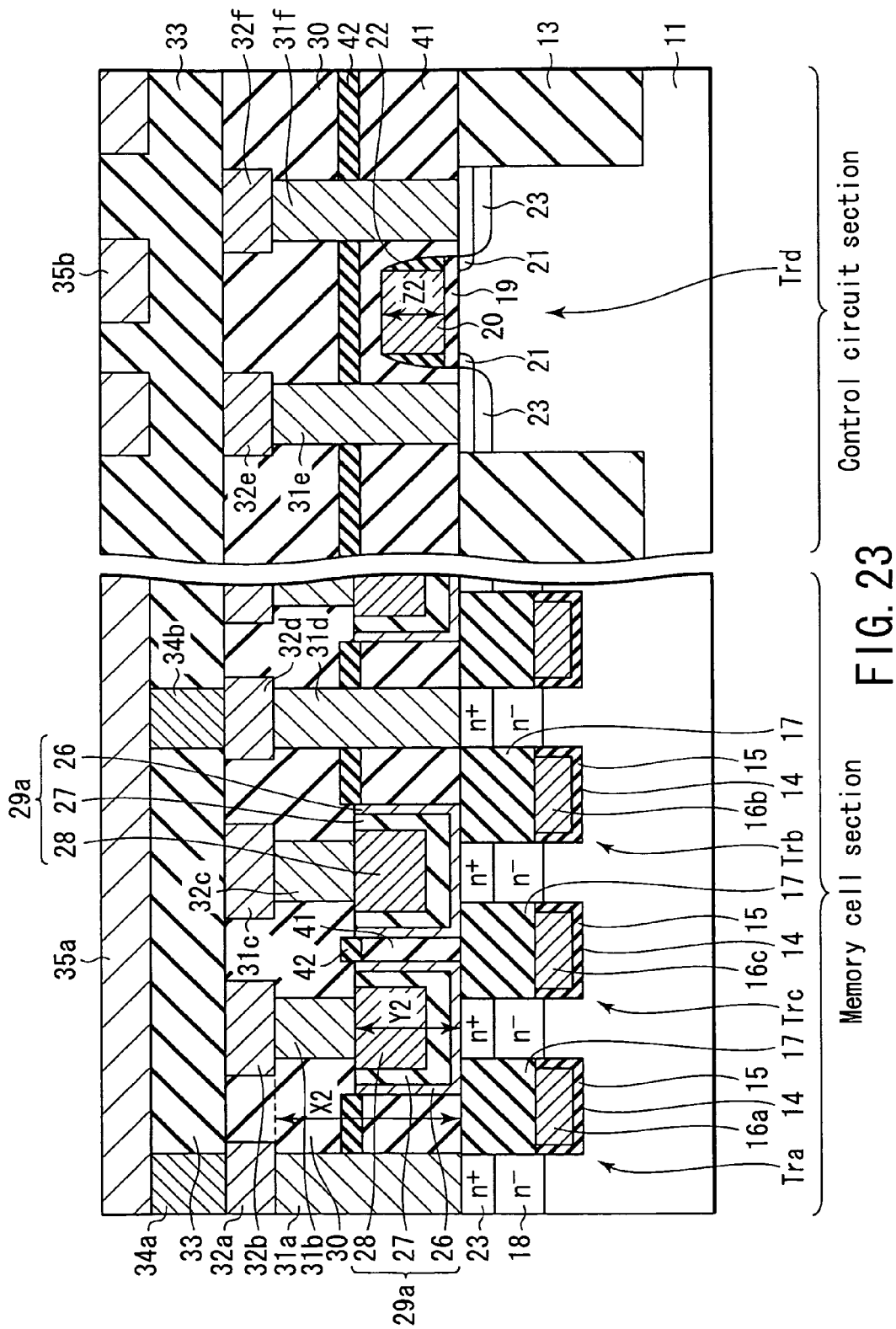
FIG. 23 is a sectional view showing the ferroelectric memory device according to a seventh embodiment of the present invention.

FIG. 23 shows a sectional view of the ferroelectric memory device according to the seventh embodiment of the present invention. As shown in FIG. 23, the seventh embodiment is different from the sixth embodiment in the shapes of the three-dimensional capacitors 29a, 29b. That is, the ferroelectric film 27 and upper electrode 28 extend in the XYZ directions in the sixth embodiment, whereas the lower electrode 26 and ferroelectric film 27 extend in the XYZ directions in the seventh embodiment.

It is to be noted that even the seventh embodiment provides a structure which satisfies the relationships of the above equations (3), (4) in the same manner as in the sixth embodiment.

FIGS. 24 to 33 show sectional views showing the manufacturing steps by a first manufacturing method of the seventh embodiment of the present invention. The first manufacturing method of the ferroelectric memory device according to the seventh embodiment will hereinafter be described.

First, as shown in FIGS. 6 to 8, after the buried gate electrode 14 is formed in the memory cell section, the gate electrode 20 is formed in the control circuit section in the same manner as in the fifth embodiment.

Figure 24:
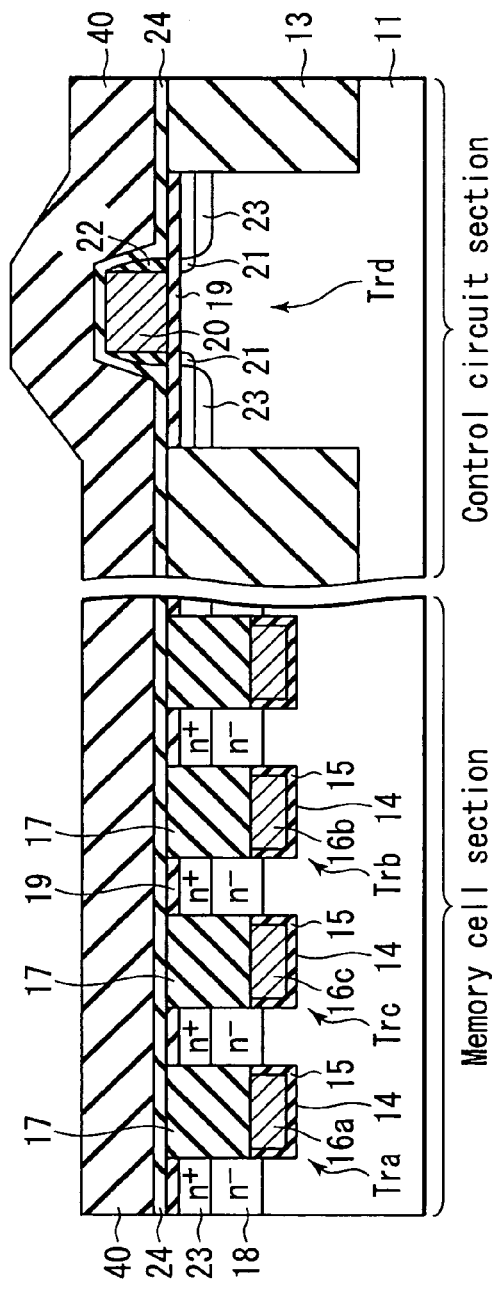
FIGS. 24 to 33 are sectional views showing the respective manufacturing steps by a first manufacturing method according to a seventh embodiment of the present invention.

Next, as shown in FIG. 24, after the n⁻ type low-concentration diffusion layer 21 is formed on the surface of the semiconductor substrate 11 in the control circuit section, the gate spacers 22 are formed on the side surfaces of the gate electrode 20. Next, the n⁺ type high-concentration diffusion layer 23 is formed both in the control circuit section and the memory cell section. Accordingly, the transistors Tra, Trb, Trc, Trd are formed. Next, the interlayer film 24 formed, for example, of the SiN film, alumina, or titania is formed in the memory cell section and control circuit section, and an insulating film 40 of BPSG, TEOS, SOG, or the like is formed on the interlayer film 24.

Figure 25:
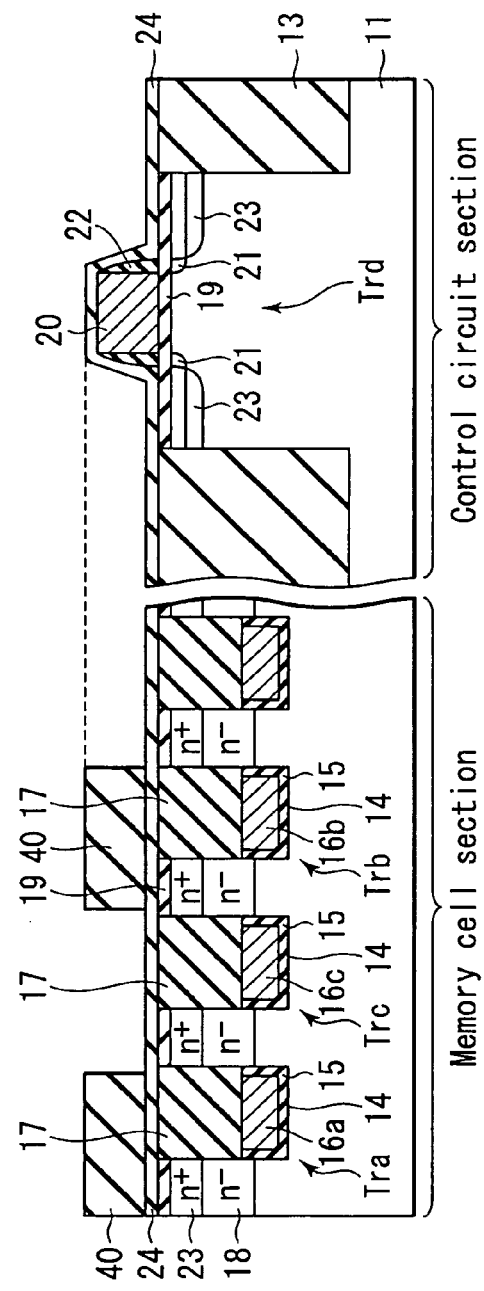

Next, as shown in FIG. 25, the insulating film 40 is patterned, and a dummy pattern of the insulating film 40 is formed with a predetermined density in the memory cell section. Here, a deposited film thickness of the insulating film 40 is preferably adjusted in order to set the height of the dummy pattern of the memory cell section to be substantially equal to the height (strictly the height of the upper surface of the interlayer film 24) of the gate electrode 20 of the control circuit section. It is to be noted that the dummy pattern does not have to be necessarily disposed, but is preferably disposed in order to prevent dishing of the memory cell section at the time of the subsequent CMP. Additionally, the dummy pattern is omitted from the drawings of the following steps.

Figure 26:
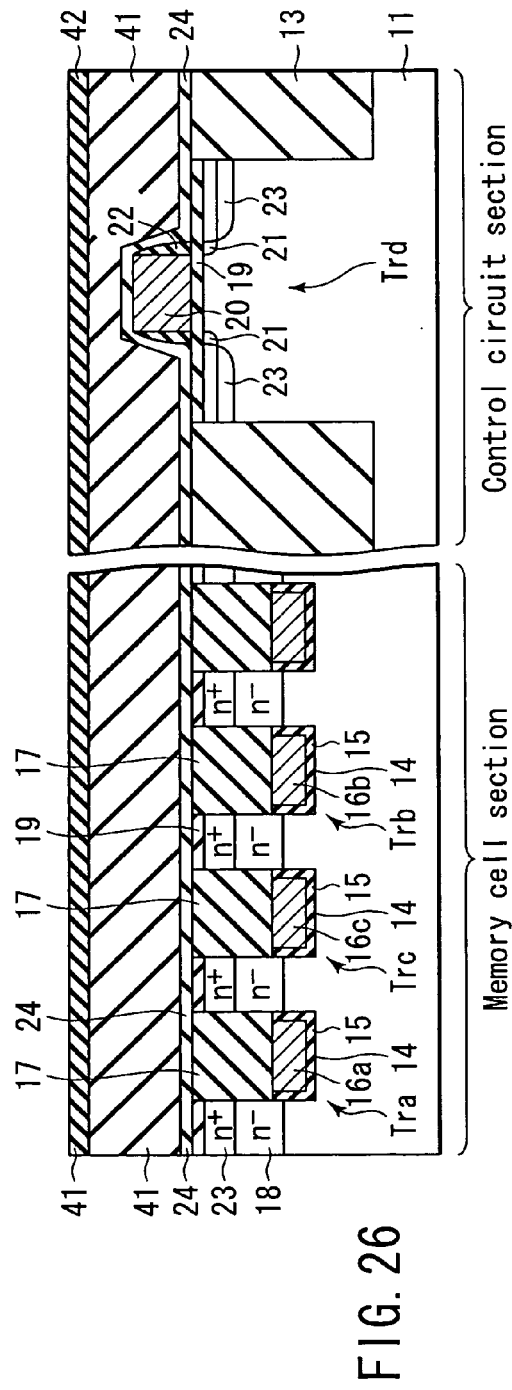

Next, as shown in FIG. 26, an interlayer film 41, for example, of BPSG, TEOS, SOG, or the like is formed on the interlayer film 24, and a diffusion preventive film 42, for example, of alumina is formed on the interlayer film 41. This diffusion preventive film 42 prevents impurities of PZT or SBT constituting the ferroelectric film 27 from being diffused in the substrate 11 from the ferroelectric film 27. Especially, Pb in PZT is prevented from being diffused.

Figure 27:
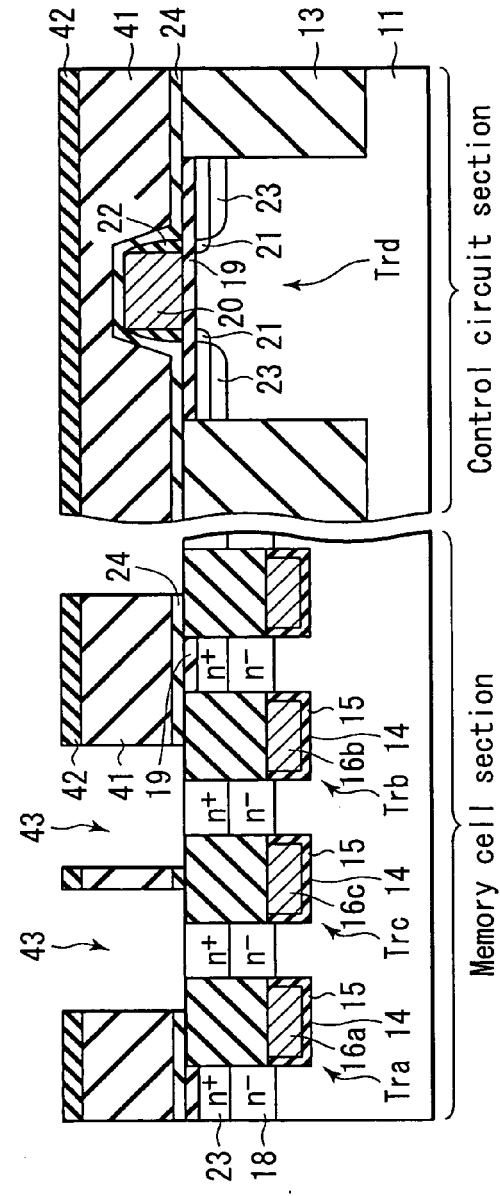

Next, as shown in FIG. 27, the interlayer films 24, 41, and diffusion preventive film 42 are selectively removed by the RIE to form capacitor trenches 43. In this case, after once stopping the etching in the upper surface of the interlayer film 24, the interlayer film 24 is preferably etched. Next, the gate oxide film 19 in the position where the capacitor is mounted is removed.

Figure 28:
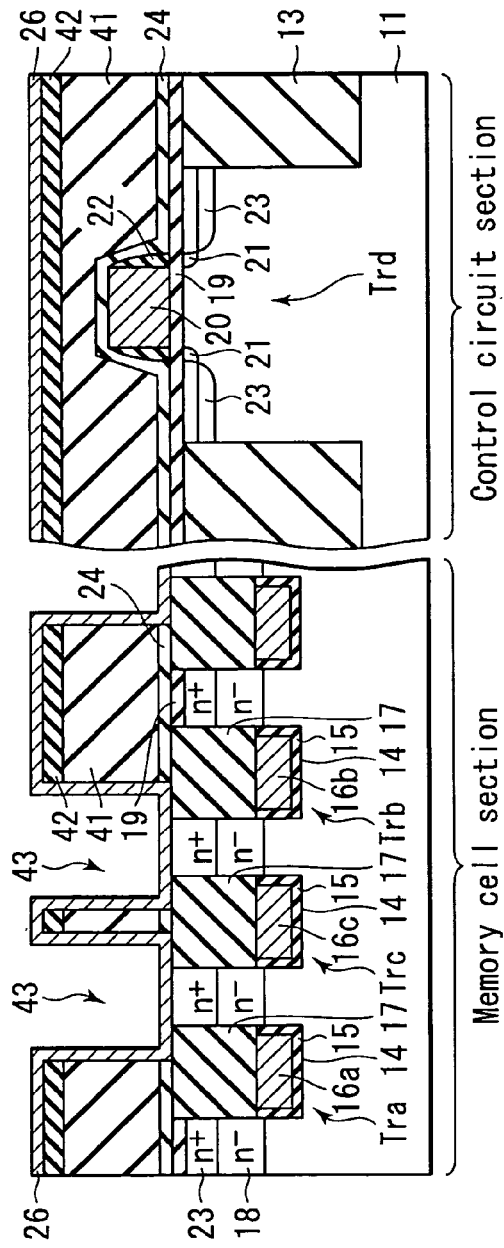

Next, as shown in FIG. 28, the lower electrode 26 is formed in the capacitor trenches 43 and on the diffusion preventive film 42. Examples of the lower electrode 26 include Ir, IrO₂, a stacked film of Ir and Pt, a stacked film of IrO₂ and Pt, and the like. It is to be noted that the oxygen barrier film of TiN, TiAlN, or the like is preferably disposed under the lower electrode 26.

Figure 29:
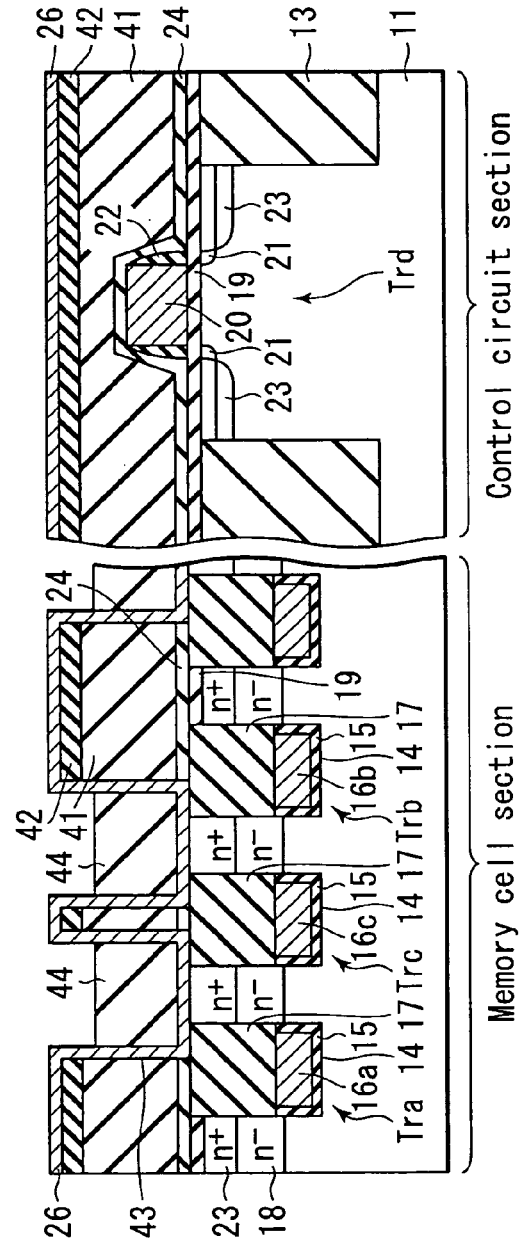

Next, as shown in FIG. 29, fill-in materials 44 are formed on the lower electrode 26. Examples of the fill-in materials 44 include resist, SOG, SOG doped with phosphor (P) or boron (B), TEOS, TEOS doped with phosphor (P) or boron (B), and the like. Next, the fill-in materials 44 are flattened by CMP until the lower electrode 26 on the diffusion preventive film 42 is exposed. Here, when the fill-in materials 44 are formed of SOG or the resist, the step of CMP may be omitted. Next, the upper parts of the fill-in materials 44 in the capacitor trenches 43 are removed by RIE.

Figure 30:
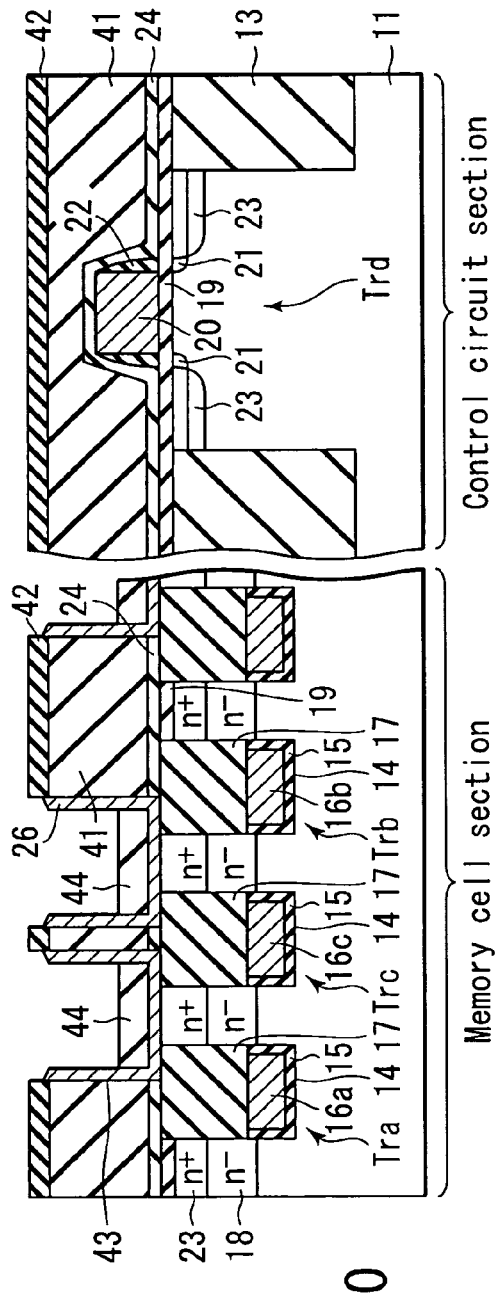

Next, the lower electrode 26 is etched back as shown in FIG. 30. Accordingly, the lower electrode 26 is divided for each capacitor trench 43 (each cell) in the memory cell section, and all the lower electrodes 26 are removed in the control circuit section. In this case, the etching-back is preferably controlled so that the diffusion preventive film 42 remains. Since the fill-in materials 44 exist on the lower electrodes 26 in the capacitor trenches 43, only the upper parts of the fill-in materials 44 are removed, and the lower electrodes 26 in the capacitor trenches 43 can be prevented from being removed.

Figure 31:
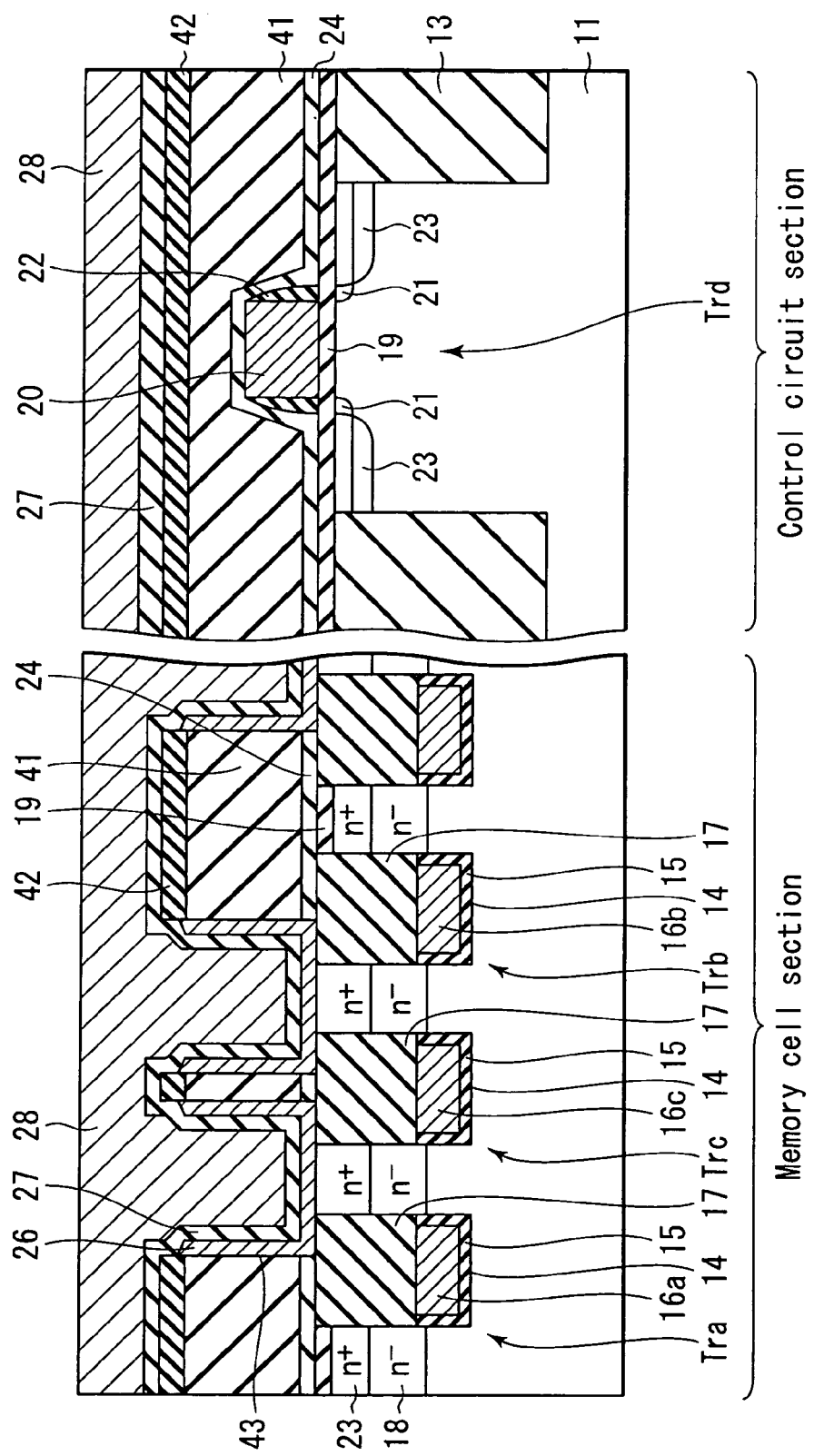

Next, as shown in FIG. 31, for example, an MOCVD process is used to deposit the ferroelectric film 27 and upper electrode 28 in order. Examples of the ferroelectric film 27 include PZT, SBT, and BLT films. Examples of the upper electrode 28 include Pt, IrO₂, SrRuO, and a stacked film of Pt, IrO₂, and SrRuO.

Figure 32:
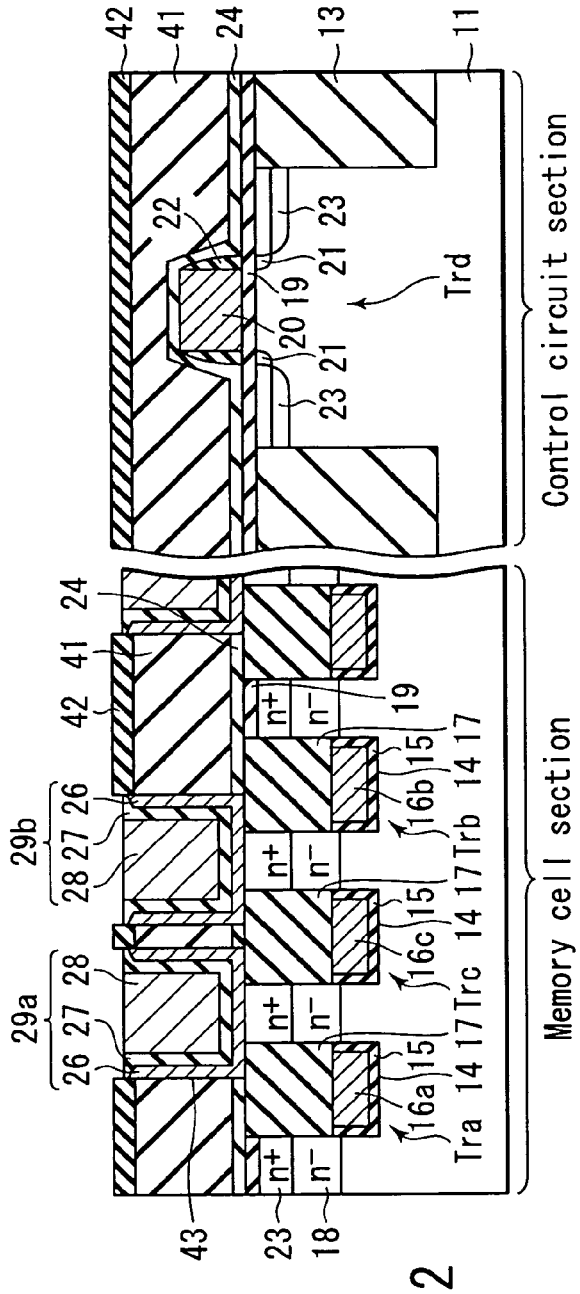

Next, as shown in FIG. 32, the upper electrode 28 is etched back and removed until the ferroelectric film 27 is exposed. Thereafter, the ferroelectric film 27 is etched back and removed until the diffusion preventive film 42 is exposed. Accordingly, the ferroelectric capacitors 29a, 29b are formed in the capacitor trenches 43.

Figure 33:
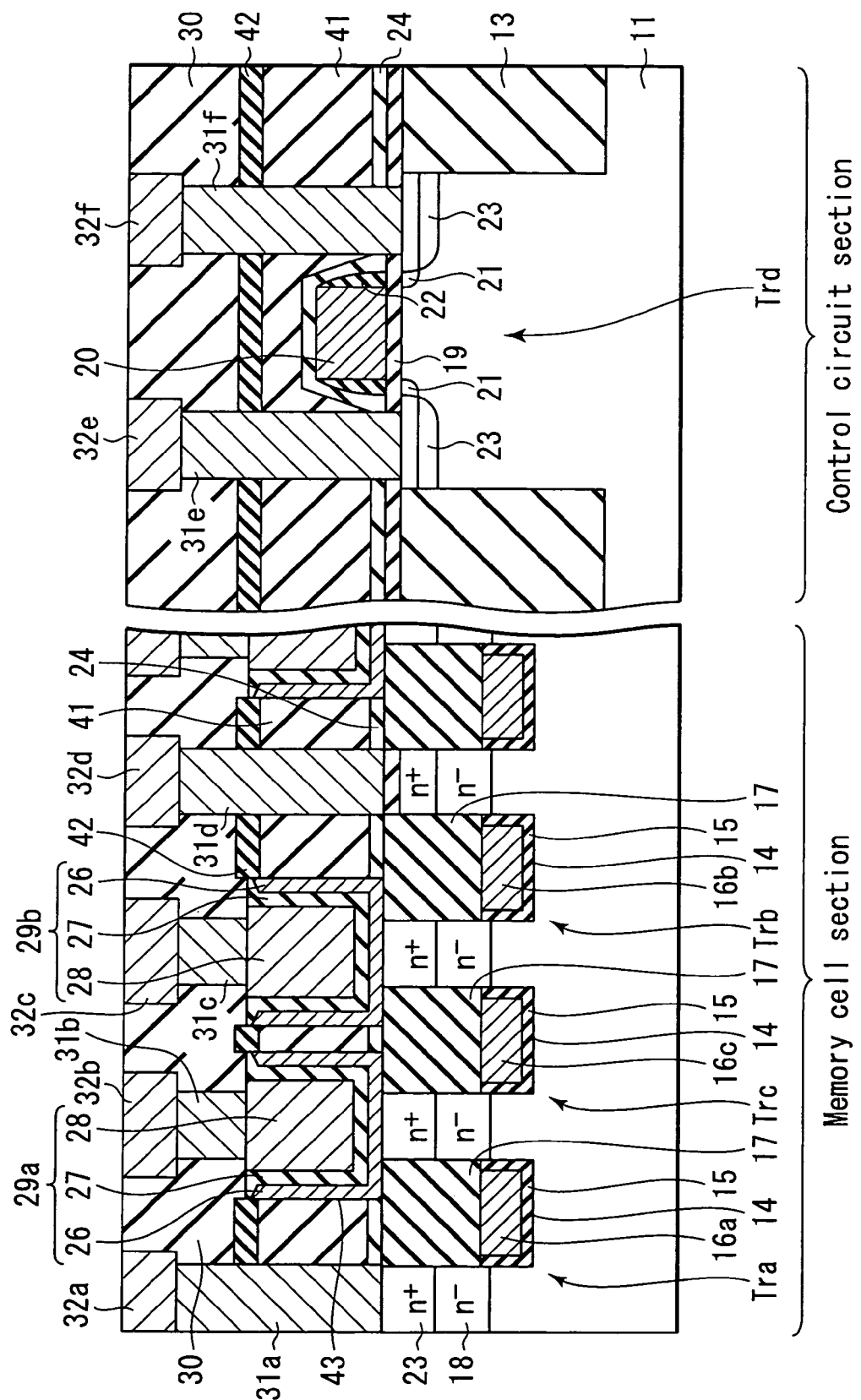

Next, as shown in FIG. 33, the interlayer insulating film 30, for example, of TEOS or SOG is deposited, and this interlayer insulating film 30 is flattened by CMP. Next, the contacts 31b, 31c connected to the upper electrode 28 are formed, the contacts 31a, 31d, 31e, 31f connected to the diffusion layer 23 are formed, and the first wiring layers 32a, 32b, 32c, 32d, 32e, 32f connected to the contacts 31a, 31b, 31c, 31d, 31e, 31f are formed.

Next, as shown in FIG. 23, the interlayer insulating film 33 is formed on the interlayer insulating film 30. Next, the contacts 34a, 34d and the second wiring layers 35a, 35b are formed in the interlayer insulating film 33.

FIGS. 34 to 38 show sectional views of the manufacturing steps by a second manufacturing method of the seventh embodiment of the present invention. The second manufacturing method of the ferroelectric memory device according to the seventh embodiment will hereinafter be described.

Figure 34:
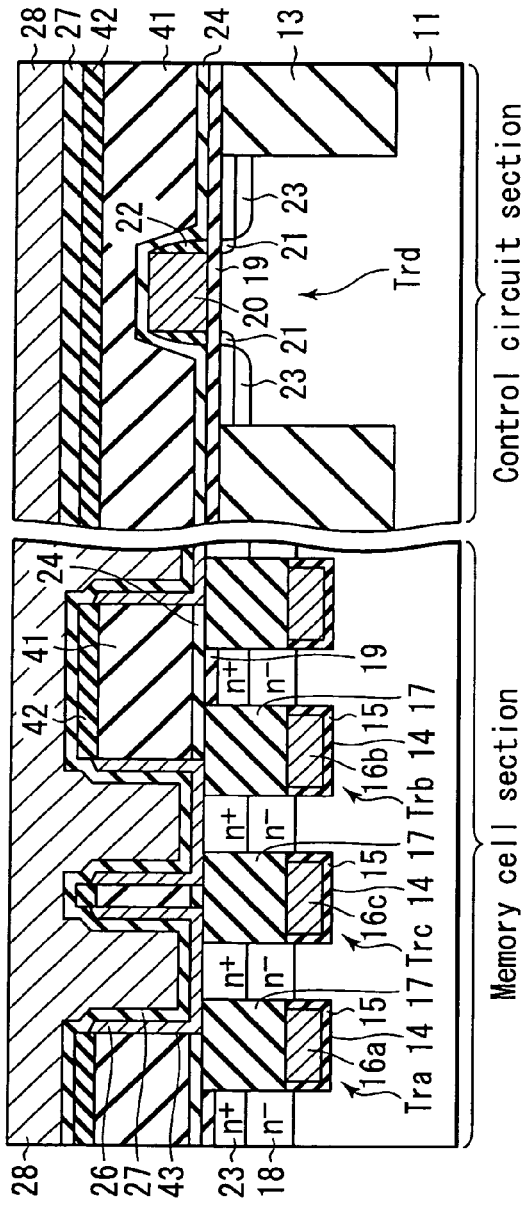
FIGS. 34 to 38 are sectional views showing the respective manufacturing steps by a second manufacturing method according to the seventh embodiment of the present invention.

First, after the steps of FIGS. 6 to 8, 24 to 30, as shown in FIG. 34, for example, the MOCVD process is used to deposit the ferroelectric film 27 and upper electrode 28 in order. Examples of the ferroelectric film 27 include the PZT, SBT, and BLT films. Examples of the upper electrode 28 include Pt, IrO₂, SrRuO, and a stacked film of Pt, IrO₂, and SrRuO.

Figure 35:
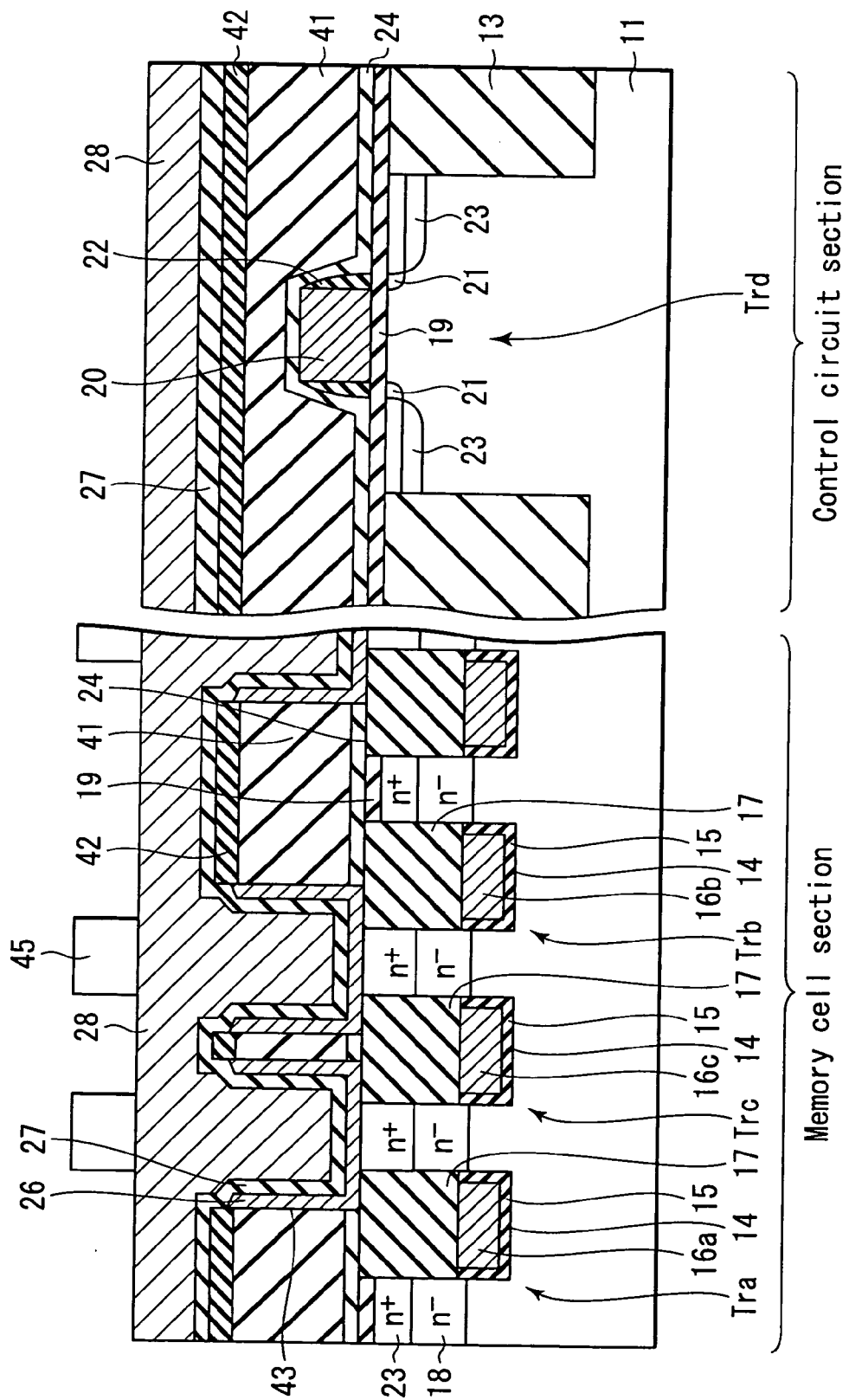

Next, as shown in FIG. 35, a mask material 45, for example, of the oxide film, TiN film, TiAlN film, or the like is formed and patterned on the upper electrode 28.

Figure 36:
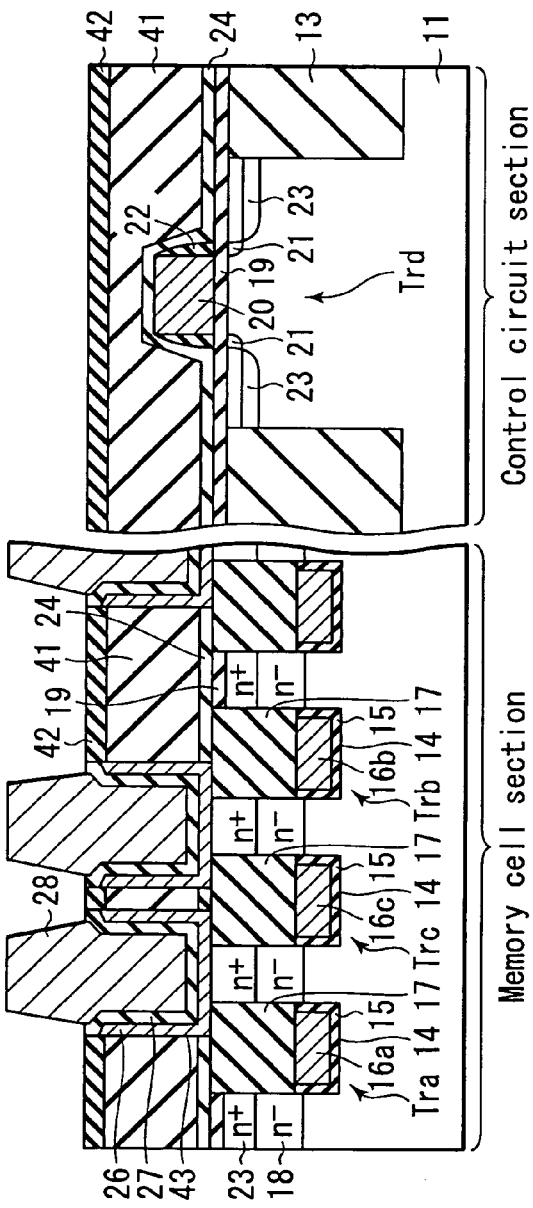

Next, as shown in FIG. 36, the upper electrode 28 and ferroelectric film 27 are etched by RIE, and the upper electrode 28 and ferroelectric film 27 are divided for each of the capacitor trenches 43. In this case, the mask material 45 is used to perform the etching so that the upper electrode 28 is securely left. Moreover, preferable conditions at the time of the etching are that the mask material 45 is eliminated, and the height of the upper electrode 28 is reduced.

It is to be noted that it is possible to carry out the step of FIG. 34 without performing the recess step of the lower electrode 26. In this case, the lower electrode 26 may be removed simultaneously with the upper electrode 28 and ferroelectric film 27 at the time of the step of FIG. 36.

Figure 37:
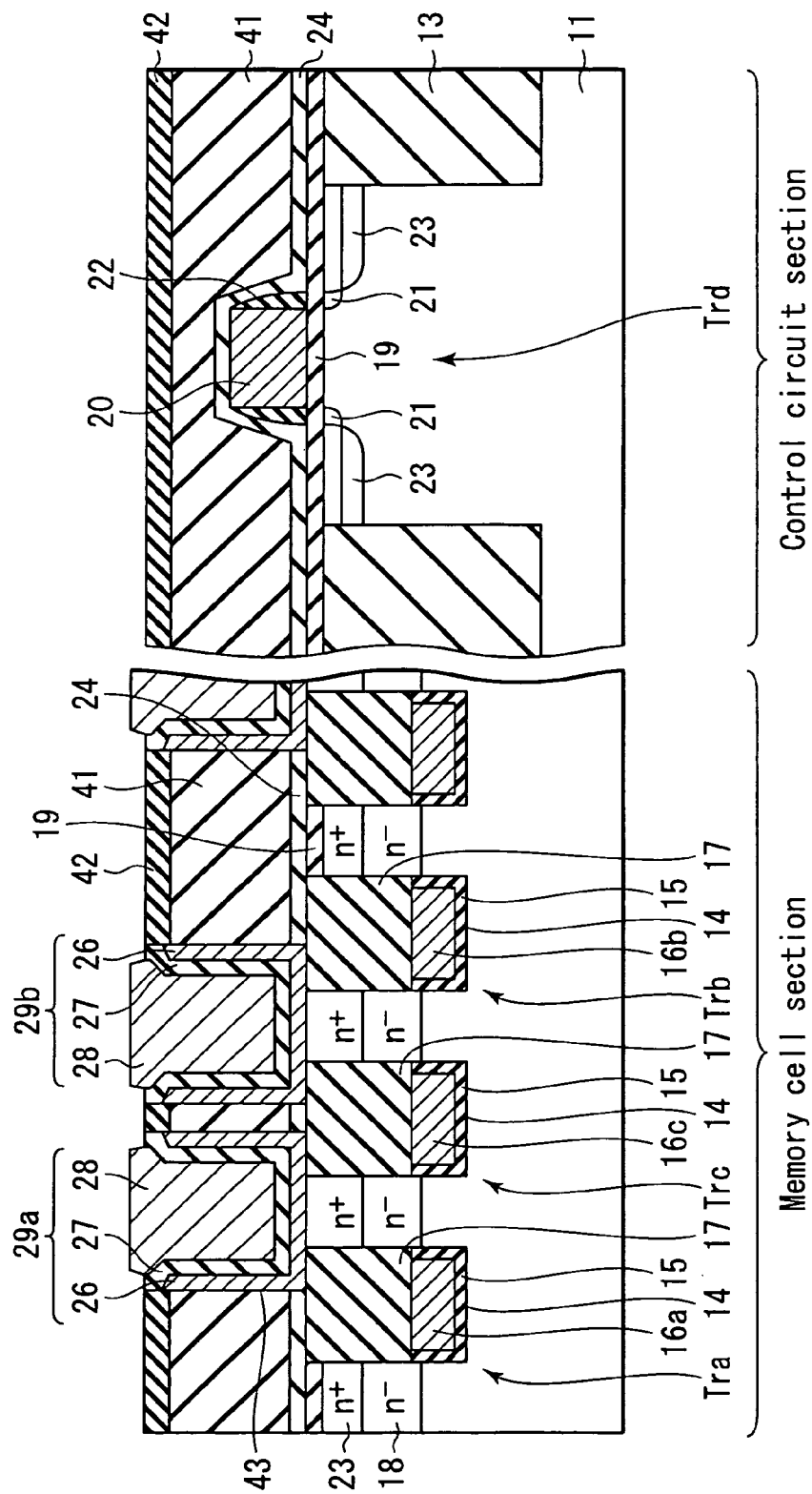

Next, as shown in FIG. 37, the upper part of the upper electrode 28 is removed by RIE. Here, the step by the upper electrode 28 is preferably reduced to about 500 Å. The ferroelectric capacitors 29a, 29b are formed in the capacitor trenches 43 in this manner.

Figure 38:
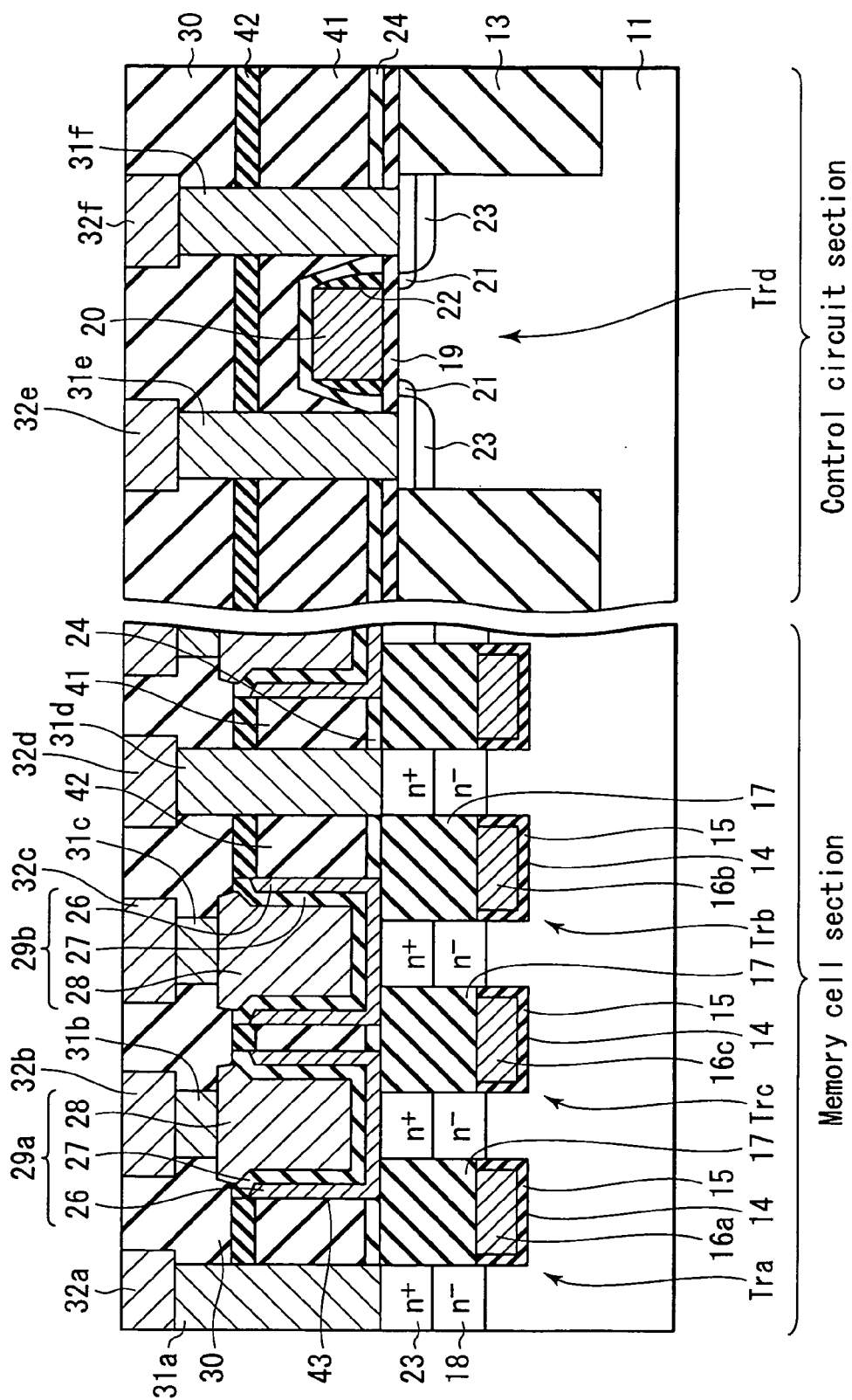

Next, as shown in FIG. 38, the interlayer insulating film 30, for example, of TEOS or SOG is deposited, and the interlayer insulating film 30 is flattened by CMP. Next, the contacts 31b, 31c connected to the upper electrode 28 are formed, the contacts 31a, 31d, 31e, 31f connected to the diffusion layer 23 are formed, and the first wiring layers 32a, 32b, 32c, 32d, 32e, 32f connected to the contacts 31a, 31b, 31c, 31d, 31e, 31f are formed.

Next, as shown in FIG. 23, the interlayer insulating film 33 is formed on the interlayer insulating film 30. Next, the contacts 34a, 34b and the second wiring layers 35a, 35b are formed in the interlayer insulating film 33.

It is to be noted that in the drawings used in the description of the first and second manufacturing methods, the structure of the upper-surface portion of the capacitor 29a or 29b is slightly different from that of the corresponding portion of FIG. 23, but ideally the process is adjusted so as to obtain the structure shown in FIG. 23.

According to the seventh embodiment, an effect similar to that of the fifth embodiment can be obtained. Furthermore, the effect that the capacitor capacitance can be increased is also obtained by the use of the three-dimensional capacitor.

[Eighth Embodiment]

In an eighth embodiment, a connection structure of the bit line to the transistor in the sixth embodiment is modified.

Figure 39:
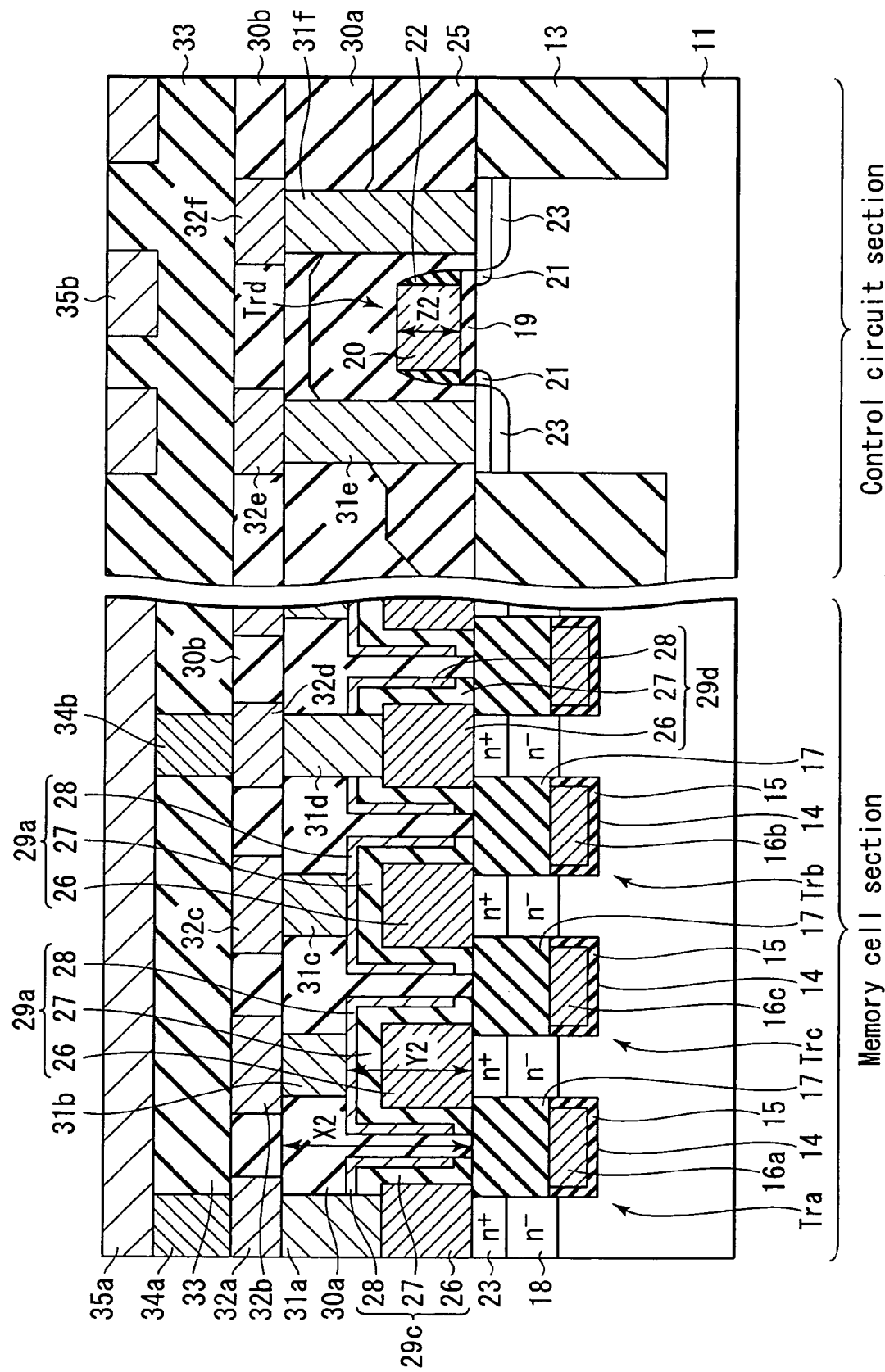
FIG. 39 is a sectional view showing the ferroelectric memory device according to an eighth embodiment of the present invention.

FIG. 39 shows a sectional view of the ferroelectric memory device according to the eighth embodiment of the present invention. As shown in FIG. 39, the eighth embodiment is different from the sixth embodiment of FIG. 16 in that a bit line 35a is connected to the source/drain of the transistors Tra, Trb via the lower electrodes 26 of the capacitors 29c, 29d. Concretely, the following structure is constituted.

The capacitor 29a, and the capacitor 29c for the contact having the same structure as that of the capacitor 29a are disposed on the diffusion layers 23 positioned on the opposite sides of the transistor Tra. Similarly, the capacitor 29b, and the capacitor 29d for the contact having the same structure as that of the capacitor 29b are disposed on the diffusion layers 23 positioned on the opposite sides of the transistor Trb. Moreover, the lower electrodes 26 of the capacitors 29c, 29d for the contacts are connected to the contacts 31a, 31d extending through the upper electrode 28 and ferroelectric film 27. In this manner, the source/drain of the transistors Tra, Trb are connected to the bit line 35a via the lower electrodes 26 of the capacitors 29c, 29d, the contacts 31a, 31d, 34a, 34b, and wirings 32a, 32d.

It is to be noted that the structure satisfies the relationships of the above equations (3), (4) also in the eighth embodiment.

FIGS. 40 to 46 show sectional views of the manufacturing steps of the ferroelectric memory device according to the eighth embodiment of the present invention. The manufacturing method of the ferroelectric memory device according to the eighth embodiment will hereinafter be described.

First, as shown in FIGS. 6 to 11, the interlayer films 24, 25 are removed only in the memory cell section in the same manner as in the fifth embodiment. Thereafter, the gate oxide film 19 in the position where the capacitor is mounted is removed. It is to be noted that the gate oxide film 19 does not have to be necessarily partially removed, and the whole memory cell section may also be removed.

Next, as shown in FIG. 40, the lower electrode 26 is formed in the memory cell section and control circuit section. Here, Examples of the lower electrode 26 include Ir, $IrO_2$, a stacked film of Ir and Pt, a stacked film of $IrO_2$ and Pt, and the like. It is to be noted that the oxygen barrier film, for example, of TiN or TiAlN may be formed under the lower electrode 26.

Next, as shown in FIG. 41, the mask material (not shown), for example, of the oxide film, TiN film, TiAlN film, or the like is formed and patterned on the lower electrode 26. The patterned mask material is used to process the lower electrode 26 by RIE. Accordingly, the lower electrode 26 thicker than usual is formed in the memory cell section. Thereafter, the mask material is removed. It is to be noted that when the oxygen barrier film is disposed under the lower electrode 26, the etching of the lower electrode 26 is once stopped on the upper surface of the barrier film, and thereafter the oxygen barrier film is preferably etched by RIE.

Figure 42:
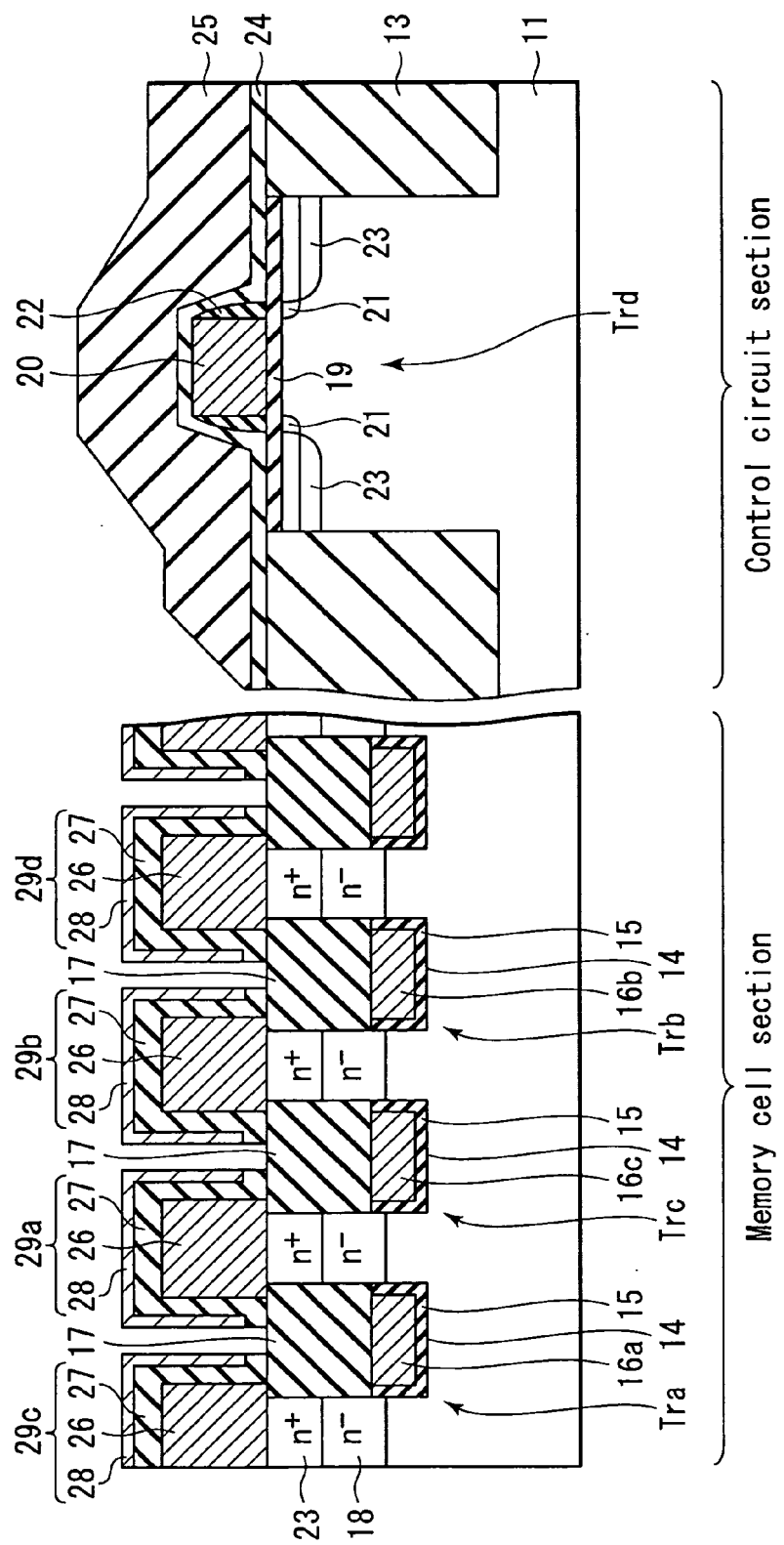

Next, as shown in FIG. 42, the diffusion barrier film (not shown), ferroelectric film 27, and upper electrode 28 are deposited in order. Here, Examples of the diffusion barrier film include TiAlN, Ir, $IrO_2$, SrRuO, and the like. Examples of the ferroelectric film 27 include PZT, SBT, or BLT film. Examples of the upper electrode 28 include Pt, $IrO_2$, SrRuO, and a stacked film of Pt, $IrO_2$, and SrRuO. It is to be noted that the diffusion barrier film is not essential. However, especially when the ferroelectric film 27 is formed of PZT, the diffusion barrier film is preferably disposed in order to prevent Pb of the ferroelectric film 27 from being diffused in the lower electrode 26.

Next, the mask material (not shown), for example, of the oxide film, TiN film, TiAlN film, or the like is formed and patterned on the upper electrode 28. The patterned mask material is used to process the diffusion barrier film (not shown), ferroelectric film 27, and upper electrode 28 by RIE. Accordingly, the three-dimensional ferroelectric capacitors 29a, 29b, 29c, 29d are formed in the memory cell section. Thereafter, the mask material is removed.

Figure 43:
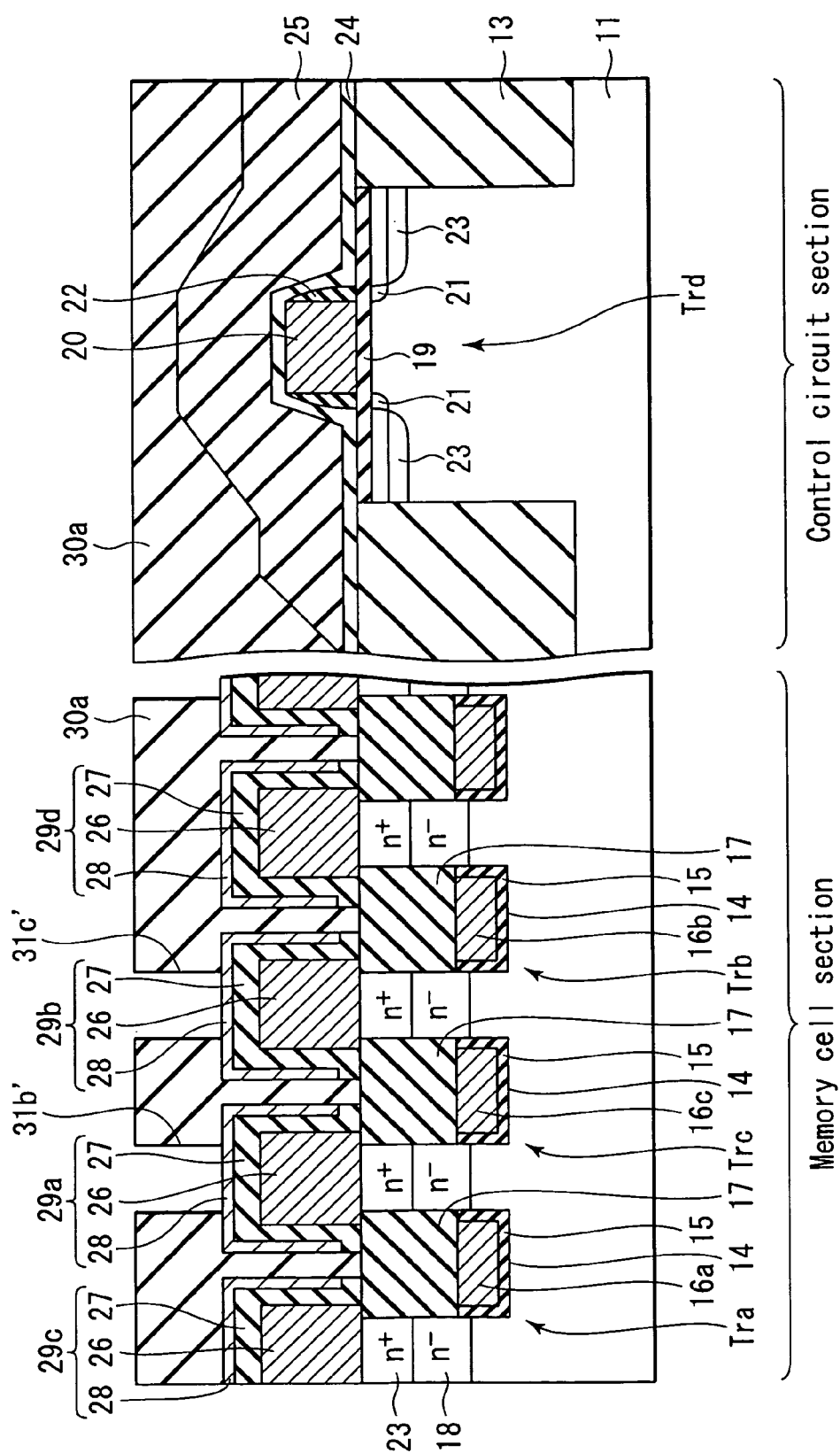

Next, as shown in FIG. 43, an interlayer insulating film 30a, for example, of TEOS or SOG is deposited, and the interlayer insulating film 30a is flattened by CMP. Next, in the memory cell section, contact holes 31b', 31c' for exposing the upper electrode 28 are formed.

Figure 44:
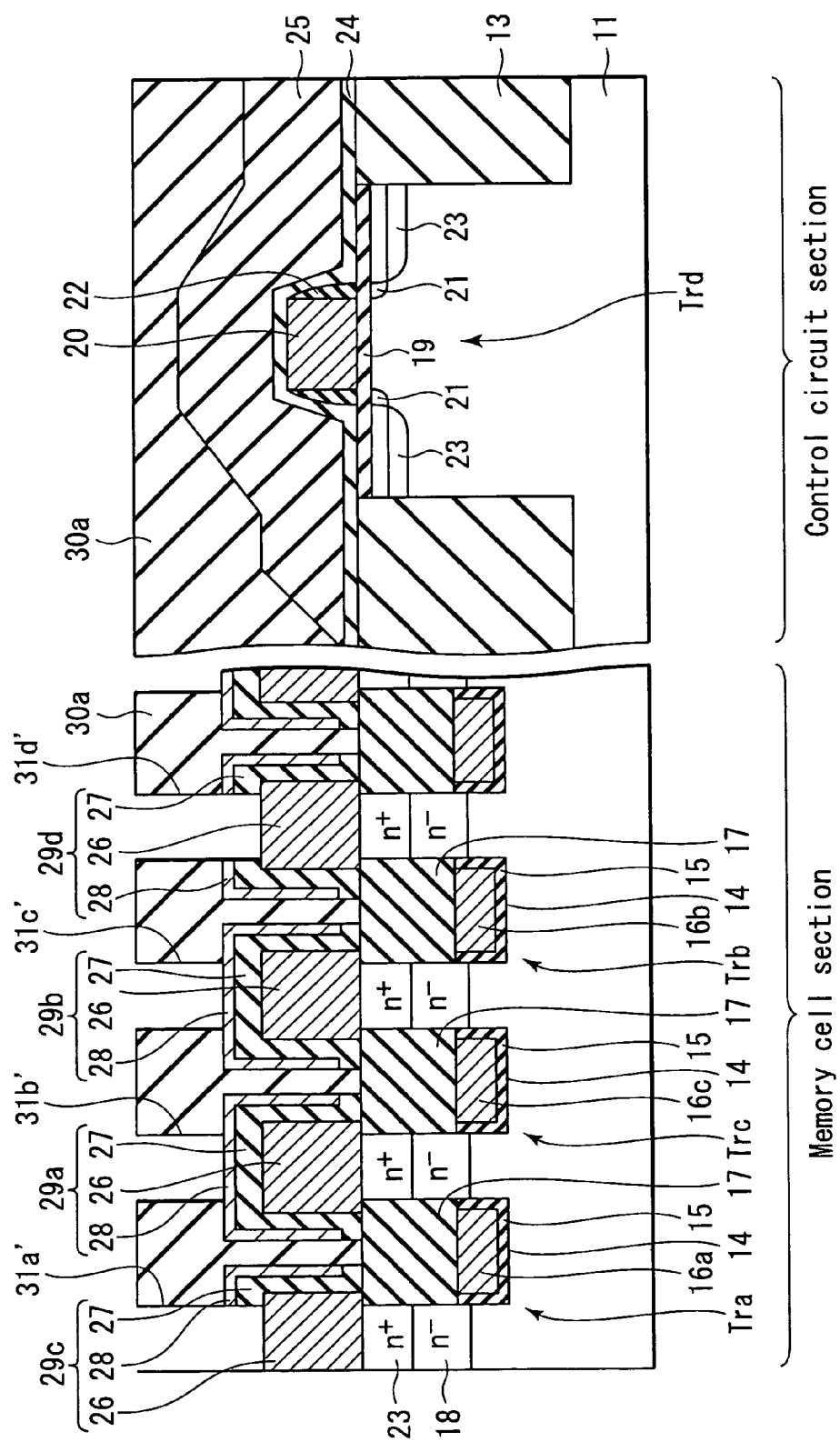

Next, as shown in FIG. 44, contact holes 31a', 31d' for exposing the lower electrode 26 are formed in the memory cell section.

Figure 45:
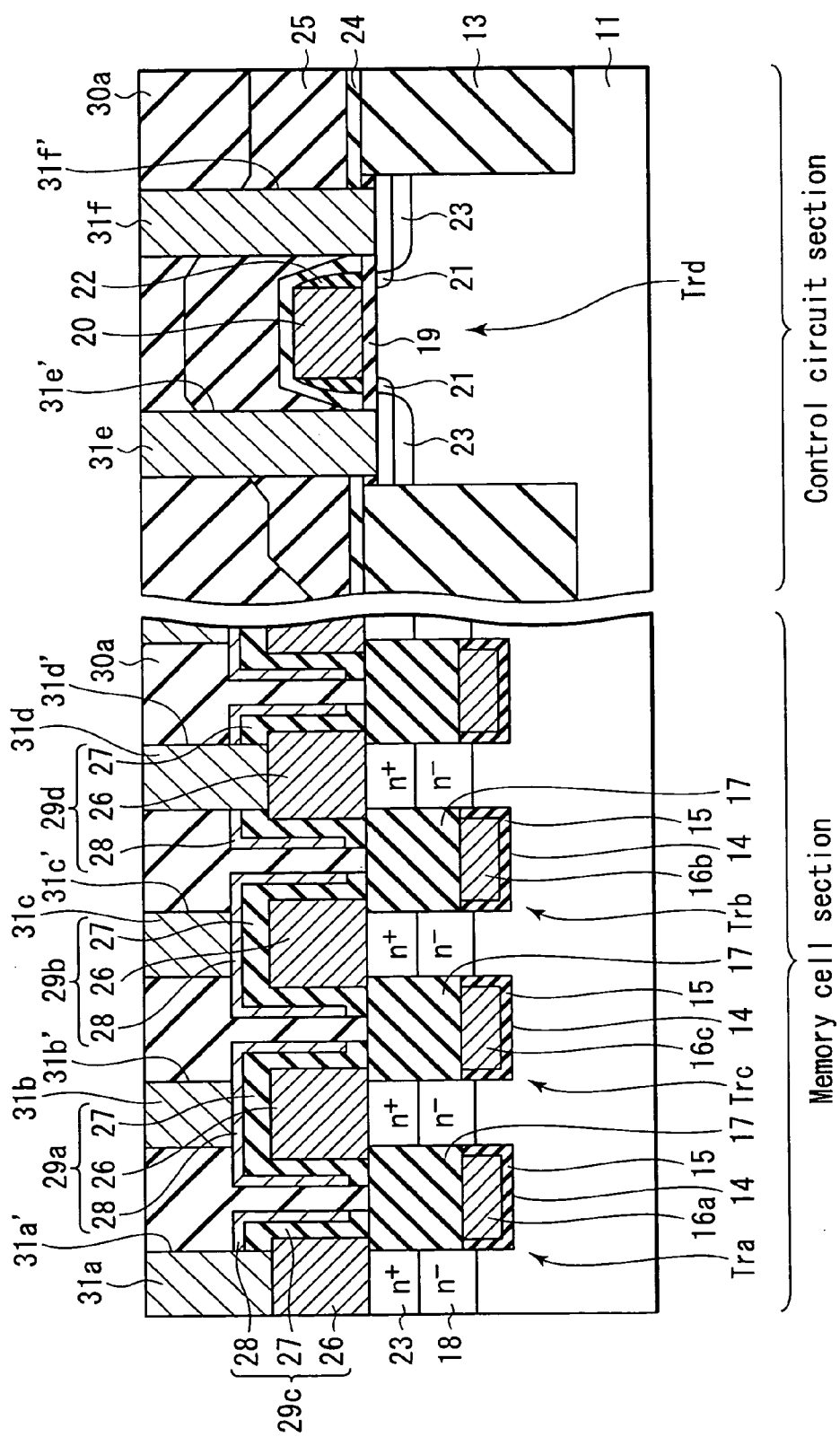

Next, as shown in FIG. 45, contact holes 32e', 32f' are formed in the control circuit section. Next, metal materials are buried in the contact holes 31a', 31b', 31c', 31d', and the upper surfaces of the metal materials are flattened. Accordingly, the contacts 31b, 31c connected to the upper electrode 28 are formed. Here, the contacts 31a, 31b, 31c, 31d of the memory cell section are preferably formed of Al or W. In this case, it is more preferable to dispose a hydrogen barrier film such as TiN and TiAlN in the lower part of Al or W. Next, the metal materials are buried in the contact holes 31e', 31f', and the upper surfaces of the metal materials are flattened. Accordingly, the contacts 31e, 31f connected to the diffusion layer 23 are formed.

Figure 46:
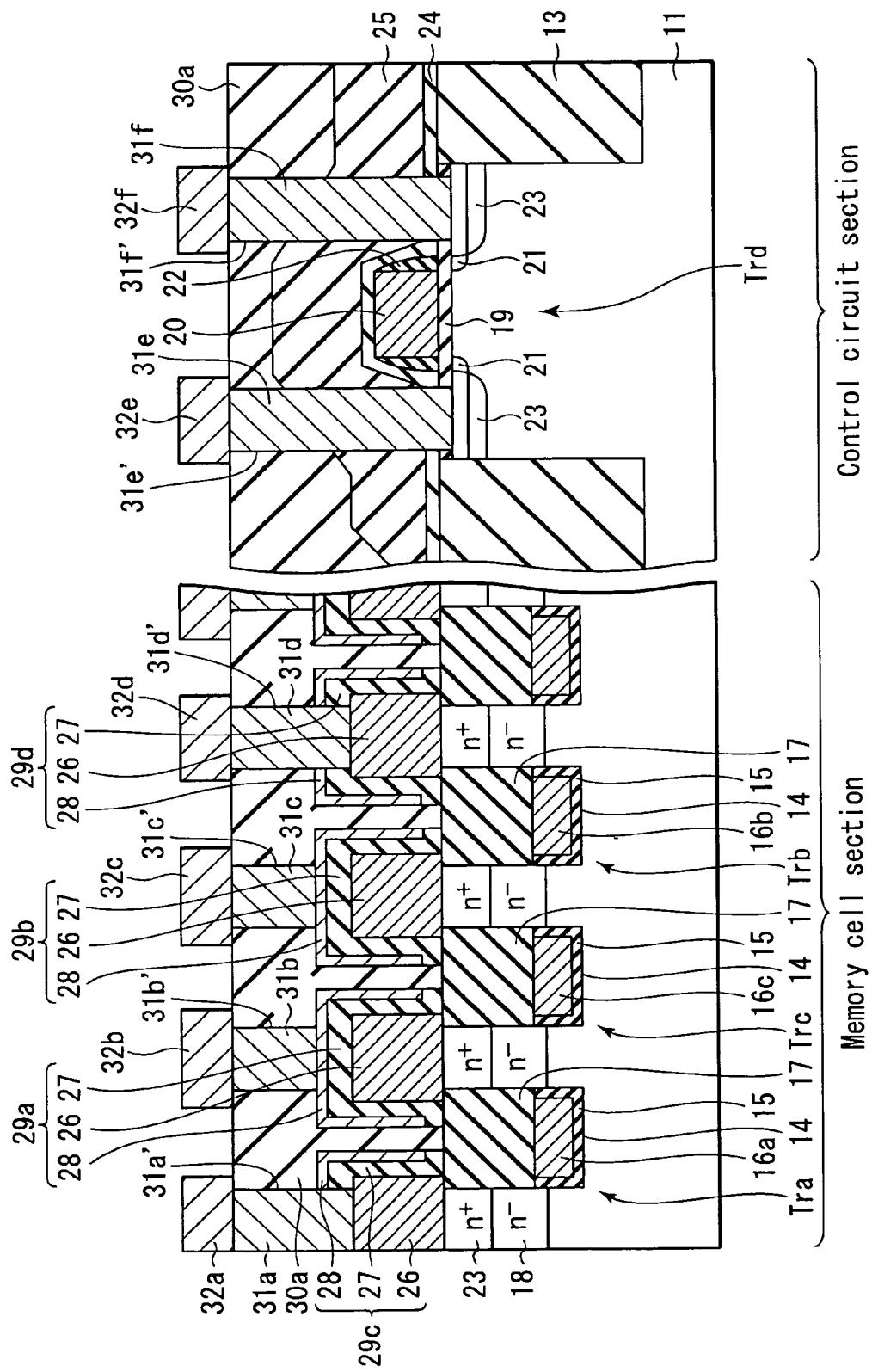

Next, as shown in FIG. 46, the first wiring layers 32a, 32b, 32c, 32d, 32e, 32f connected to the contacts 31a, 31b, 31c, 31d, 31e, 31f are formed.

Next, as shown in FIG. 39, an interlayer insulating film 30b is buried around the first wiring layers 32a, 32b, 32c, 32d, 32e, 32f. Next, the interlayer insulating film 33 is formed on the first wiring layers 32a, 32b, 32c, 32d, 32e, 32f and the interlayer insulating film 30b. Next, the contacts 34a, 34b and the second wiring layers 35a, 35b are formed in the interlayer insulating film 33.

According to the eighth embodiment, an effect similar to that of the sixth embodiment can be obtained. Furthermore, it is also possible to obtain the following effect, because the capacitors 29c, 29d for connecting the bit line 35a to the source/drain of the transistors Tra, Trb are formed.

When the lower electrode 26 is processed, the substrate 11 is not exposed. Therefore, the substrate 11 can be prevented from being hollowed by the over etching. Moreover, when the contact holes 31b', 31c' of the capacitors 29a, 29b are formed, the capacitors 29a, 29b are damaged by RIE, but it is possible to recover/anneal the capacitors in an oxygen atmosphere where the damage is recovered. Therefore, the capacitors 29a, 29b higher in reliability can be formed.

It is to be noted that the two-dimensional capacitor may also be used instead of the three-dimensional capacitor in the eighth embodiment.

[Ninth Embodiment]

In a ninth embodiment, the connecting structure of the bit line to the transistor in the seventh embodiment is modified.

(First Structure)

Figure 47:
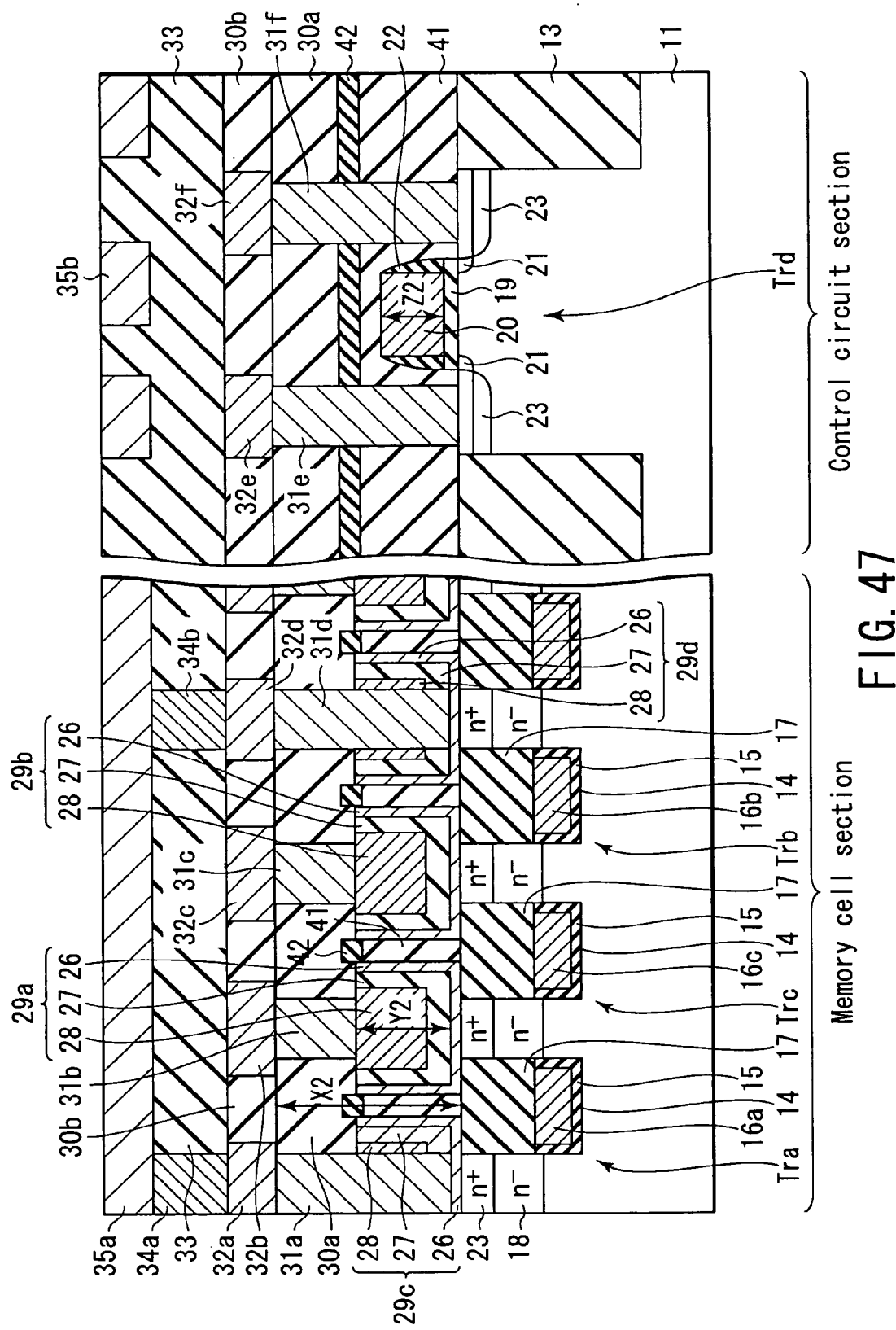
FIG. 47 is a sectional view showing a first structure of the ferroelectric memory device according to a ninth embodiment of the present invention.

FIG. 47 shows a sectional view of a first structure of the ferroelectric memory device according to the ninth embodiment of the present invention. As shown in FIG. 47, the first structure of the ninth embodiment is different from the seventh embodiment of FIG. 23 in that the bit line 35a is connected to the source/drain of the transistors Tra, Trb via the lower electrodes 26 of the capacitors 29c, 29d. Concretely, the following structure is constituted.

The cell capacitor 29a and the capacitor 29c for the contact having the same structure as that of the cell capacitor 29a are disposed on the diffusion layers 23 positioned on the opposite sides of the transistor Tra. Similarly, the cell capacitor 29b and the capacitor 29d for the contact having the same structure as that of the cell capacitor 29b are disposed on the diffusion layers 23 positioned on the opposite sides of the transistor Trb. Moreover, the lower electrodes 26 of the capacitors 29c, 29d for the contacts are connected to the contacts 31a, 31d extending through the upper electrode 28 and ferroelectric film 27. In this manner, the source/drain of the transistors Tra, Trb are connected to the bit line 35a via the lower electrodes 26 of the capacitors 29c, 29d, the contacts 31a, 31d, 34a, 34b, and the wirings 32a, 32d.

It is to be noted that even the first structure of the ninth embodiment satisfies the relationships of the above equations (3), (4).

FIGS. 48 to 57 show sectional views of the manufacturing steps by the first structure of the ninth embodiment of the present invention. The manufacturing method of the first structure of the ninth embodiment will hereinafter be described.

First, as shown in FIGS. 6 to 8, after the buried gate electrode 14 is formed in the memory cell section, the gate electrode 20 is formed in the control circuit section in the same manner as in the fifth embodiment.

Next, as shown in FIGS. 24 to 26, the interlayer films 24, 41, and the diffusion preventive film 42 are formed in the same manner as in the seventh embodiment.

Figure 48:
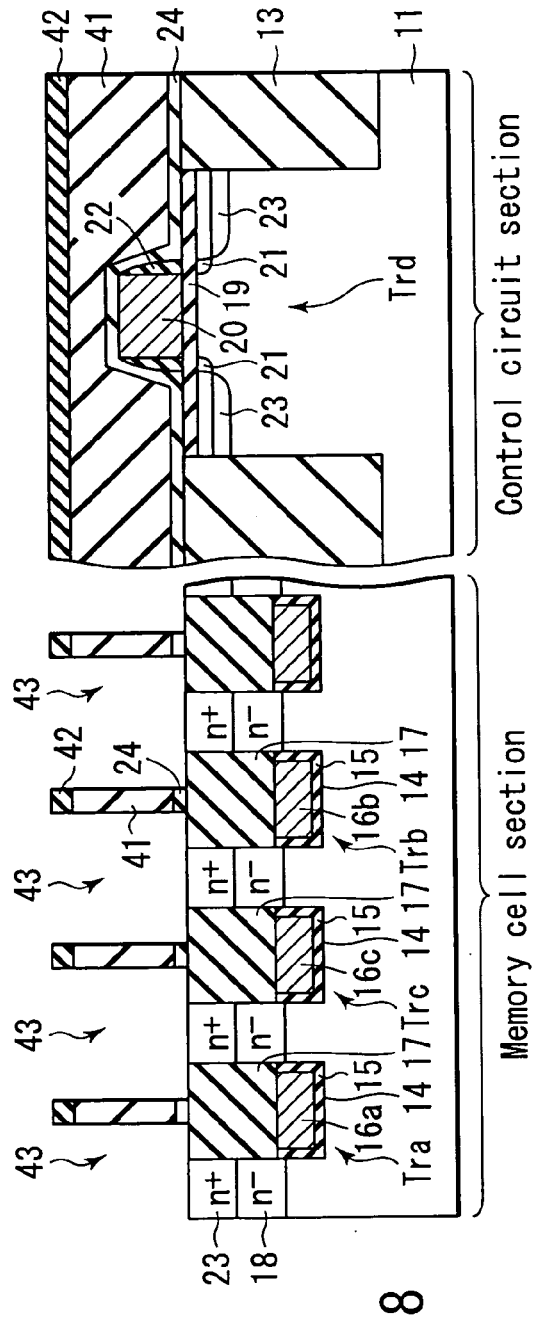
FIGS. 48 to 57 are sectional views showing the respective manufacturing steps by a first structure according to a ninth embodiment of the present invention.

Next, as shown in FIG. 48, the interlayer films 24, 41, and the diffusion preventive film 42 are selectively removed by RIE to form the capacitor trenches 43. In this case, after once stopping the etching in the upper surface of the interlayer film 24, the interlayer film 24 is preferably etched. Next, the gate oxide film 19 in the position where the capacitor is mounted is removed.

Figure 49:
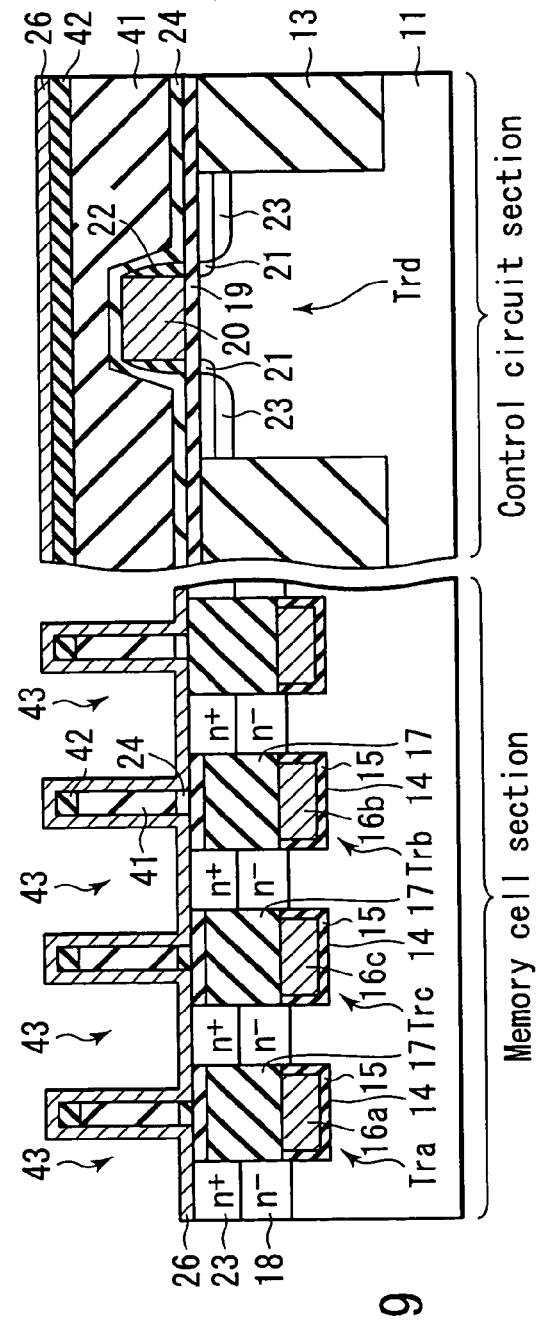

Next, as shown in FIG. 49, the lower electrode 26 is formed in the capacitor trenches 43 and on the diffusion preventive film 42. Examples of the lower electrode 26 include Ir, $IrO_2$, a stacked film of Ir and Pt, a stacked film of $IrO_2$ and Pt, and the like. It is to be noted that the oxygen barrier film of TiN, TiAlN, or the like is preferably disposed under the lower electrode 26.

Figure 50:
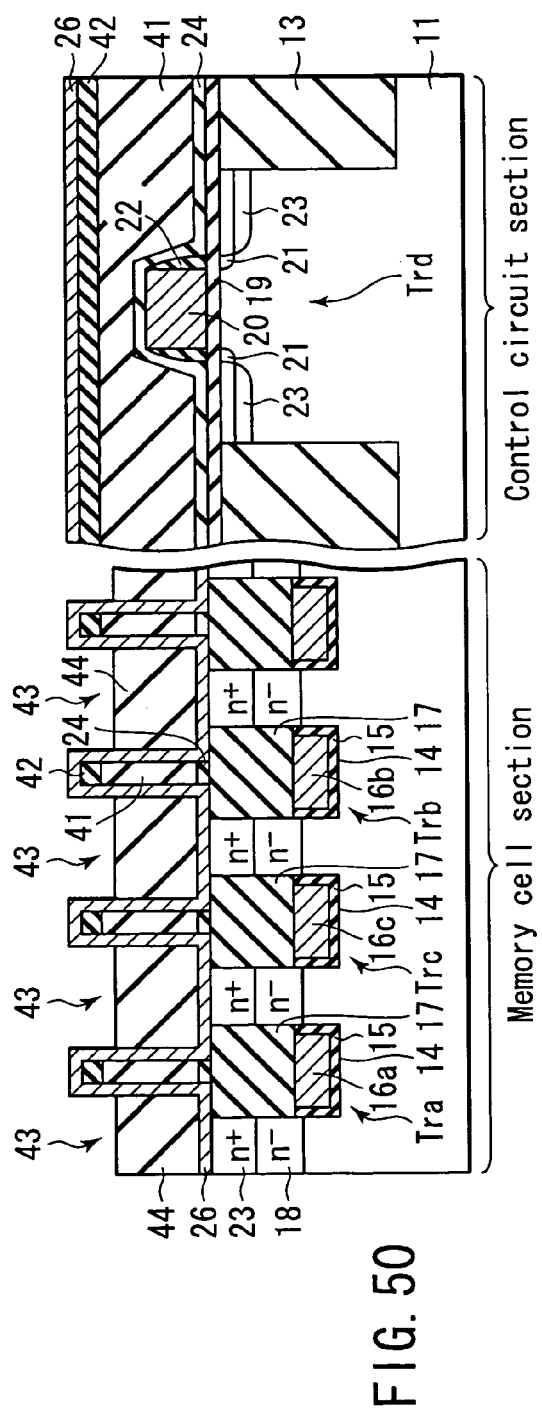

Next, as shown in FIG. 50, the fill-in materials 44 are formed on the lower electrode 26. Examples of the fill-in materials 44 include resist, SOG, SOG doped with phosphor (P) or boron (B), TEOS, TEOS doped with phosphor (P) or boron (B), and the like. Next, the fill-in materials 44 are flattened by CMP until the lower electrode 26 on the diffusion preventive film 42 is exposed. Here, when the fill-in materials 44 are formed of SOG or resist, the step of CMP may be omitted. Next, the upper parts of the fill-in materials 44 in the capacitor trenches 43 are removed by RIE.

Figure 51:
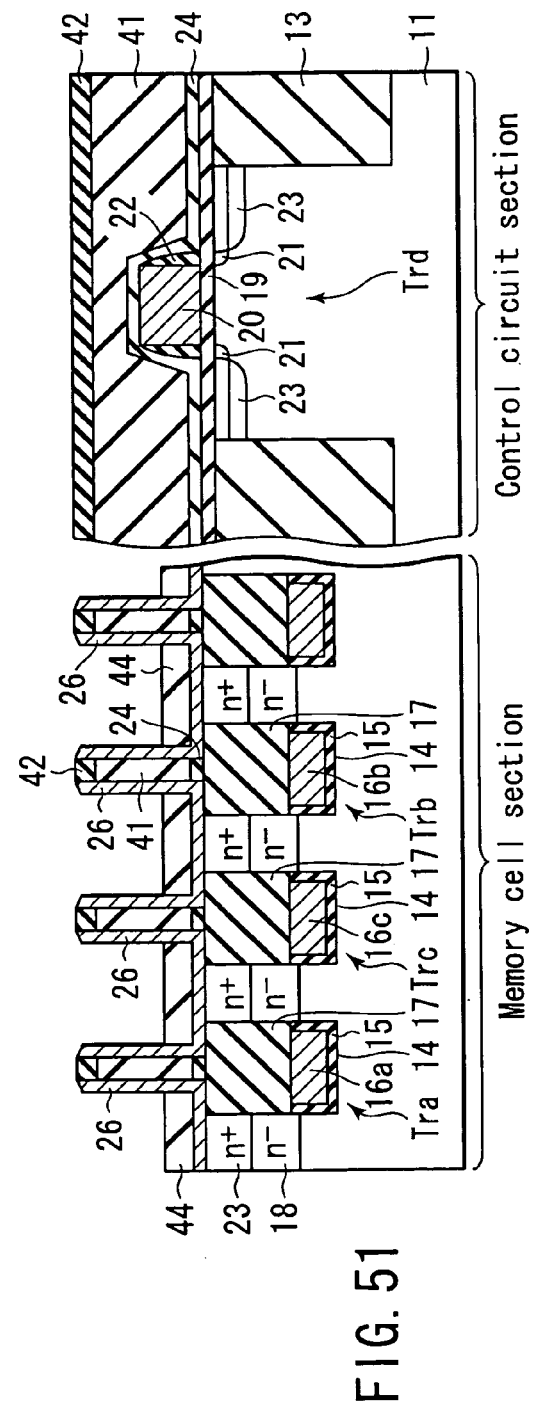

Next, as shown in FIG. 51, the lower electrode 26 is etched back. Accordingly, the lower electrode 26 is divided for each capacitor trench 43 (each cell) in the memory cell section, and all the lower electrodes 26 are removed in the control circuit section. In this case, the etching-back is preferably controlled so that the diffusion preventive film 42 remains. Since the fill-in materials 44 exist on the lower electrodes 26 in the capacitor trenches 43, only the upper parts of the fill-in materials 44 are removed, and the lower electrodes 26 in the capacitor trenches 43 can be prevented from being removed.

Figure 52:
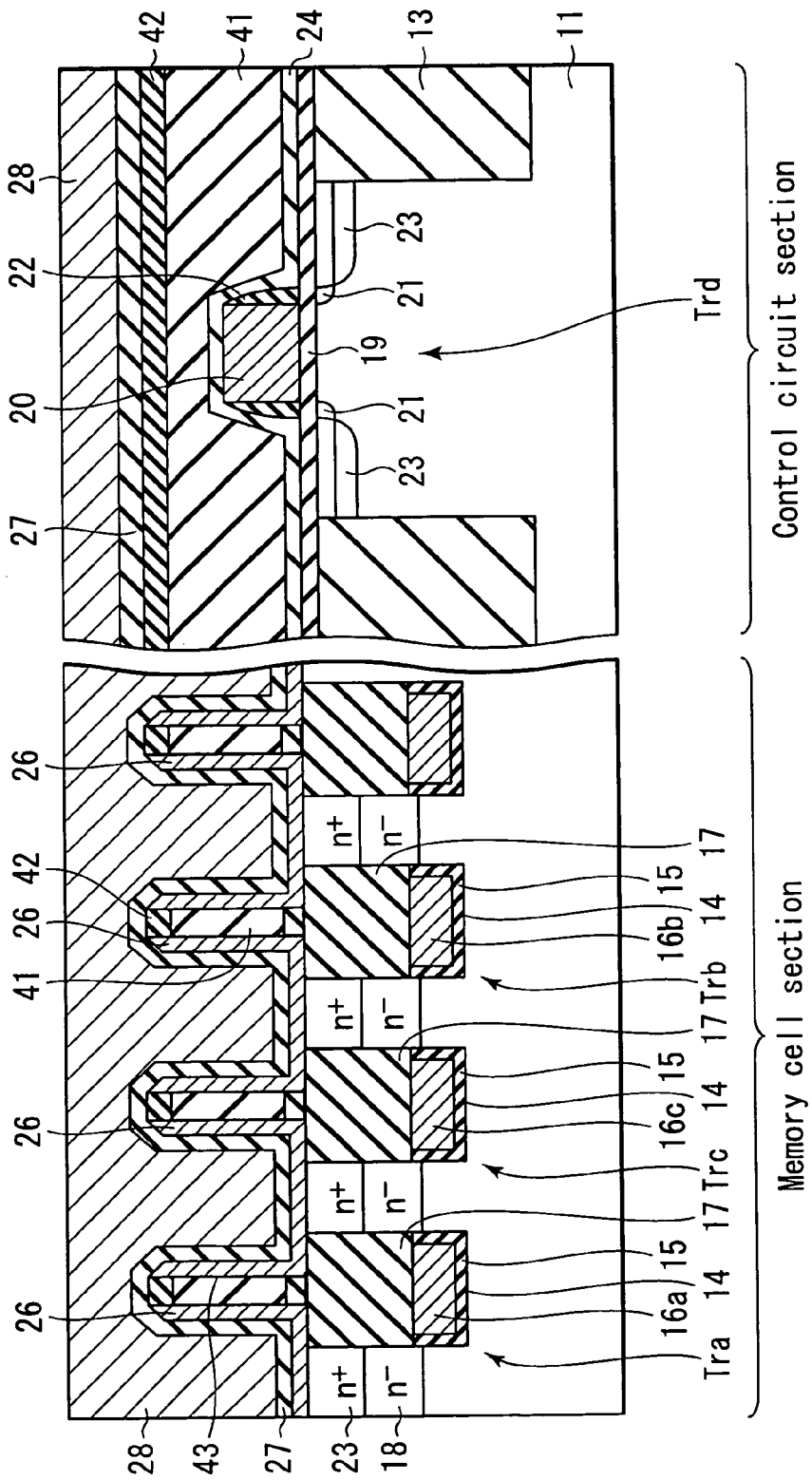

Next, as shown in FIG. 52, for example, the MOCVD process is used to deposit the ferroelectric film 27 and upper electrode 28 in order. Examples of the ferroelectric film 27 include PZT, SBT, and BLT films. Examples of the upper electrode 28 include Pt, $IrO_2$, SrRuO, and a stacked film of Pt, $IrO_2$, and SrRuO.

Figure 53:
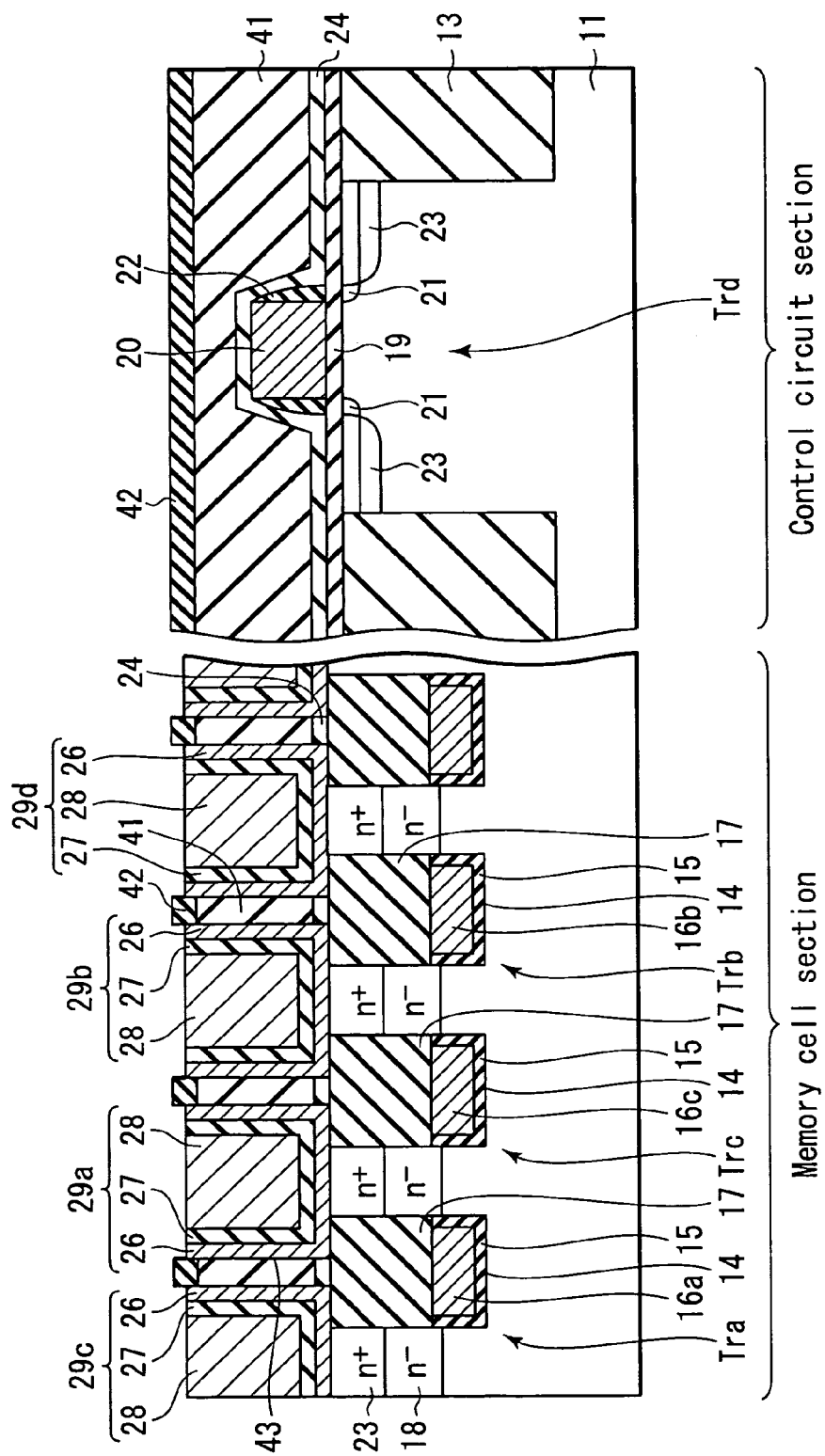

Next, as shown in FIG. 53, the upper electrode 28 is etched back and removed until the ferroelectric film 27 is exposed. Thereafter, the ferroelectric film 27 is etched back and removed until the diffusion preventive film 42 is exposed. Accordingly, the ferroelectric capacitors 29a, 29b, 29c, 29d are formed in the capacitor trenches 43.

Figure 54:
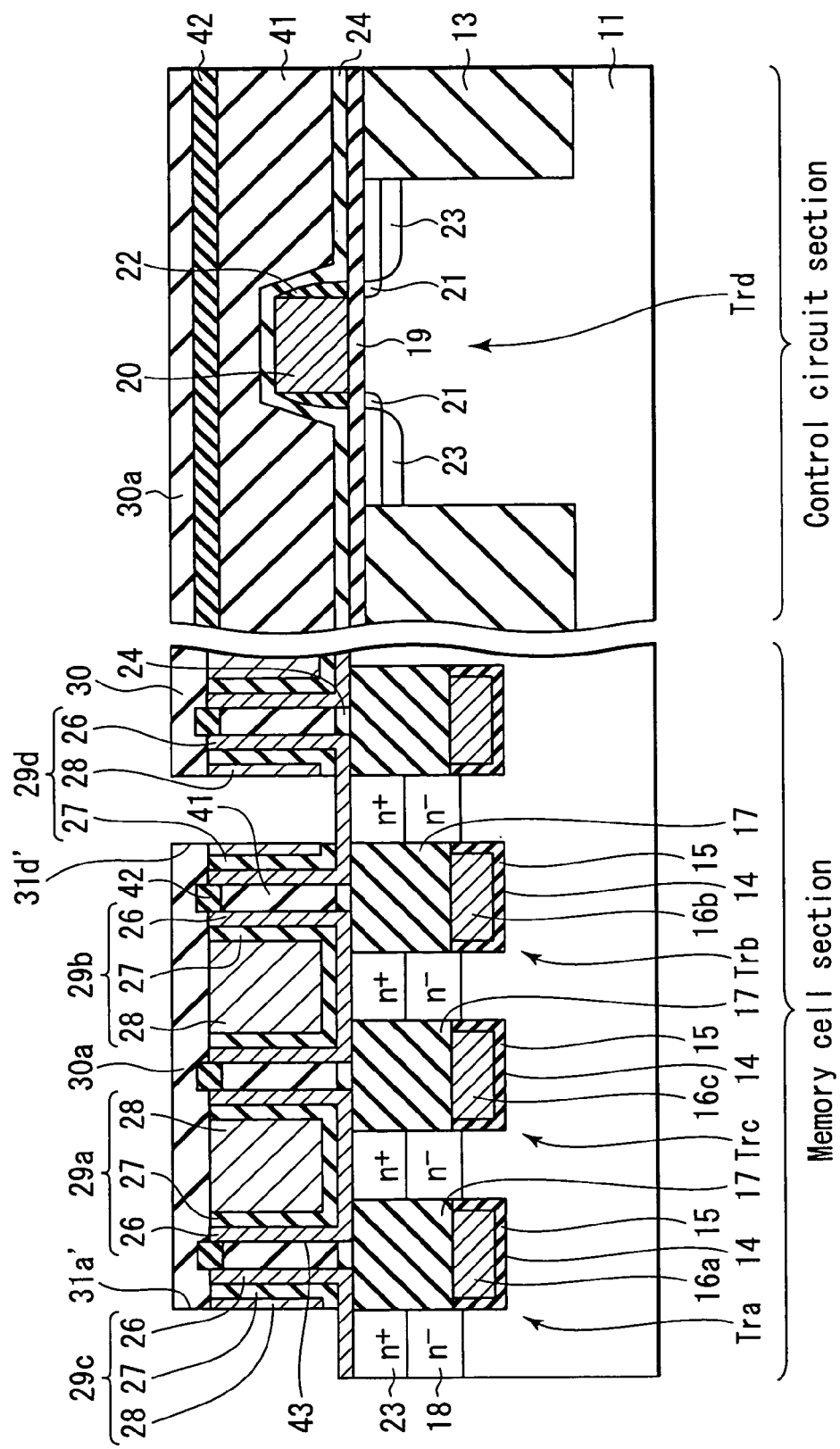

Next, as shown in FIG. 54, the interlayer insulating film 30a, for example, of TEOS or SOG is deposited, and this interlayer insulating film 30a is flattened by CMP. Next, the resist (not shown) is used to process the interlayer insulating film 30a of the memory cell section, and the processed interlayer insulating film 30a is used to process the upper electrode 28. It is preferable to once stop the processing of the upper electrode 28 in the upper surface of the ferroelectric film 27, and to thereafter remove the ferroelectric film 27. Accordingly, the contact holes 31a', 31d' for exposing the lower electrode 26 are formed in the memory cell section.

Figure 55:
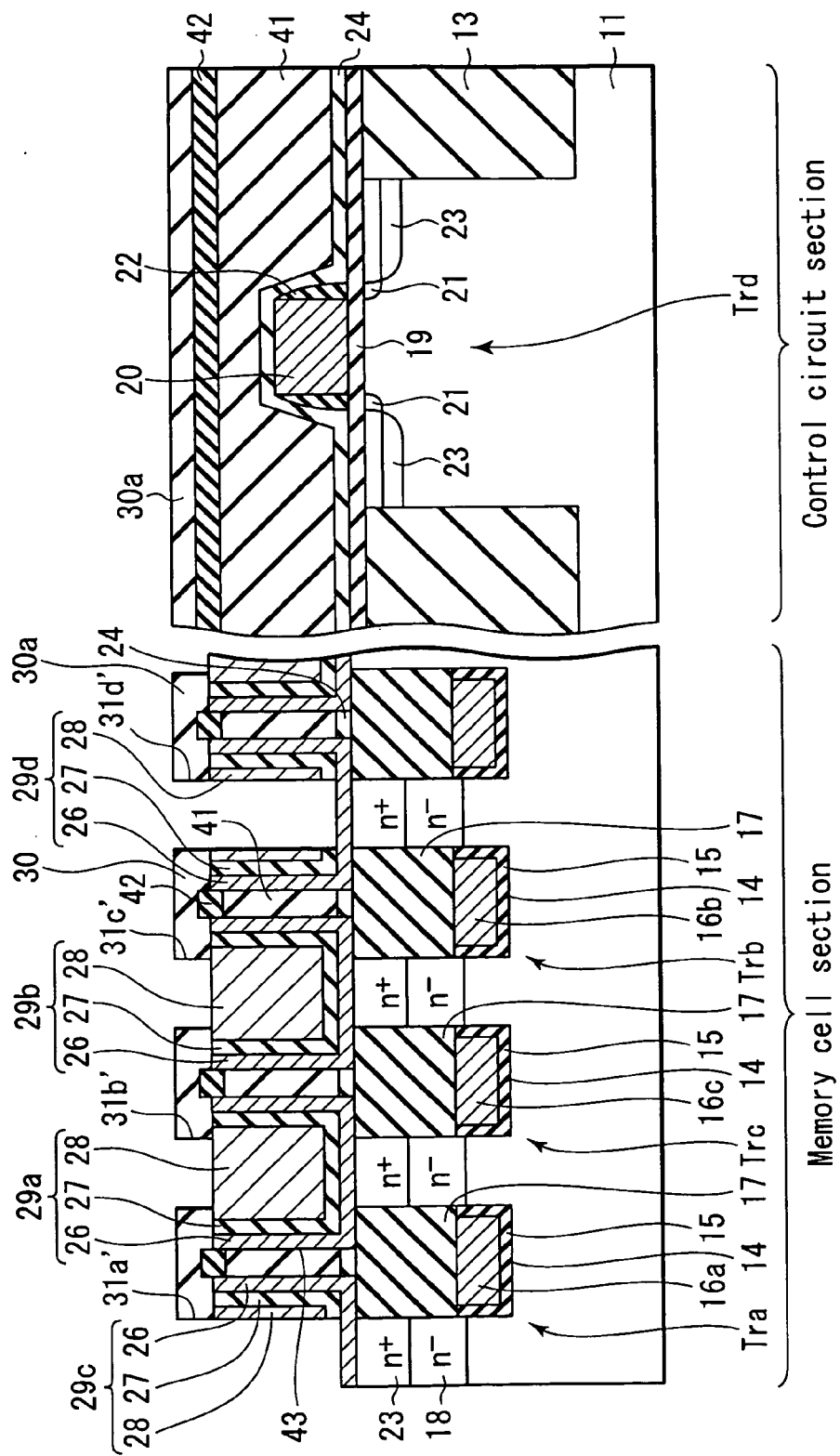

Next, as shown in FIG. 55, the contact holes 31b', 31c' for exposing the upper electrode 28 are formed in the memory cell section.

Figure 56:
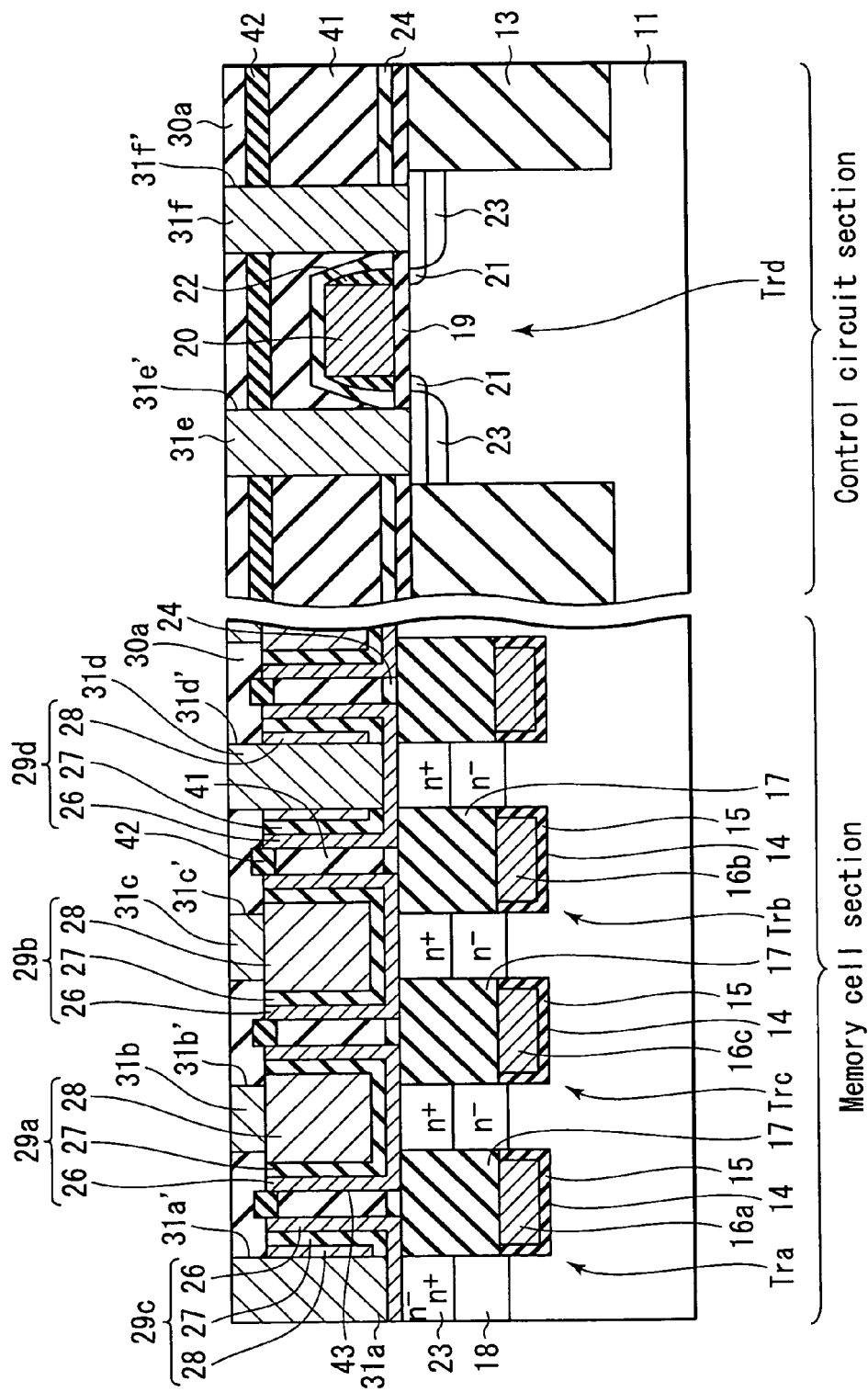

Next, as shown in FIG. 56, the contact holes 32e', 32f are formed in the control circuit section. Next, the metal materials are buried in the contact holes 31a', 31b', 31c', 31d', and the upper surfaces of the metal materials are flattened. Accordingly, the contacts 31b, 31c connected to the upper electrode 28 are formed. Here, the contacts 31a, 31b, 31c, 31d of the memory cell section are preferably formed of Al or W. In this case, it is more preferable to dispose the hydrogen barrier film such as TiN and TiAlN in the lower part of Al or W. Next, the metal materials are buried in the contact holes 31e', 31f', and the upper surfaces of the metal materials are flattened. Accordingly, the contacts 31e, 31f connected to the diffusion layer 23 are formed.

Figure 57:
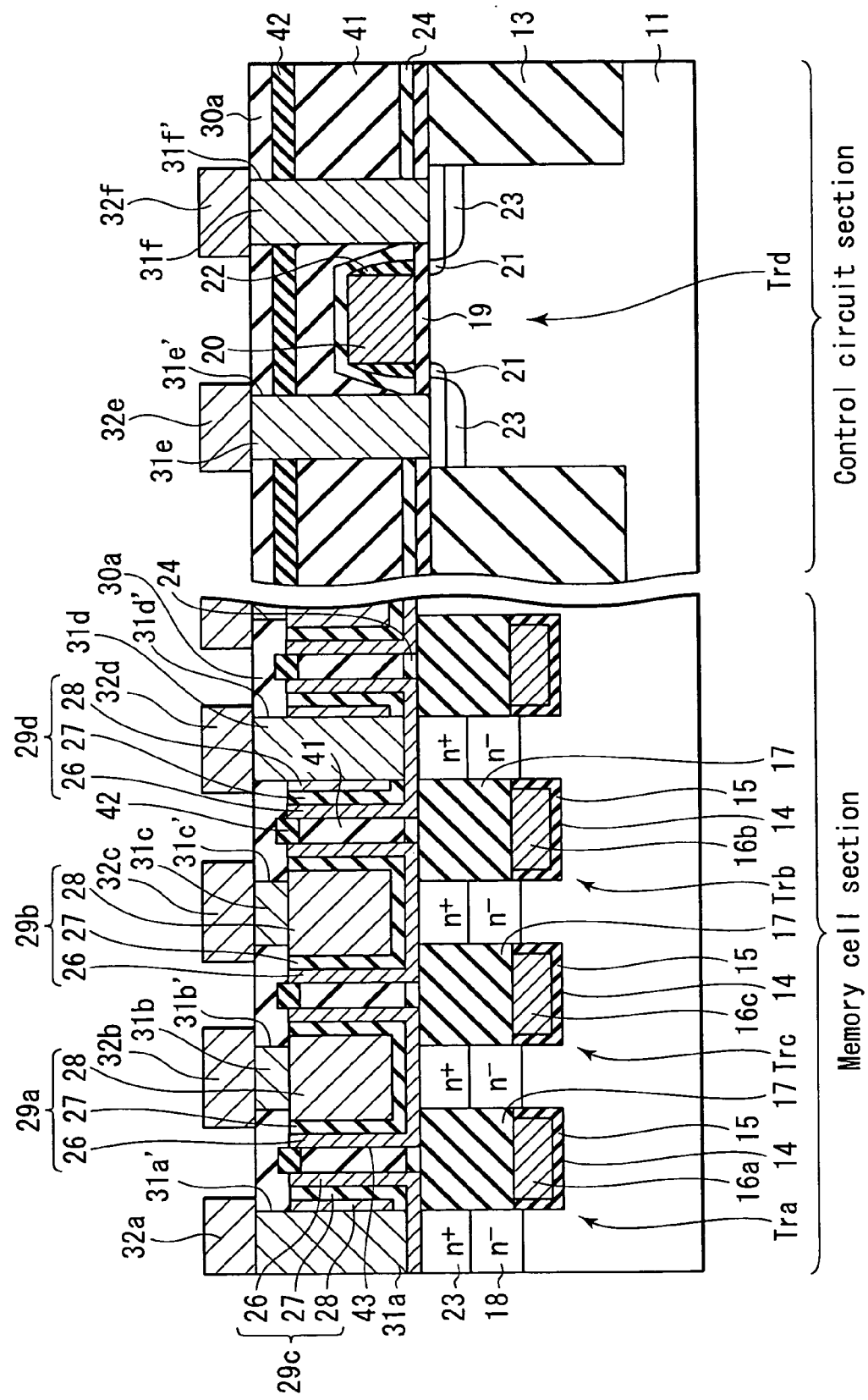

Next, as shown in FIG. 57, the first wiring layers 32a, 32b, 32c, 32d, 32e, 32f connected to the contacts 31a, 31b, 31c, 31d, 31e, 31f are formed.

Next, as shown in FIG. 47, the interlayer insulating film 30b is buried around the first wiring layers 32a, 32b, 32c, 32d, 32e, 32f. Next, the interlayer insulating film 33 is formed on the first wiring layers 32a, 32b, 32c, 32d, 32e, 32f and the interlayer insulating film 30b. Next, the contacts 34a, 34b and the second wiring layers 35a, 35b are formed in the interlayer insulating film 33.

(Second Structure)

Figure 58:
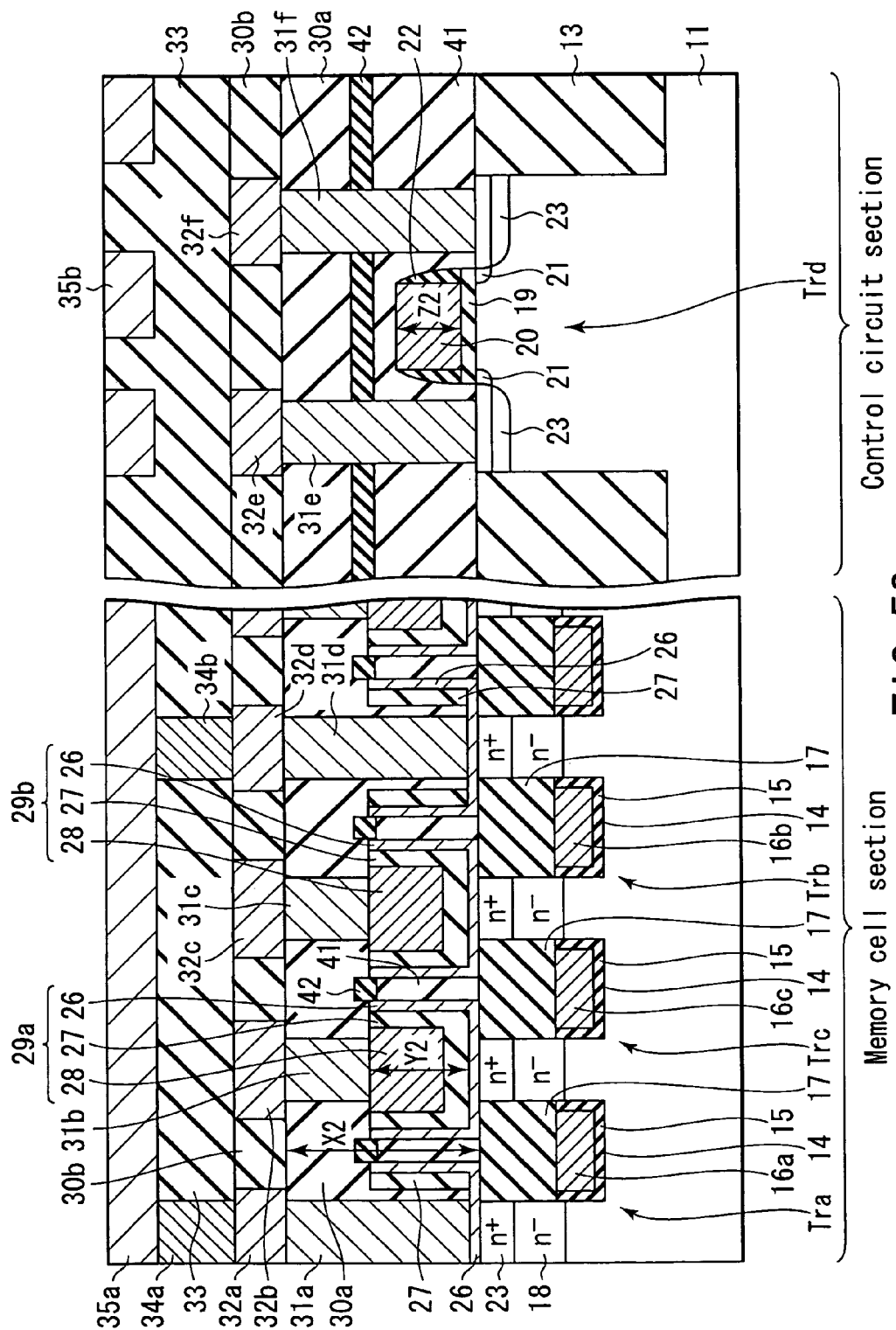
FIG. 58 is a sectional view showing a second structure of the ferroelectric memory device according to the ninth embodiment of the present invention.

FIG. 58 shows a sectional view of a second structure of the ferroelectric memory device according to the ninth embodiment of the present invention. As shown in FIG. 58, the second structure of the ninth embodiment is different from the first structure of the ninth embodiment of FIG. 47 in that the ferroelectric film 27 exists on the inner side surface of the lower electrode 26 in the capacitor trench 43 including the lower electrode 26 for the contact, but the upper electrode 28 does not exist. Therefore, the contacts 31a, 31d connected to the lower electrode 26 for the contact extend only through the interlayer insulating film 30a, and do not extend through the upper electrode 28 and ferroelectric film 27.

It is to be noted that the second structure of the ninth embodiment also satisfies the relationships of the equations (3), (4).

FIGS. 59 to 64 show sectional views of the manufacturing steps by the second structure of the ninth embodiment of the present invention. The manufacturing method of the second structure according to the ninth embodiment will hereinafter be described.

Figure 59:
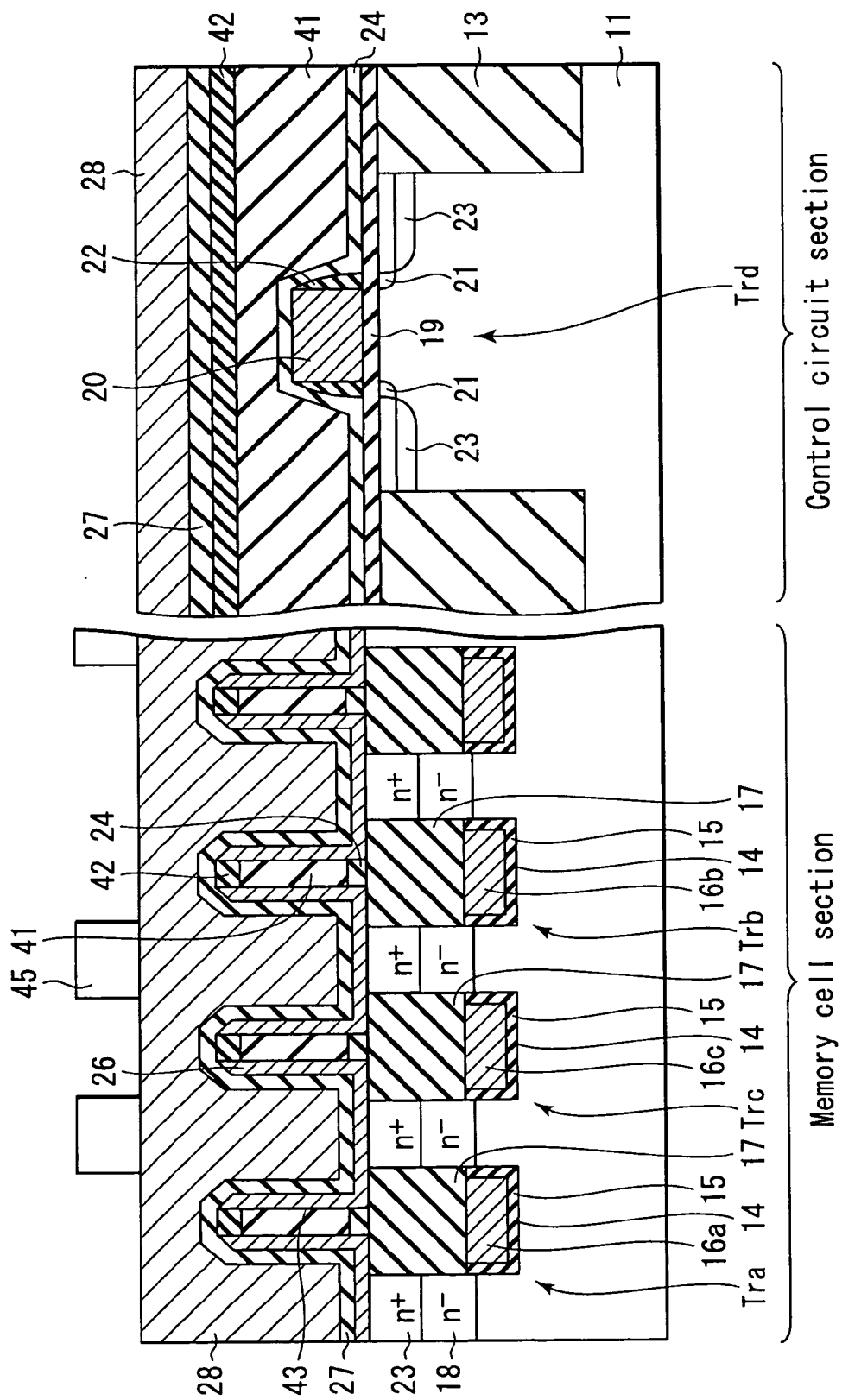
FIGS. 59 to 64 are sectional views showing the respective manufacturing steps by a second structure according to the ninth embodiment of the present invention.

First, after the steps of FIGS. 6 to 8, FIGS. 24 to 26, and FIGS. 48 to 52, as shown in FIG. 59, the mask material 45, for example, of the oxide film, TiN film, TiAlN film, or the like is formed and patterned on the upper electrode 28.

Figure 60:
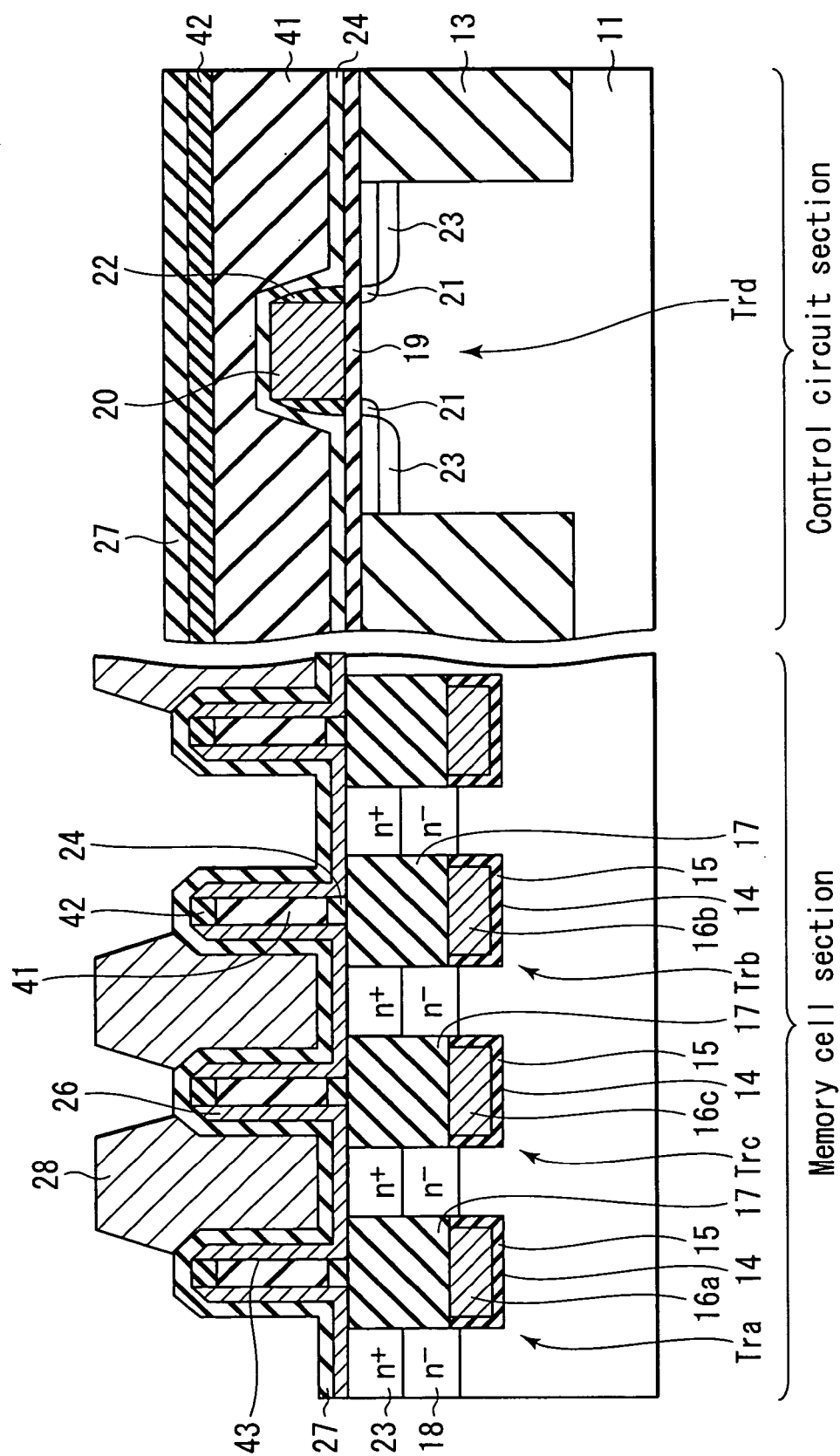

Next, as shown in FIG. 60, the ferroelectric film 27 is used as a stopper to etch the upper electrode 28 by RIE, and the upper electrode 28 is divided for each capacitor trench 43. In this case, the mask material 45 is used to perform the etching so that the upper electrode 28 is securely left. Moreover, the preferable conditions at the time of the etching are that the mask material 45 is eliminated, and the height of the upper electrode 28 is reduced.

Figure 61:
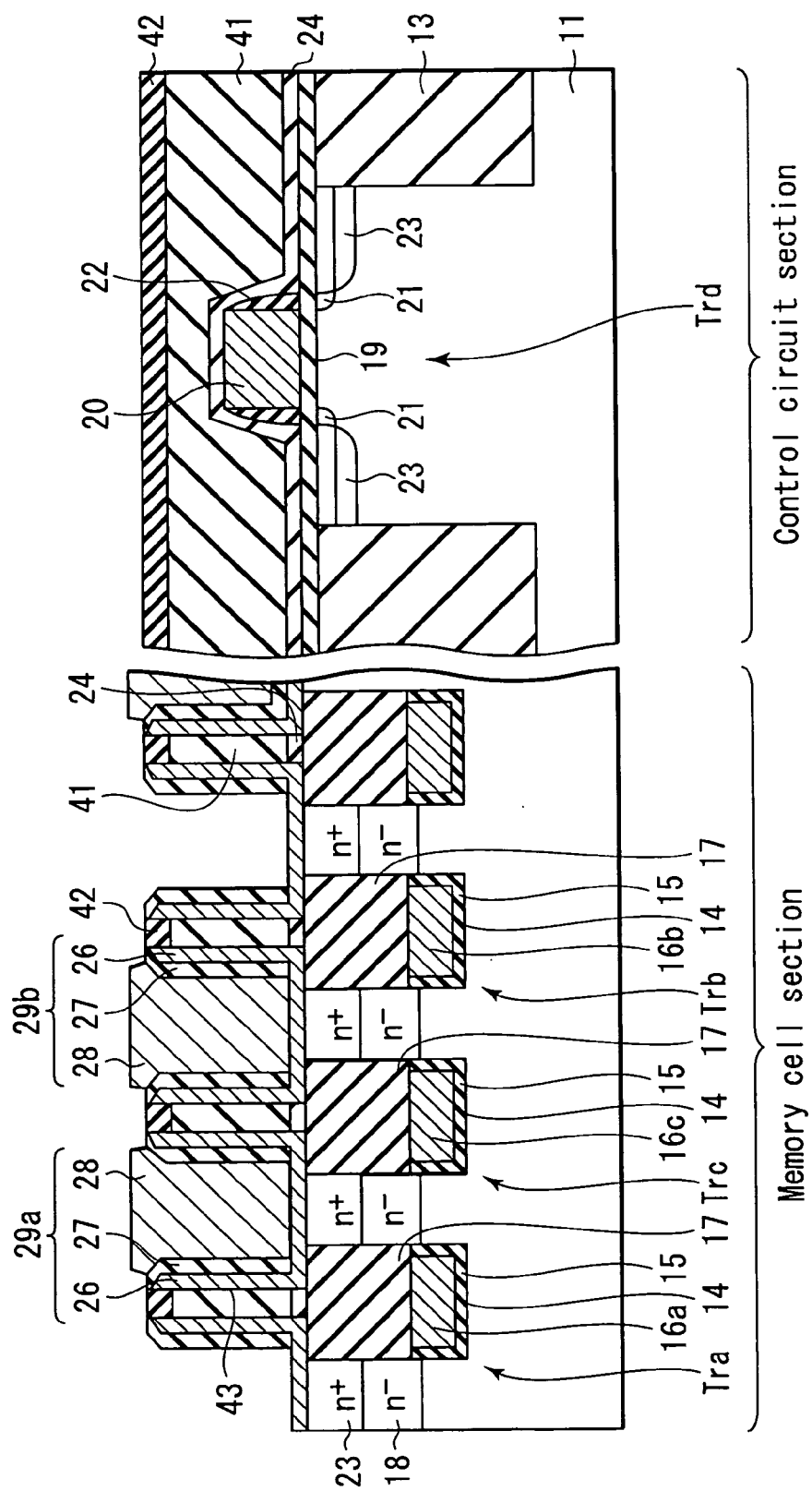

Next, as shown in FIG. 61, after recessing the upper part of the upper electrode 28 under the conditions that the etching rate of the material of the upper electrode 28 is higher than that of the material of the ferroelectric film 27, the ferroelectric film 27 is etched under the conditions that the etching rate of the material of the ferroelectric film 27 is higher than that of the material of the upper electrode 28. Accordingly, the ferroelectric capacitors 29a, 29b are formed in the capacitor trenches 43, and the ferroelectric film 27 on the lower electrode 26 of the contact region is removed.

Figure 62:
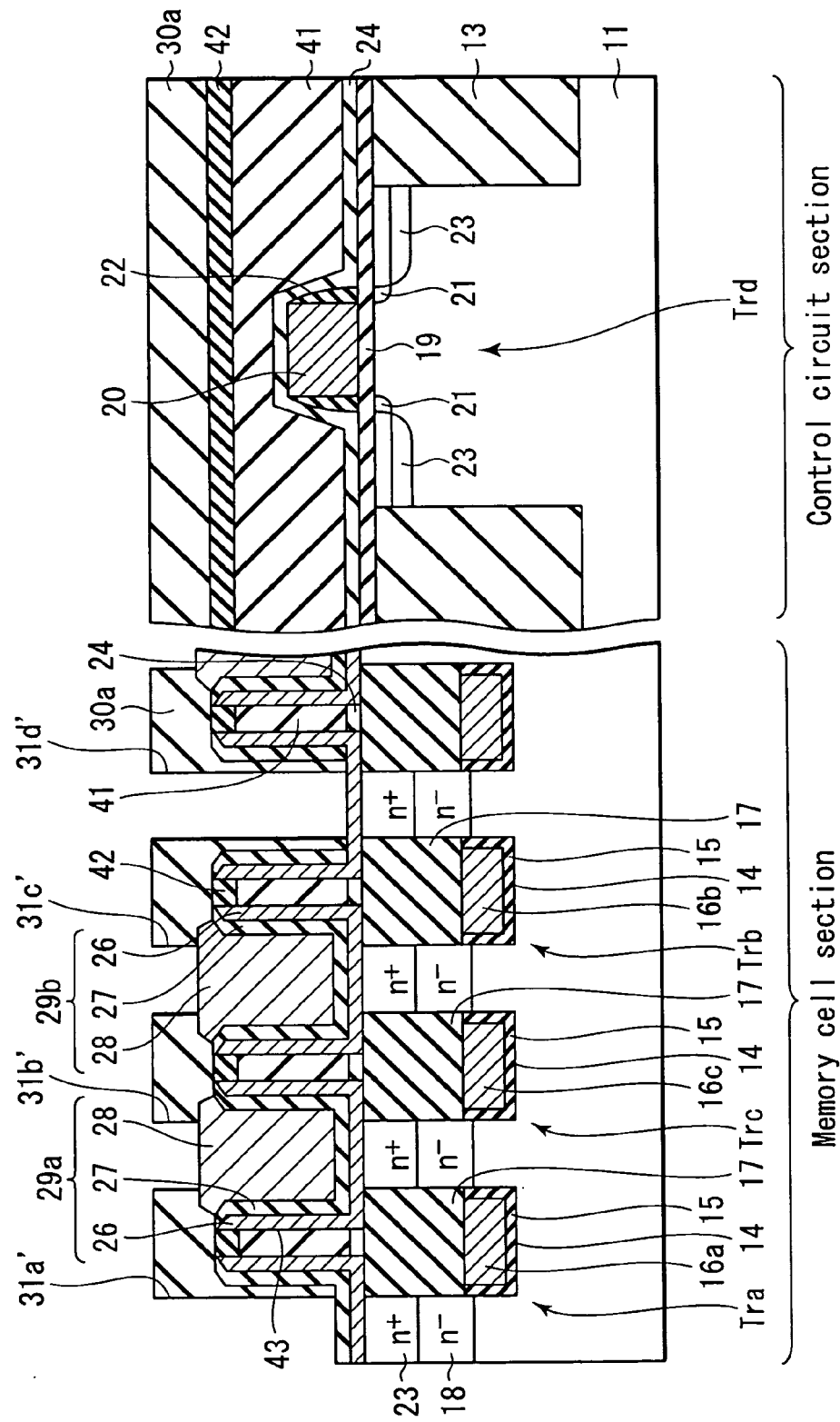

Next, as shown in FIG. 62, the interlayer insulating film 30a, for example, of TEOS or SOG is deposited, and the interlayer insulating film 30a is flattened by CMP. Next, the contact holes 31a', 31d' for exposing the lower electrode 26, and the contact holes 31b', 31c' for exposing the upper electrode 28 are formed by RIE. It is to be noted that in this RIE process, an etching selection ratio of the interlayer insulating film 30a to the lower and upper electrode materials is preferably sufficient. However, in general, with the RIE of the oxide film base, the etching rate of the metal is excessively low in many cases, and it is considered that no special condition is required.

Figure 63:
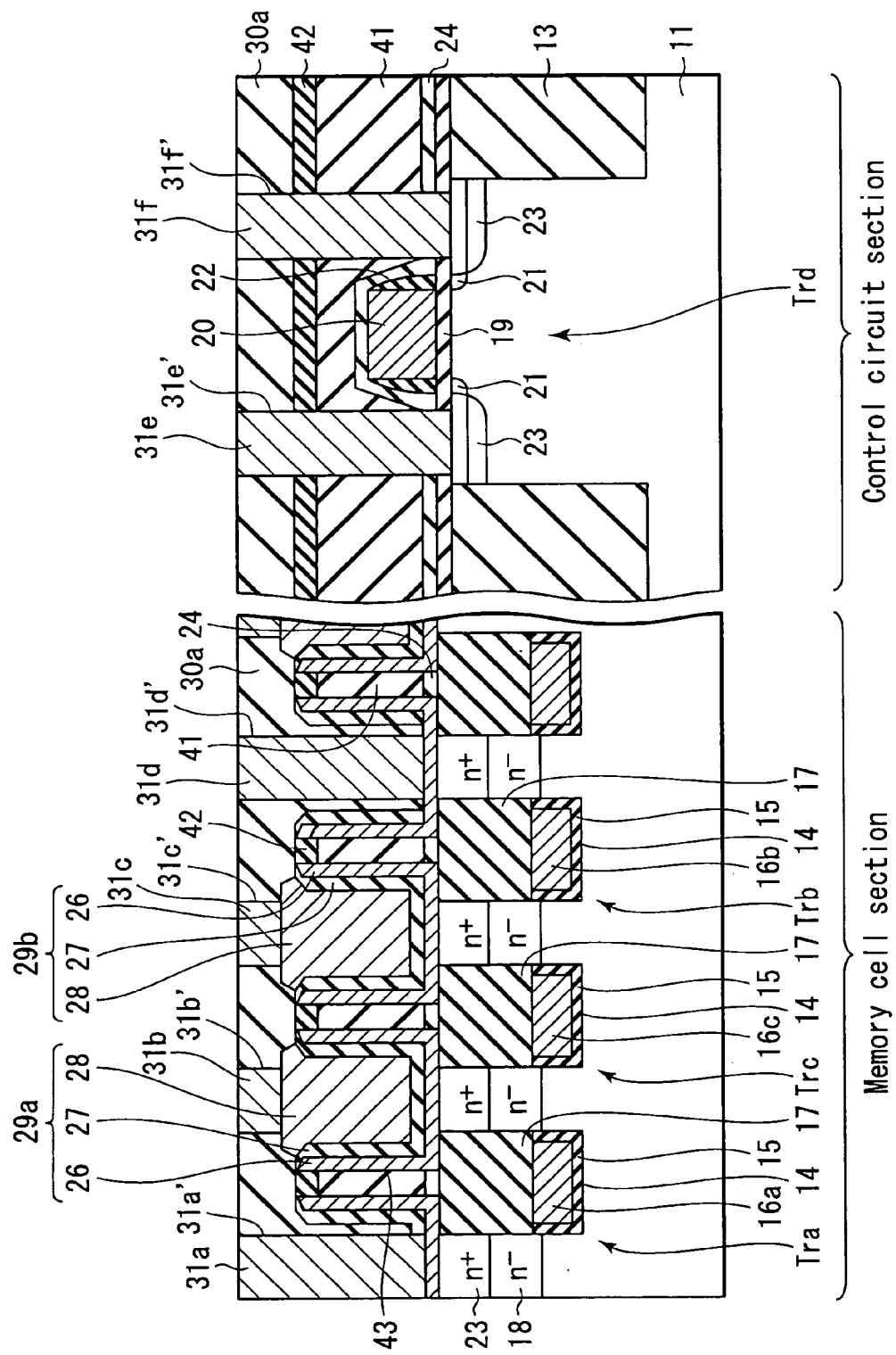

Next, as shown in FIG. 63, the contact holes 32e', 32f' are formed in the control circuit section. Next, the metal materials of Al, W, and the like are buried in the contact holes 31a', 31b', 31c', 31d', and the upper surfaces of the metal materials are flattened. Accordingly, the contacts 31b, 31c connected to the upper electrode 28 are formed, and the contacts 31a, 31d connected to the lower electrode 26 are formed. Thereafter, the metal materials are buried in the contact holes 32e', 32f', and the upper surfaces of the metal materials are flattened. Accordingly, the contacts 31e, 31f connected to the diffusion layer 23 are formed.

Figure 64:
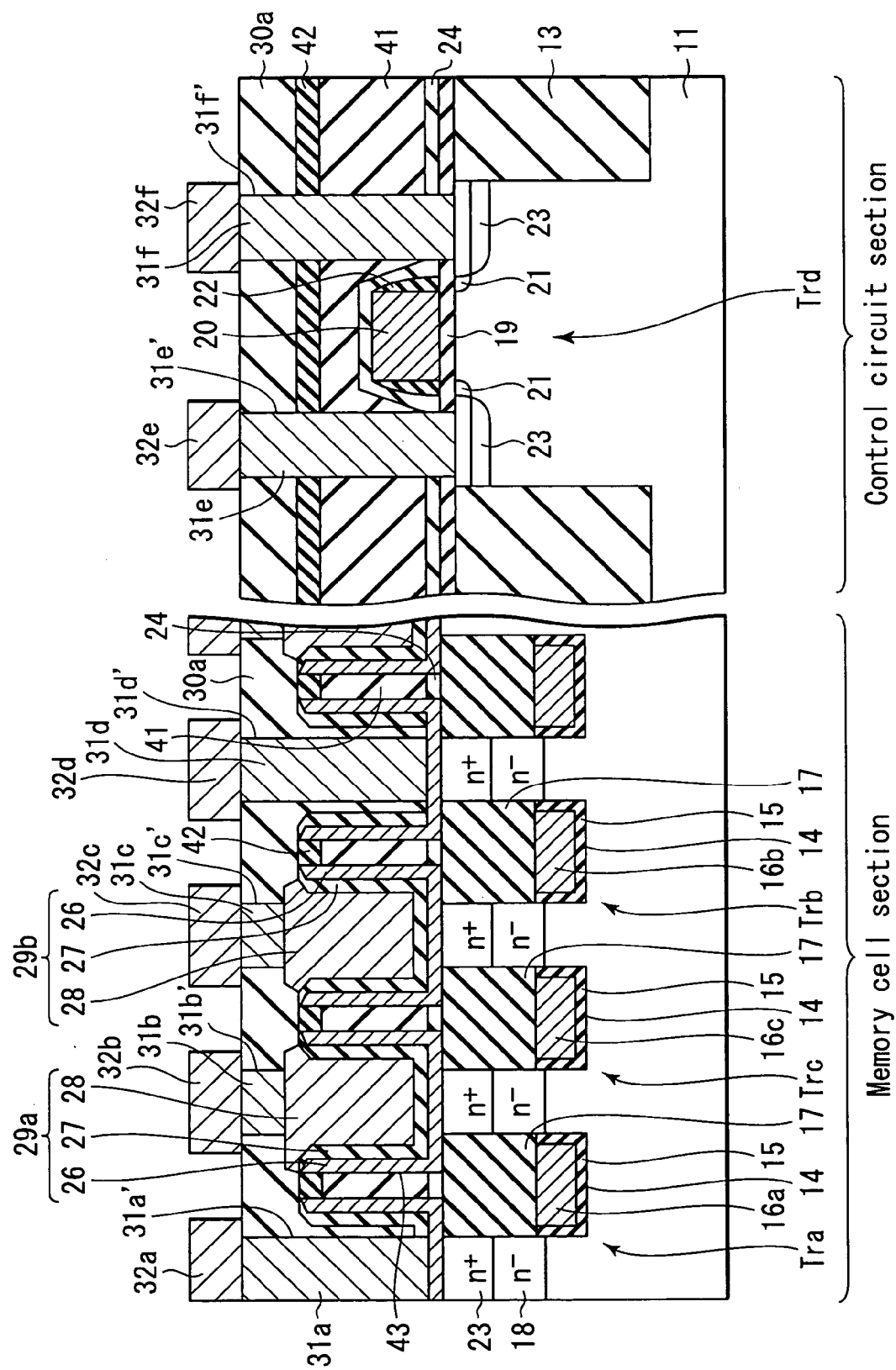

Next, as shown in FIG. 64, the first wiring layers 32a, 32b, 32c, 32d, 32e, 32f connected to the contacts 31a, 31b, 31c, 31d, 31e, 31f are formed.

Next, as shown in FIG. 58, the interlayer insulating film 30b is buried around the first wiring layers 32a, 32b, 32c, 32d, 32e, 32f. Next, the interlayer insulating film 33 is formed on the first wiring layers 32a, 32b, 32c, 32d, 32e, 32f and the interlayer insulating film 30b. Next, the contacts 34a, 34b and the second wiring layers 35a, 35b are formed in the interlayer insulating film 33.

It is to be noted that in the drawings used in the description of the manufacturing method by the second structure, the structure of the upper-surface portion of the capacitor 29a or 29b is slightly different from that of the corresponding portion of FIG. 58, but ideally the process is adjusted so as to obtain the structure shown in FIG. 58.

According to the first and second structures of the ninth embodiment, an effect similar to that of the seventh embodiment can be obtained. Furthermore, since the bit line 35a is connected to the source/drain of the transistors Tra, Trb via the lower electrodes 26 of the capacitors 29c, 29d, the lower electrodes 26 exist under the contacts 31a, 31d, and therefore the damage at the time of the opening of the contact holes 31a', 31d' can be recovered by the annealing in the oxygen atmosphere, and there can be provided the ferroelectric capacitor higher in reliability.

Moreover, the first structure of FIG. 47 has a unique effect in that the number of lithography steps does not increase.

Furthermore, the second structure of FIG. 58 has the following unique effect by the processing of the upper electrode 28 by the use of the mask material 45. That is, the mask material 45 can be used to stably form the upper electrode 28 and the capacitor area. Moreover, when the mask material 45 is used, the upper electrode 28 of the portion for exposing the lower electrode 26 can be removed beforehand, and it is therefore easy to open the contact holes 31a', 31d'. Furthermore, there is a possibility that the contacts 31b, 31c can be opened simultaneously with the contacts 31a, 31d. It is to be noted that when the contacts 31b, 31c can be opened simultaneously with the contacts 31a, 31d, the total number of lithography steps does not increase even in the second structure of FIG. 58.

[Tenth Embodiment]

In a tenth embodiment, the two-dimensional capacitor is modified into the three-dimensional capacitor in the series connected TC unit type structure of the third embodiment.

Figure 65:
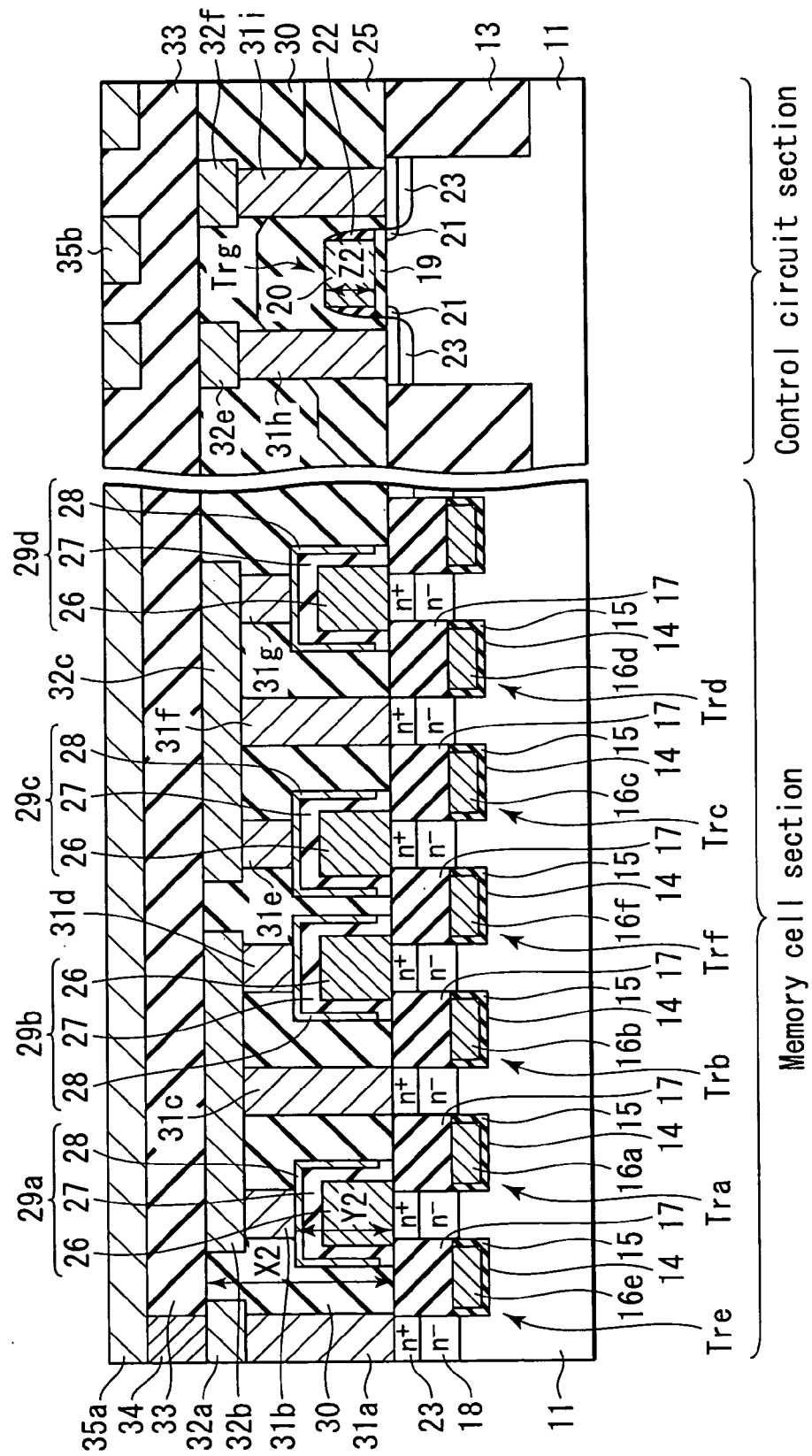
FIG. 65 is a sectional view showing the ferroelectric memory device according to a tenth embodiment of the present invention.

FIG. 65 shows a sectional view of the ferroelectric memory device according to the tenth embodiment of the present invention. As shown in FIG. 65, the tenth embodiment is different from the third embodiment in that the capacitors 29a, 29b, 29c, 29d have the three-dimensional capacitor structure. That is, the ferroelectric film 27 is formed on the upper and side surfaces of the lower electrode 26, and the upper electrode 28 is formed on the upper and side surfaces of the ferroelectric film 27, so that the ferroelectric film 27 and upper electrode 28 extend in the XYZ directions.

It is to be noted that the structure satisfies the relationships of the equations (3), (4) also in the tenth embodiment.

According to the tenth embodiment, an effect similar to that of the third embodiment can be obtained. Furthermore, the effect that the capacitor capacitance can be increased is also obtained by the use of the three-dimensional capacitor.

It is to be noted that the transistor Trf that is constantly on is disposed in order to electrically connect the second cell to the third cell, but the diffusion layers under the second and third cell capacitors may also be continued in series without disposing the transistor Trf as in the fourth embodiment.

[Eleventh Embodiment]

In an eleventh embodiment, the configuration of the three-dimensional capacitor in the tenth embodiment is modified.

Figure 66:
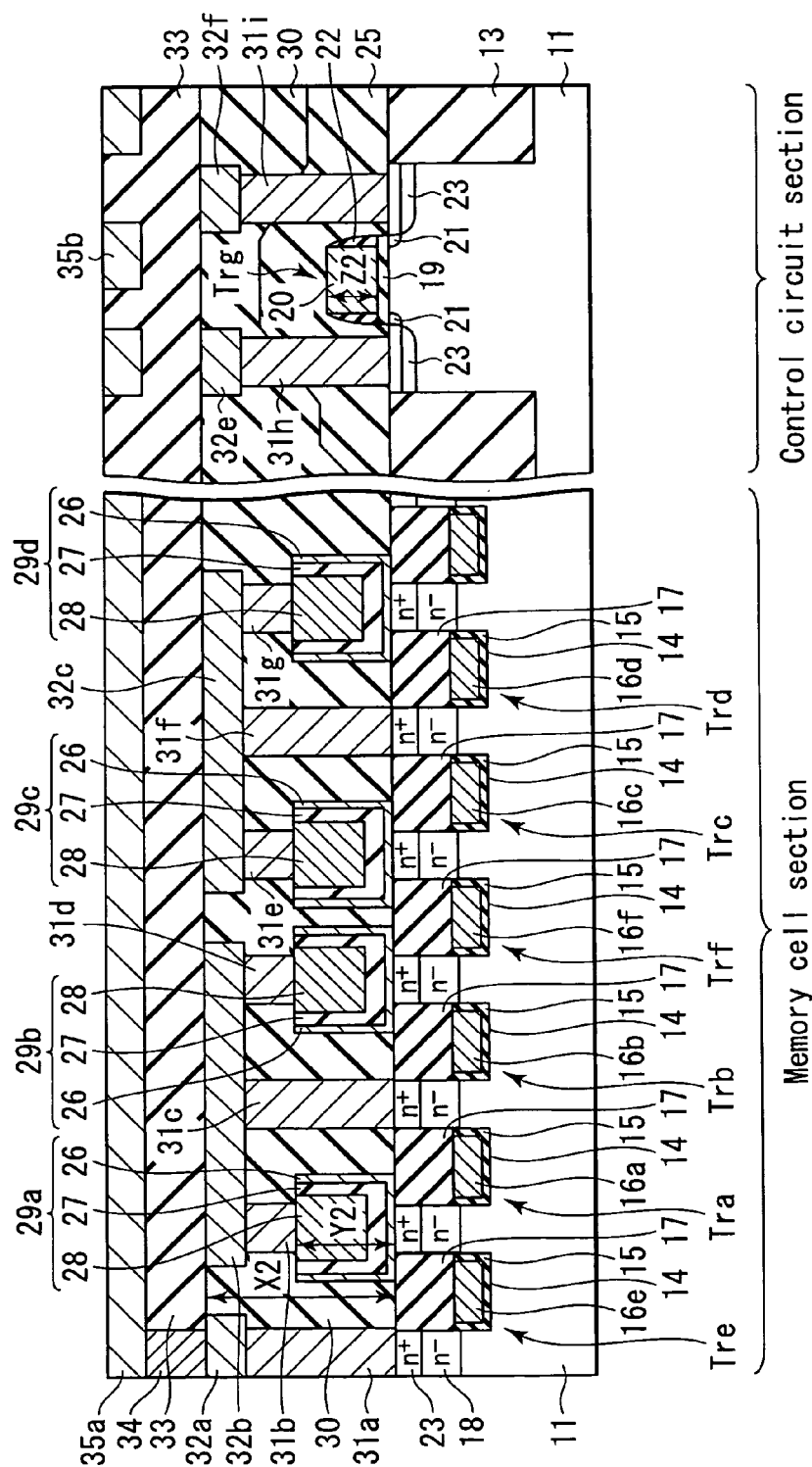
FIG. 66 is a sectional view showing the ferroelectric memory device according to an eleventh embodiment of the present invention.

FIG. 66 shows a sectional view of the ferroelectric memory device according to the eleventh embodiment of the present invention. As shown in FIG. 66, the eleventh embodiment is different from the tenth embodiment in the configurations of the three-dimensional capacitors 29a, 29b, 29c, 29d. That is, the ferroelectric film 27 and upper electrode 28 extend in the XYZ directions in the tenth embodiment, whereas the lower electrode 26 and ferroelectric film 27 extend in the XYZ directions in the eleventh embodiment.

It is to be noted that the structure satisfies the relationships of the above equations (3), (4) also in the eleventh embodiment.

According to the eleventh embodiment, an effect similar to that of the third embodiment can be obtained. Furthermore, it is also possible to obtain the effect that the capacitor capacitance can be increased by the use of the three-dimensional capacitor.

It is to be noted that the buried transistor Trf that is constantly on is disposed in order to electrically connect the second cell to the third cell, but the diffusion layers under the second and third cell capacitors may also be continued in series without disposing the transistor Trf as in the fourth embodiment.

[Twelfth Embodiment]

In a twelfth embodiment, the structure for connecting the bit line to the block selection transistor, and the structure for connecting the upper electrode of the capacitor to the source/drain in the tenth embodiment are modified.

Figure 67:
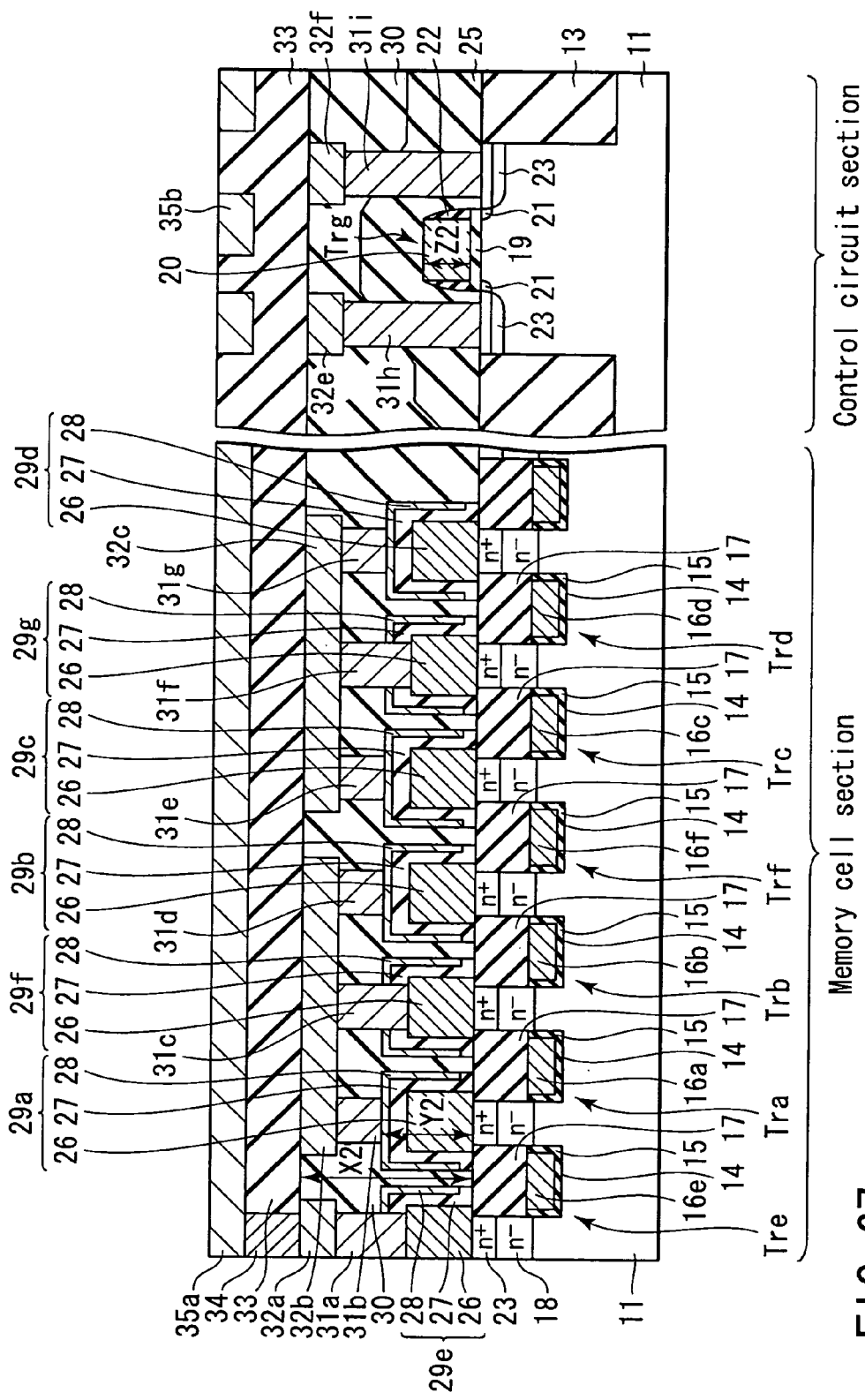
FIG. 67 is a sectional view showing the ferroelectric memory device according to a twelfth embodiment of the present invention.

FIG. 67 shows a sectional view of the ferroelectric memory device according to the twelfth embodiment of the present invention. As shown in FIG. 67, the twelfth embodiment is different from the tenth embodiment of FIG. 65 in that: (1) the bit line 35a is connected to the source/drain of the block selection transistor Tre via the lower electrode 26 of the capacitor 29e; and (2) the upper electrode 28 of the capacitors 29a, 29b, 29c, 29d is connected to the source/drain via the lower electrode 26 of the capacitors 29f, 29g. Concretely, the following structure is constituted.

A three-dimensional capacitor 29e for the contact is disposed on the diffusion layer 23 positioned on the right side of the a gate electrode 16e, a three-dimensional capacitor 29f for the contact is disposed on the diffusion layer 23 positioned between the gate electrodes 16a, 16b, and a three-dimensional capacitor 29g for the contact is disposed on the diffusion layer 23 positioned between the gate electrodes 16c, 16d. Here, the capacitors 29e, 29f, 29g for the contacts have the same structure as that of the cell capacitors 29a, 29b, 29c, 29d.

Moreover, the lower electrodes 26 of the capacitors 29e, 29f, 29g for the contacts are connected to the contacts 31a, 31c, 31f extending through the upper electrode 28 and ferroelectric film 27.

In this manner, the source/drain of the block selection transistor Tre are connected to the bit line 35a via the lower electrode 26 of the capacitor 29e. The upper electrodes 28 of the capacitors 29a, 29b are connected to the source/drain of the transistors Tra, Trb via the lower electrode 26 of the capacitor 29f. The upper electrodes 28 of the capacitors 29c, 29d are connected to the source/drain of the transistors Trc, Trd via the lower electrode 26 of the capacitor 29g.

It is to be noted that the structure satisfies the relationships of the above equations (3), (4) also in the twelfth embodiment.

According to the twelfth embodiment, an effect similar to that of the tenth embodiment can be obtained. Furthermore, the lower electrodes of the capacitors 29e, 29f, 29g are used in connecting the bit line 35a to the source/drain of the block selection transistor Tre and in connecting the upper electrodes 28 of the capacitors 29a, 29b, 29c, 29d to the source/drain of the transistors Tra, Trb, Trc, Trd. Accordingly, since the lower electrodes 26 exist under the contacts 31a, 31c, 31f, the damage at the time of the opening of the contacts 31, 31c, 31f can be recovered by the annealing in the oxygen atmosphere, and it is also possible to obtain the effect that the ferroelectric capacitor higher in reliability can be provided.

It is to be noted that the buried transistor Trf that is constantly on is disposed in order to electrically connect the second cell to the third cell in the twelfth embodiment, but the diffusion layers under the second and third cell capacitors may also be continued in series without disposing the transistor Trf as in the fourth embodiment.

[Thirteenth Embodiment]

In a thirteenth embodiment, the configuration of the three-dimensional capacitor in the twelfth embodiment is modified.

Figure 68:
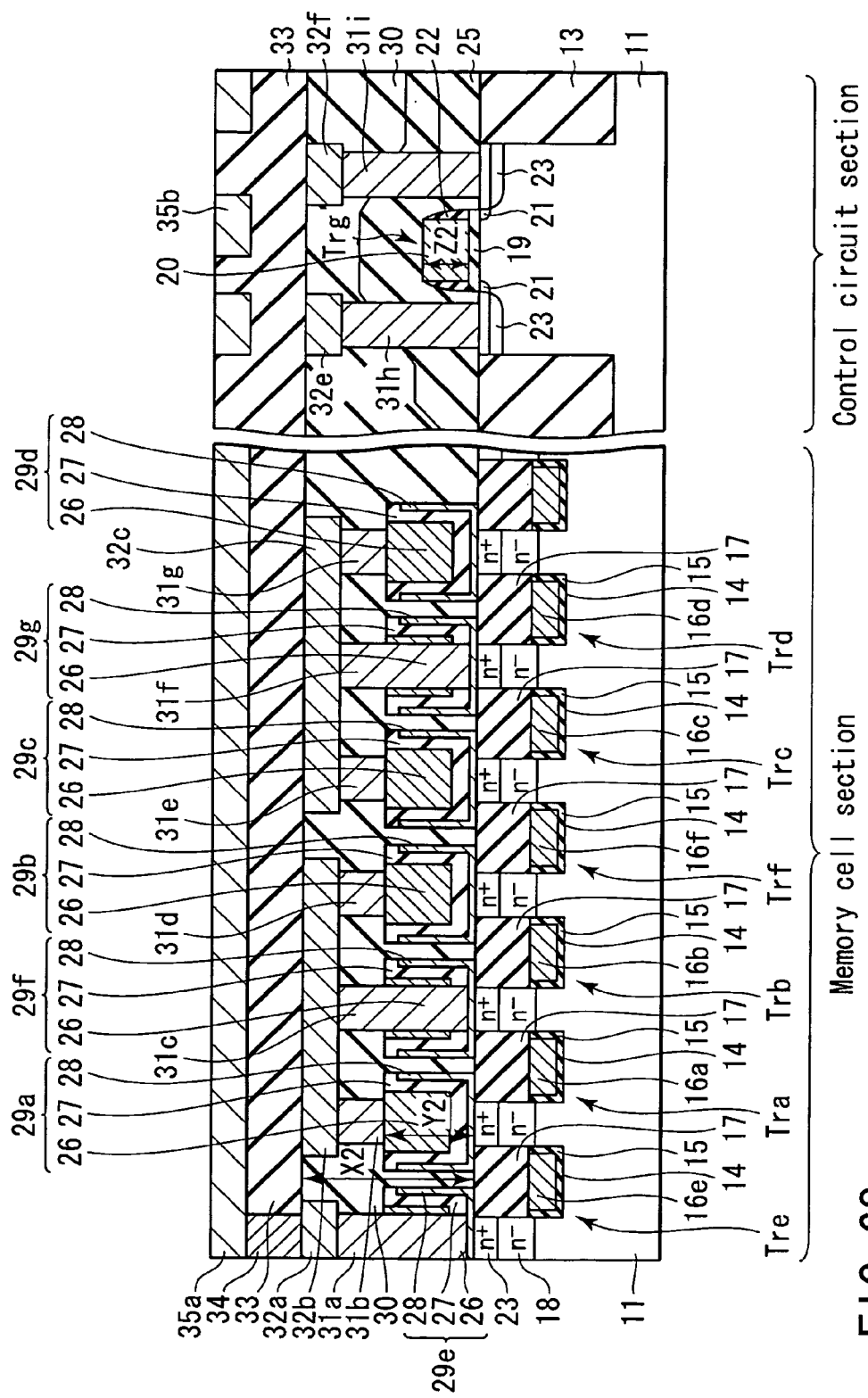
FIG. 68 is a sectional view showing the ferroelectric memory device according to a thirteenth embodiment of the present invention.
Figure 69:
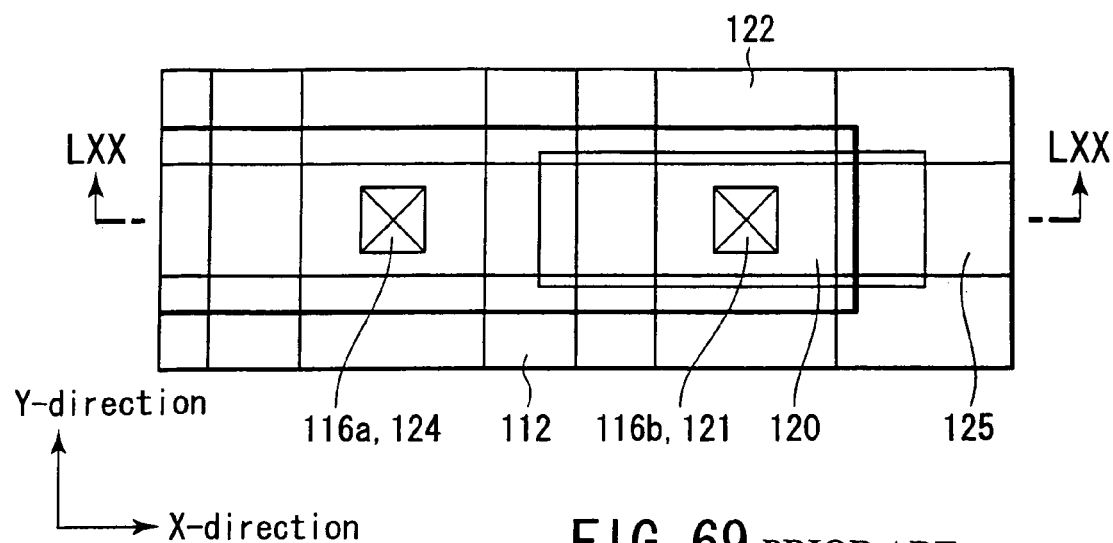
FIG. 69 is a plan view showing the ferroelectric memory device including a two-dimensional capacitor according to a related art.
Figure 70:
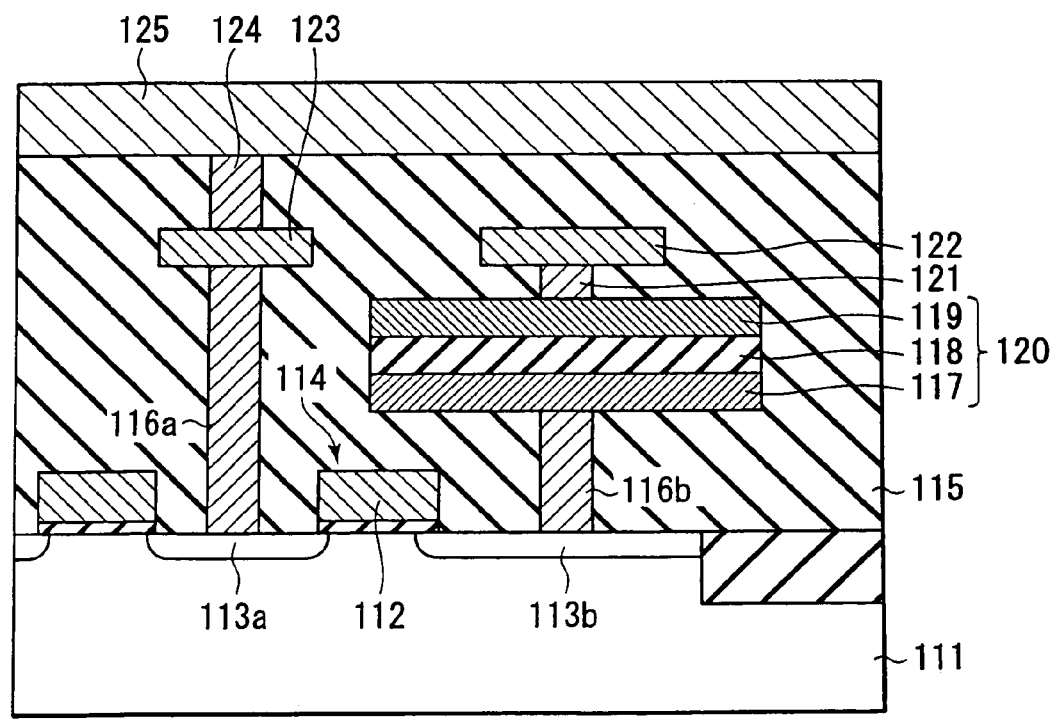
FIG. 70 is a sectional view of the ferroelectric memory device along an LXX—LXX line of FIG. 69.
Figure 71:
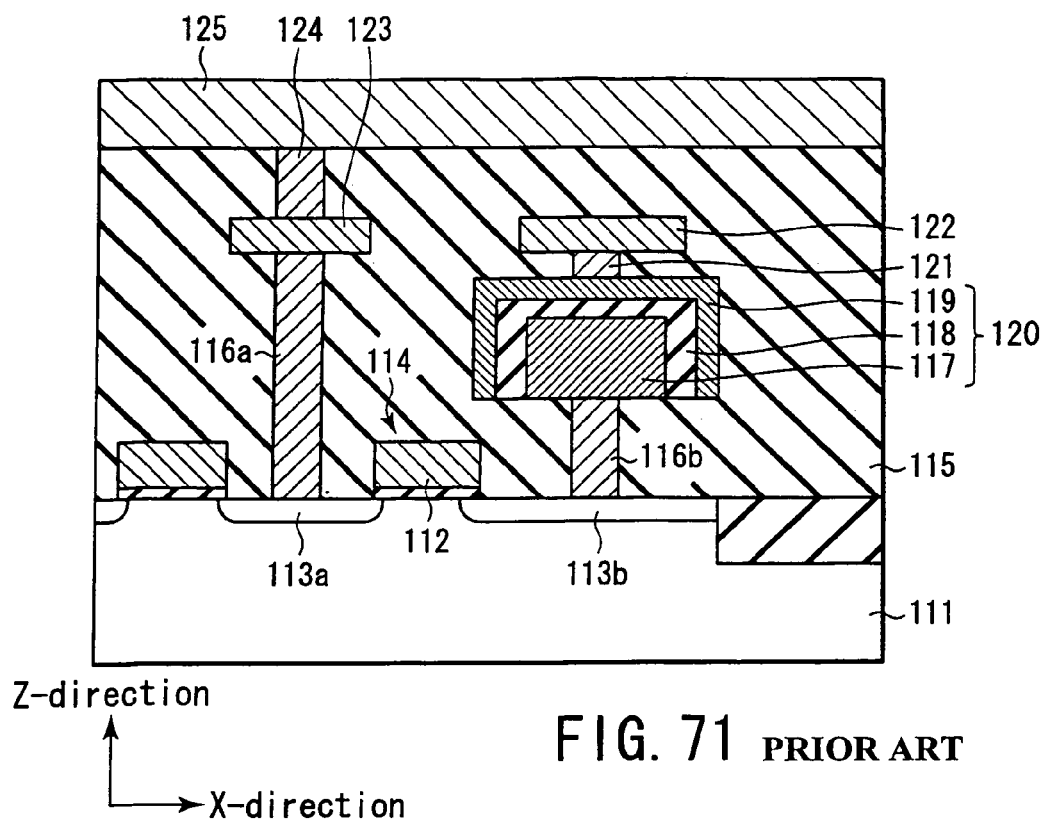
FIG. 71 is a sectional view showing the ferroelectric memory device including a three-dimensional capacitor according to the related art.
Figure 72:
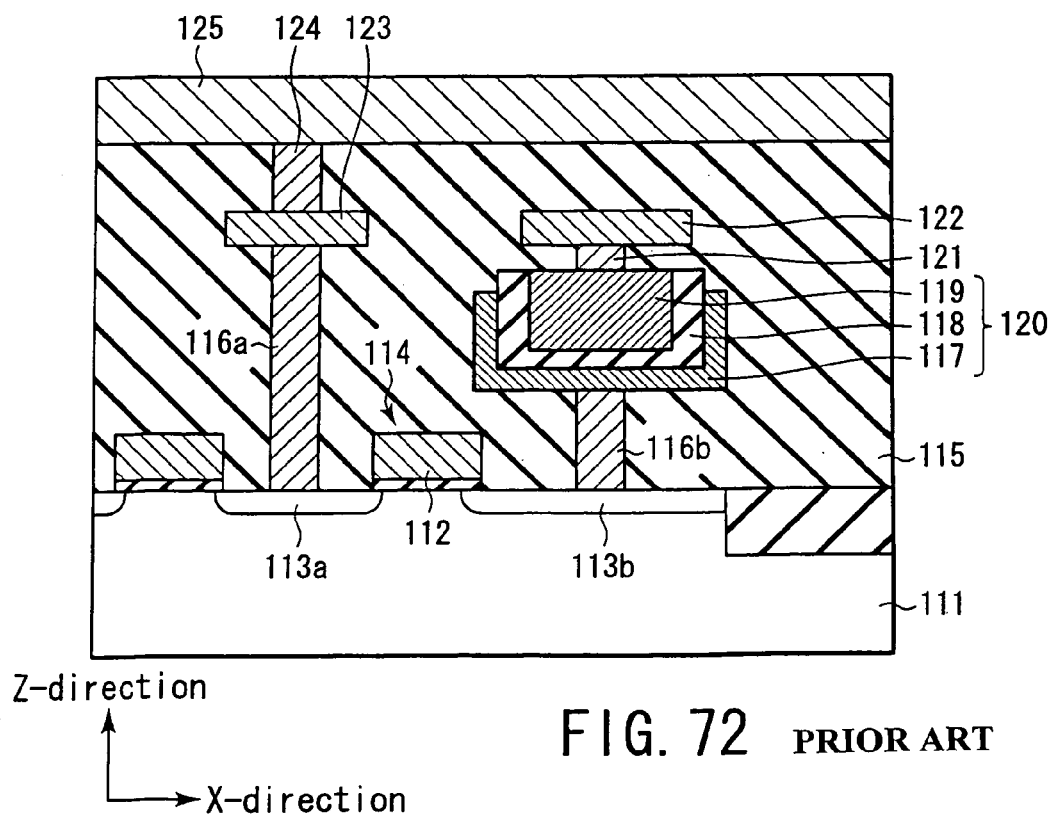
FIG. 72 is a sectional view showing another ferroelectric memory device including the three-dimensional capacitor according to the related art.

FIG. 68 shows a sectional view of the ferroelectric memory device according to the thirteenth embodiment of the present invention. As shown in FIG. 68, the thirteenth embodiment is different from the third embodiment in the configurations of the capacitors 29a, 29b, 29c, 29d, 29e, 29f, 29g. That is, the ferroelectric film 27 and upper electrode 28 extend in the XYZ directions in the twelfth embodiment, whereas the lower electrode 26 and ferroelectric film 27 extend in the XYZ directions in the thirteenth embodiment.

It is to be noted that the structure satisfies the relationships of the above equations (3), (4) also in the thirteenth embodiment.

According to the thirteenth embodiment, an effect similar to that of the twelfth embodiment can be obtained.

It is to be noted that the buried transistor Trf that is constantly on is disposed in order to electrically connect the second cell to the third cell in the thirteenth embodiment, but the diffusion layers under the second and third cell capacitors may also be continued in series without disposing the transistor Trf as in the fourth embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A ferroelectric memory device comprising:
   a semiconductor substrate;
   a first trench formed in the semiconductor substrate to extend in a first direction and having a first depth;
   a second trench formed in the semiconductor substrate to extend in a second direction and having a second depth and including an upper region and a lower region, the second direction extending across the first trench, the second depth being smaller than the first depth;

a first element isolation insulating film buried in the first trench;
a first gate electrode formed in the lower region of the second trench via a first gate insulating film;
a first insulating film formed in the upper region of the second trench;
a first diffusion layer formed in the semiconductor substrate on one side-surface side in the second trench;
a second diffusion layer formed in the semiconductor substrate on the other side-surface side in the second trench;
a first ferroelectric capacitor disposed on the first diffusion layer and including a first lower electrode, a first ferroelectric film, and a first upper electrode;
a first contact disposed on the first ferroelectric capacitor;
a first wiring layer disposed on the first contact;
a second contact disposed on the second diffusion layer; and
a second wiring layer disposed on the second contact and disposed in the same level as that of the first wiring layer.

2. The ferroelectric memory device according to claim 1, further comprising:
a third trench formed adjacent to the first diffusion layer in the semiconductor substrate to extend in the second direction and having the second depth and including an upper region and a lower region;
a second gate electrode formed in the lower region of the third trench via a second gate insulating film and functioning as a field shield region; and
a second insulating film formed in the upper region of the third trench.

3. The ferroelectric memory device according to claim 2, wherein a voltage by which a current of $10^{-10}$A or less flows is applied to the second gate electrode, when a voltage between source/drain of the second gate electrode is 0.5 to 4V.

4. The ferroelectric memory device according to claim 1, further comprising:
a third trench formed adjacent to the first diffusion layer in the semiconductor substrate to extend in the second direction and having the first depth; and
a second element isolation insulating film buried in the third trench.

5. The ferroelectric memory device according to claim 1, further comprising:
a third trench formed adjacent to the first diffusion layer in the semiconductor substrate to extend in the second direction and having the second depth and including an upper region and a lower region;
a second gate electrode formed in the lower region of the third trench via a second gate insulating film;
a second insulating film formed in the upper region of the third trench;
a third diffusion layer formed in the semiconductor substrate on a side surface of the third trench opposite to the first diffusion layer;
a third contact disposed on the third diffusion layer and connected to the first wiring layer;
a fourth trench formed adjacent to the third diffusion layer in the semiconductor substrate to extend in the second direction and having the second depth and including an upper region and a lower region;
a third gate electrode formed in the lower region of the fourth trench via a third gate insulating film;
a third insulating film formed in the upper region of the fourth trench;
a fourth diffusion layer formed in the semiconductor substrate on a side surface of the fourth trench opposite to the third diffusion layer;
a second ferroelectric capacitor disposed on the fourth diffusion layer and including a second lower electrode, a second ferroelectric film, and a second upper electrode; and
a fourth contact disposed on the second ferroelectric capacitor and connected to the first wiring layer,
wherein a first cell comprises the first ferroelectric capacitor, and a first transistor including the second gate electrode and the first and third diffusion layers.
a second cell comprises the second ferroelectric capacitor, and a second transistor including the third gate electrode and the third and fourth diffusion layers,
one end of the first ferroelectric capacitor is electrically connected to the third diffusion layer via the first wiring layer and the first and third contacts, and the other end of the first ferroelectric capacitor is electrically connected to the first diffusion layer,
one end of the second ferroelectric capacitor is electrically connected to the third diffusion layer via the first wiring layer and the third and fourth contacts, and the other end of the second ferroelectric capacitor is electrically connected to the fourth diffusion layer, and
the first cell is electrically connected in series to the second cell.

6. The ferroelectric memory device according to claim 5, further comprising:
third and fourth cells having the same structures as those of the first and second cells and disposed adjacent to the second cell;
a fifth trench formed adjacent to the fourth diffusion layer in the semiconductor substrate to extend in the second direction and having the second depth and including an upper region and a lower region;
a fourth gate electrode formed in the lower region of the fifth trench via a fourth gate insulating film; and
a fourth insulating film formed in the upper region of the fifth trench,
wherein a voltage by which a current of about 10 nA or more flows is applied to the fourth gate electrode, when a voltage between source/drain of the fourth gate electrode is 0.01 to 0.05V to electrically connect the first and second cells in series to the third and fourth cells.

7. The ferroelectric memory device according to claim 5, wherein the third and fourth cells having the same structures as those of the first and second cells are disposed adjacent to the second cell, and
the fourth diffusion layer is used to electrically connect the first and second cells in series to the third and fourth cells.

8. The ferroelectric memory device according to claim 1, further comprising: a second gate electrode of a control circuit formed on the semiconductor substrate.

9. The ferroelectric memory device according to claim 1, further comprising:
a second ferroelectric capacitor disposed on the second diffusion layer and including a second lower electrode, a second ferroelectric film, and a second upper electrode,
wherein the second contact is connected to the second lower electrode.

10. The ferroelectric memory device according to claim 1, wherein the first ferroelectric capacitor is formed in a two-dimensional manner, and a height of the second contact is 2.5 times or less a film thickness of the first ferroelectric capacitor.

11. The ferroelectric memory device according to claim 1, further comprising: a second gate electrode of a control circuit formed on the semiconductor substrate, wherein the first ferroelectric capacitor is formed in a two-dimensional manner, and a height of the second contact is 6 times or less that of the second gate electrode.

12. The ferroelectric memory device according to claim 1, wherein the first ferroelectric capacitor is formed in a three-dimensional manner, and a height of the second contact is 1.6 times or less a film thickness of the first ferroelectric capacitor.

13. The ferroelectric memory device according to claim 1, further comprising: a second gate electrode of a control circuit formed on the semiconductor substrate, wherein the first ferroelectric capacitor is formed in a three-dimensional manner, and a height of the second contact is 9 times or less that of the second gate electrode.

* * * * *